(12) United States Patent
Tomoyama et al.

(10) Patent No.: US 11,037,800 B2
(45) Date of Patent: Jun. 15, 2021

(54) PATTERNING METHODS

(71) Applicant: Micron Technology, inc., Boise, ID (US)

(72) Inventors: Tsuyoshi Tomoyama, Hiroshima (JP); Hiromitsu Oshima, Hiroshima (JP); Tomohiro Iwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/351,274

(22) Filed: Mar. 12, 2019

(65) Prior Publication Data

US 2020/0294814 A1   Sep. 17, 2020

(51) Int. Cl.
| | |
|---|---|
| *H01L 21/321* | (2006.01) |
| *H01L 21/3213* | (2006.01) |
| *H01L 27/108* | (2006.01) |
| *H01L 21/56* | (2006.01) |
| *H01L 21/033* | (2006.01) |

(52) U.S. Cl.
CPC .... *H01L 21/32139* (2013.01); *H01L 21/0337* (2013.01); *H01L 21/565* (2013.01); *H01L 27/10888* (2013.01)

(58) Field of Classification Search
CPC ............. H01L 21/32139; H01L 21/565; H01L 27/10888; H01L 21/0337
See application file for complete search history.

(56) References Cited

U.S. PATENT DOCUMENTS

| | | | |
|---|---|---|---|
| 2012/0040528 A1* | 2/2012 | Kim ................... | H01L 21/76816 438/675 |
| 2014/0162461 A1* | 6/2014 | Kim .................... | H01L 21/0337 438/703 |

* cited by examiner

*Primary Examiner* — Duy Vu N Deo
(74) *Attorney, Agent, or Firm* — Wells St. John P.S.

(57) ABSTRACT

Some embodiments include a method of patterning a target material. An assembly is provided which has a masking material over the target material. First lines are formed over the assembly. The first lines extend along a first direction and are laterally spaced from one another by first spaces. Second lines are formed over the first lines. The second lines extend along a second direction which crosses the first direction, and are laterally spaced from one another by second spaces. The second lines cross the first lines at first crossing regions. The second spaces cross the first spaces at second crossing regions. A pattern includes the first and second crossing regions. The pattern is transferred into the masking material to form holes in the masking material in locations directly under the first and second crossing regions. The holes are extended into the target material.

12 Claims, 52 Drawing Sheets

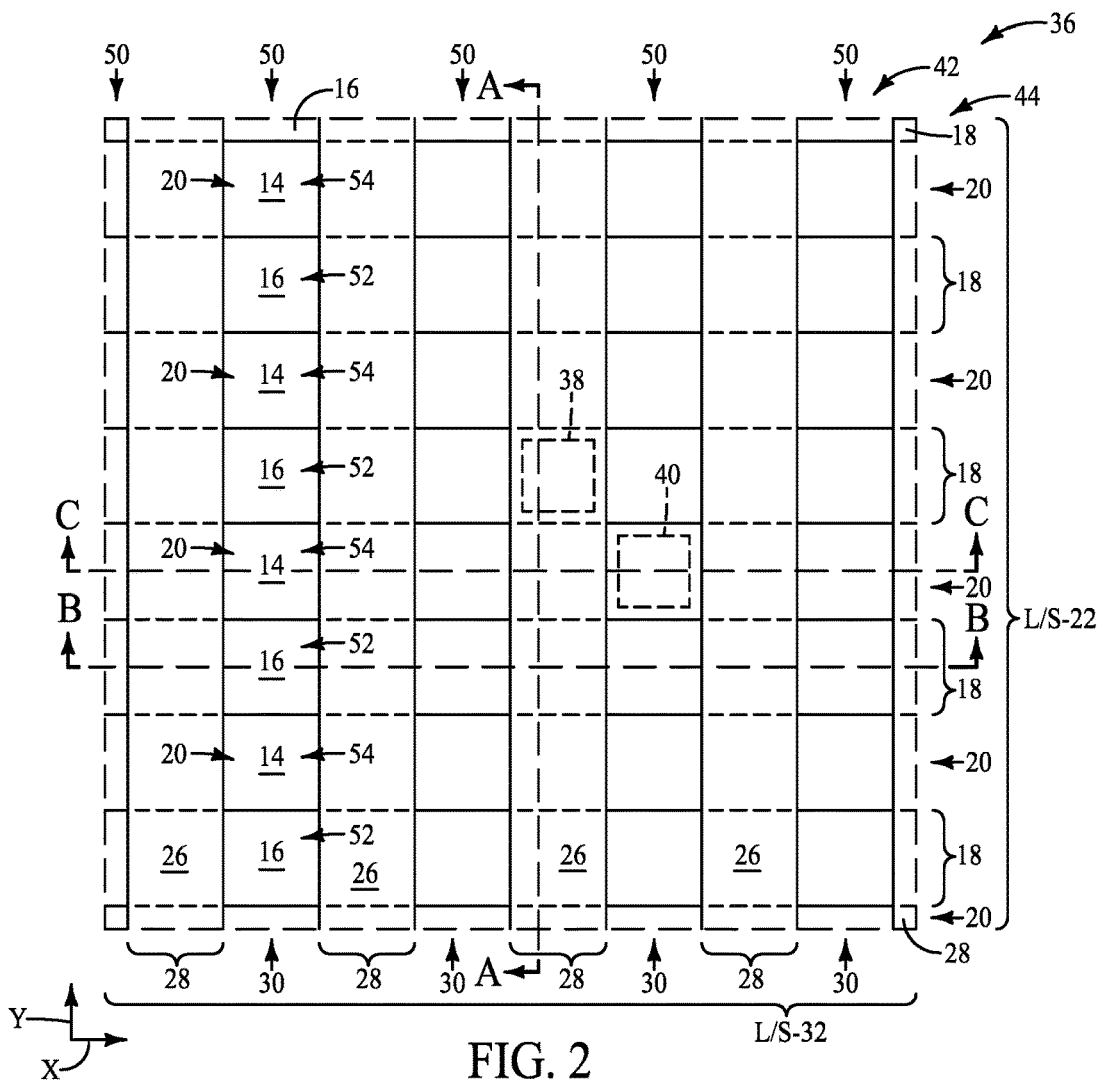
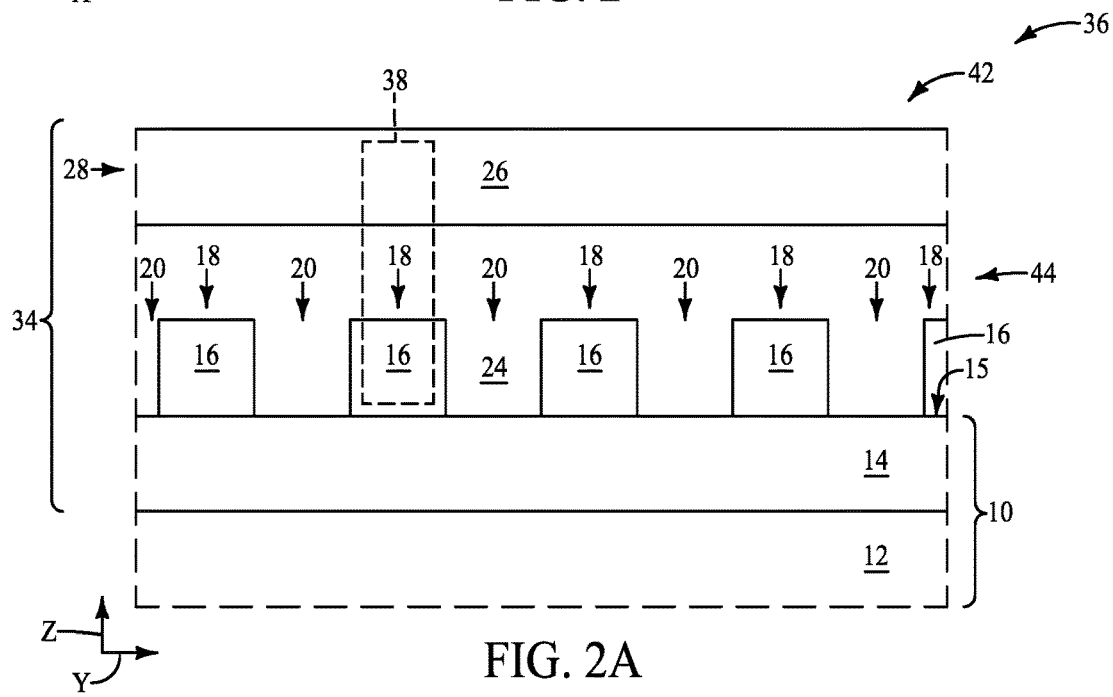
FIG. 2
FIG. 2A

PATTERNING METHODS

TECHNICAL FIELD

Patterning methods suitable for utilization in integrated circuit fabrication.

BACKGROUND

Fabrication of integrated circuitry may comprise formation of a repeating pattern across a supporting material. For instance, fabrication of integrated processors, integrated memory and/or integrated sensors may comprise formation of one or more arrays of components and associated component parts. Example integrated memory includes dynamic random-access memory (DRAM), NAND, etc.

A continuing goal of integrated circuit fabrication is to increase the level of integration, and an associated goal is to increase the packing density within integrated circuitry.

It is desired to develop improved methods of forming repeating patterns which may be suitable for achieving increased levels of integration.

BRIEF DESCRIPTION OF THE DRAWINGS

FIGS. 1A-9A are diagrammatic cross-sectional side views along the lines A-A of FIGS. 1-9, respectively. FIGS. 1B-9B are diagrammatic cross-sectional side views along the lines B-B of FIGS. 1-9, respectively. FIGS. 1C-9C are diagrammatic cross-sectional side views along the lines C-C of FIGS. 1-9, respectively.

FIGS. 10A-12A are diagrammatic cross-sectional side views along the lines A-A of FIGS. 10-12, respectively. FIGS. 10B-12B are diagrammatic cross-sectional side views along the lines B-B of FIGS. 10-12, respectively. FIGS. 10C-12C are diagrammatic cross-sectional side views along the lines C-C of FIGS. 10-12, respectively. The process stage of FIGS. 10, 10A and 10B may follow the stage shown in FIGS. 7, 7A and 7B; and the process stage of FIG. 10C may follow the stage shown in FIG. 4C.

FIG. 13 is a diagrammatic top view. FIGS. 13A, 13B and 13C are diagrammatic cross-sectional side views along the lines A-A, B-B and C-C of FIG. 13, respectively. The process stage of FIGS. 13-13C may follow that of FIGS. 8-8C.

FIGS. 16A-20A are diagrammatic cross-sectional side views along the lines A-A of FIGS. 16-20, respectively. FIGS. 16B-20B are diagrammatic cross-sectional side views along the lines B-B of FIGS. 16-20, respectively. FIGS. 16C-20C are diagrammatic cross-sectional side views along the lines C-C of FIGS. 16-20, respectively.

FIGS. 21B-1 and 21C-1 are views along analogous cross-sections as FIGS. 21B and 21C, respectively; at a process stage alternative to that of FIGS. 21B and 21C.

FIGS. 22B-1 and 22C-1 are views along analogous cross-sections as FIGS. 22B and 22C, respectively; at a process stage alternative to that of FIGS. 22B and 22C. The process stage of FIGS. 22B-1 and 22C-1 may follow that of FIGS. 21B-1 and 21C-1.

FIGS. 23A-26A are diagrammatic cross-sectional side views along the lines A-A of FIGS. 23-26, respectively. FIGS. 23B-26B are diagrammatic cross-sectional side views along the lines B-B of FIGS. 23-26, respectively. FIGS. 23C-26C are diagrammatic cross-sectional side views along the lines C-C of FIGS. 23-26, respectively.

DETAILED DESCRIPTION OF THE ILLUSTRATED EMBODIMENTS

Some embodiments include methods which use first and second line-and-space (L/S) patterns to form a repeating pattern in a masking material. The first L/S pattern crosses the second L/S pattern. Openings (holes) may be formed at locations where lines of the first L/S pattern cross lines of the second L/S pattern, and also may be formed at locations where spaces of the first L/S pattern cross spaces of the second L/S pattern. Since the openings may be formed at both locations where lines of the crossing patterns intersect and at locations were spaces of the crossing patterns intersect, the openings may be formed as a high-density repeating pattern within the masking material. Such high-density repeating pattern may be transferred into an underlying target material to enable fabrication of highly-integrated components. The high-density repeating patterns formed by methodology described herein may be utilized in any fabrication processes which would benefit from such high-density repeating patterns. For instance, the high-density repeating patterns may be utilized for fabrication of integrated memory (e.g., DRAM), integrated processors, integrated sensors, etc.

A first example embodiment is described with reference to FIGS. 1-9.

Figure 1:
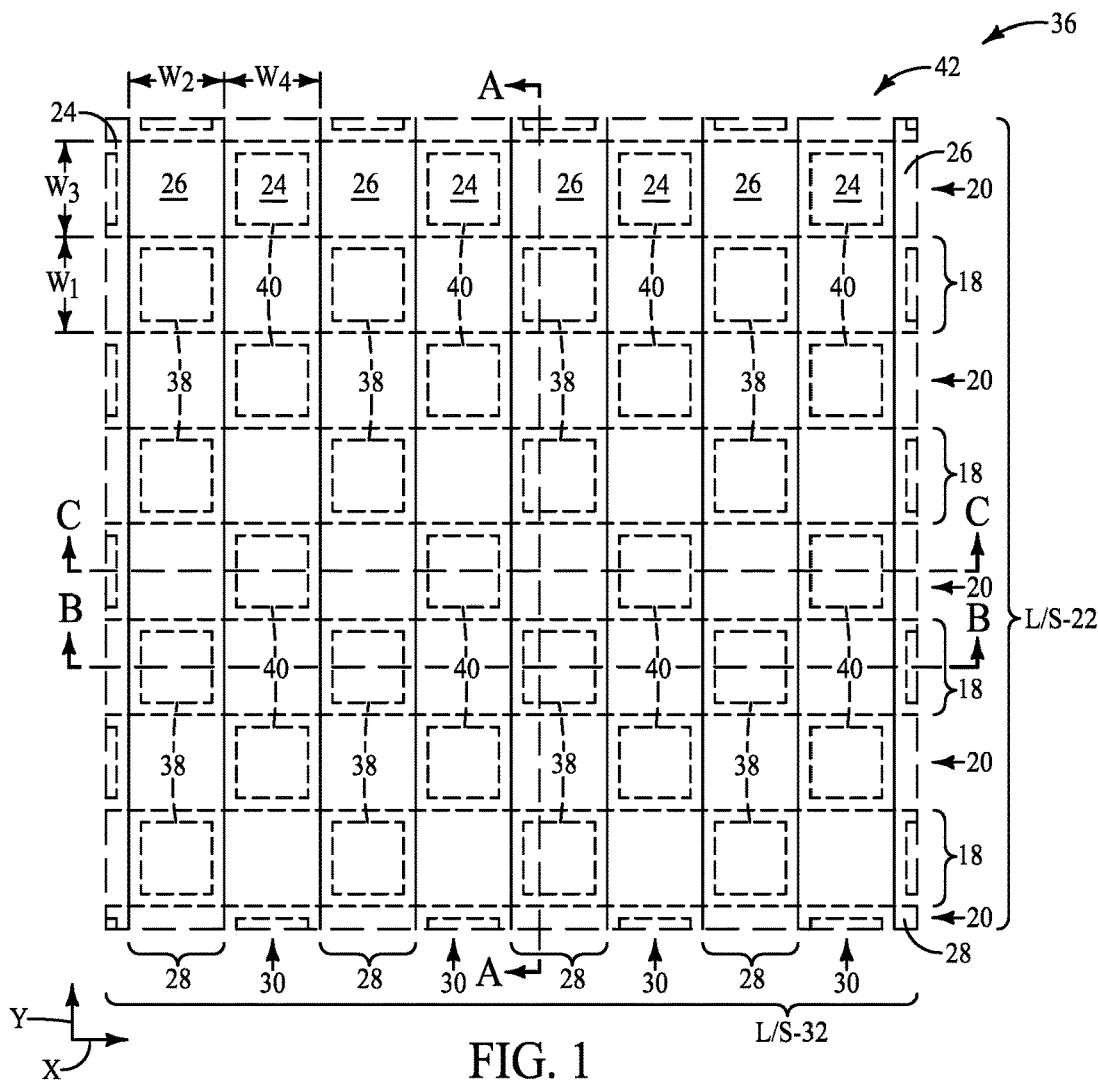
FIGS. 1-9 are diagrammatic top views of an example assembly at example process stages of an example method for forming an example repeating pattern.
Figure 1A:
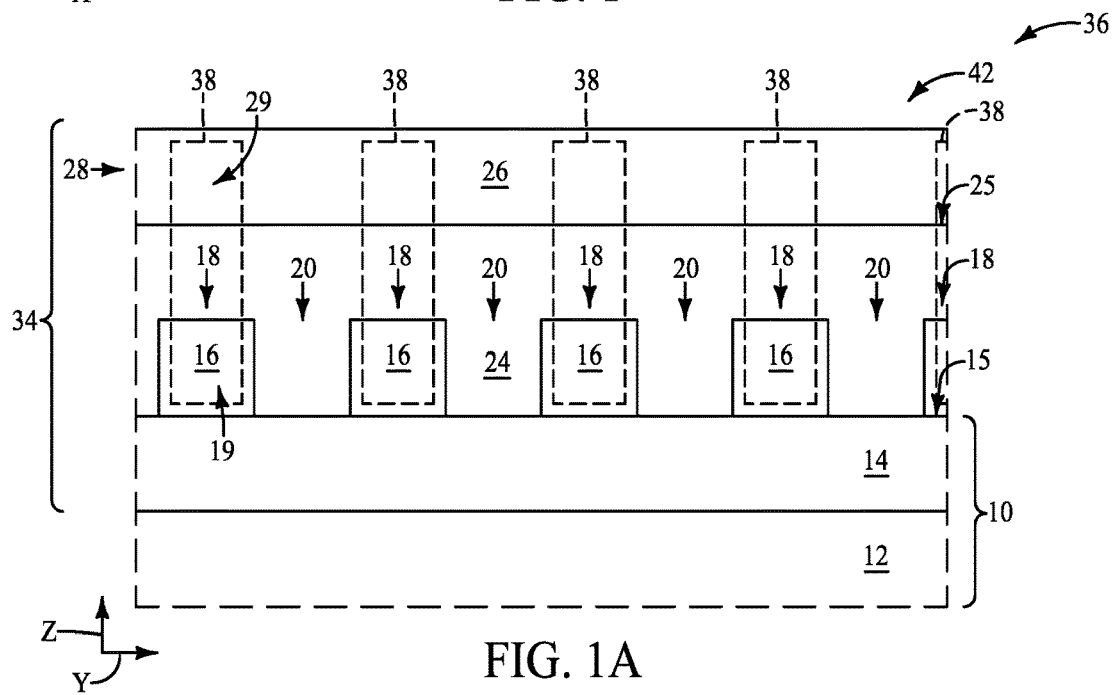
Figure 1B:
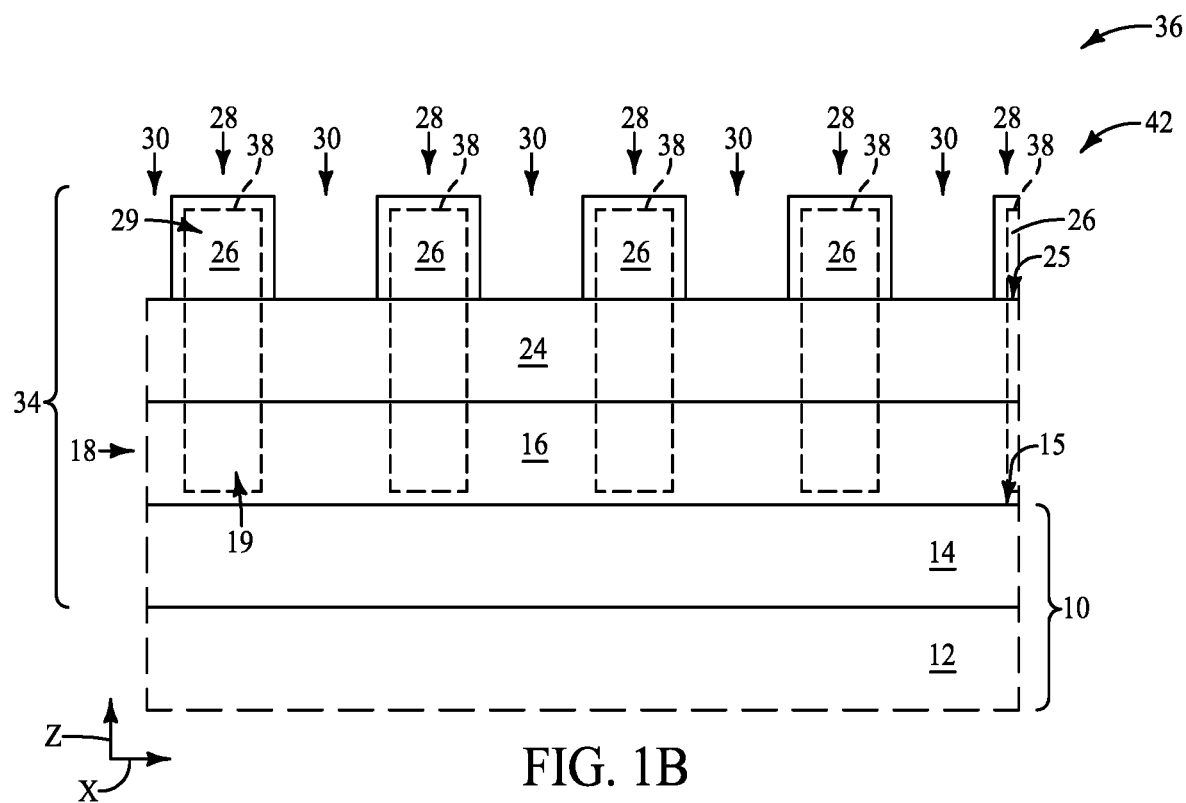
Figure 1C:
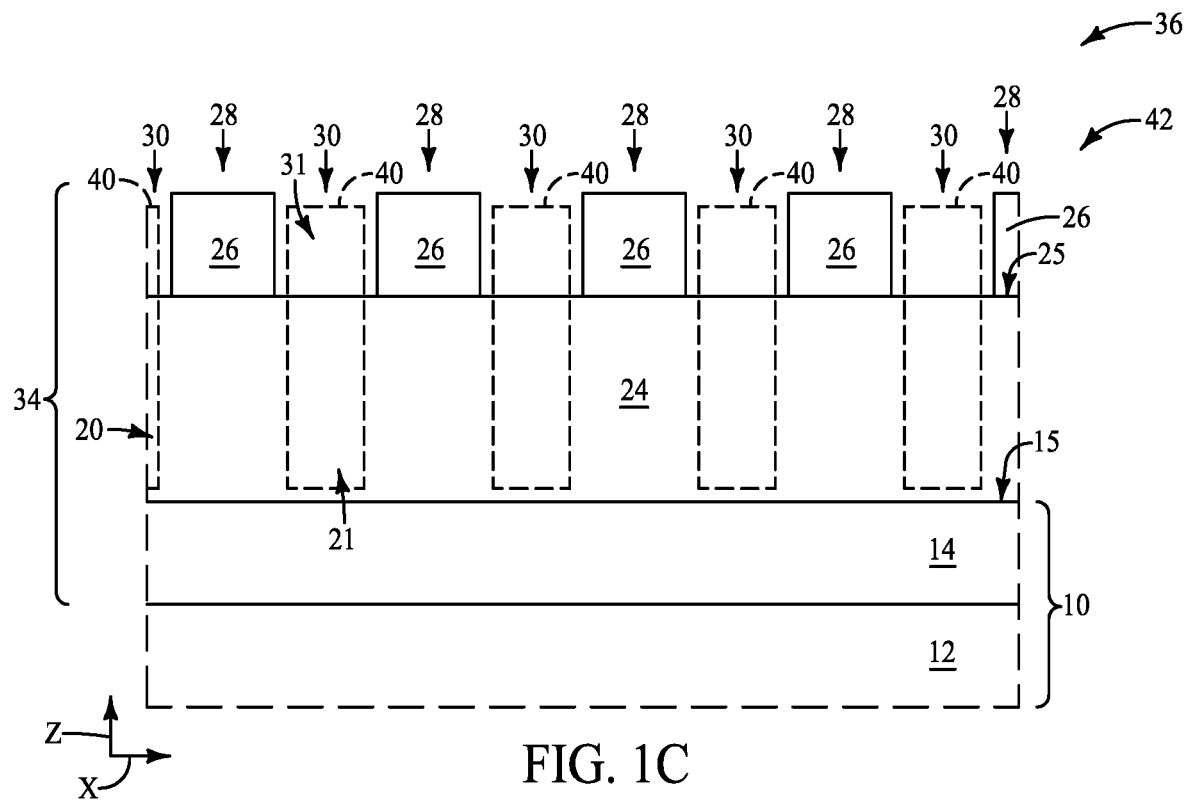

Referring to FIGS. 1-1C, an assembly 10 is formed to comprise a masking material (also referred to herein as a first material) 14 over a target material 12.

The processing described herein ultimately forms a high-density repeating pattern within the target material 12. In some embodiments, the target material 12 may comprise semiconductor material; and such semiconductor material may, for example, comprise, consist essentially of, or consist of monocrystalline silicon. The target material 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the target material 12 may correspond to a semiconductor substrate containing one or more materials associated with integrated circuit fabrication. Such materials may include, for example, one or more of refractory metal materials, barrier materials, diffusion materials, insulator materials, etc. An example configuration of the target material 12 will be described in more detail below with reference to FIG. 14.

Continuing the discussion of FIGS. 1-1C, the masking material 14 may comprise any suitable composition(s) having appropriate etch properties for the processing described herein. In some embodiments, the masking material 14 may comprise, consist essentially of, or consist of one or both of silicon nitride and silicon oxide (e.g., silicon dioxide).

The masking material 14 has an upper surface 15. In some embodiments, the upper surface 15 may be a planarized upper surface resulting from a suitable planarization process (e.g., chemical-mechanical polishing, CMP).

First lines 18 are formed over the upper surface 15 of the masking material 14. The first lines 18 extend along a first direction corresponding to an illustrated x-axis. The first lines 18 are shown in dashed-line (phantom) view in FIG. 1 to indicate that they are beneath other materials.

The first lines 18 comprise a first-line-material 16. The material 16 may comprise any suitable composition(s) having appropriate etch properties for the processing described herein; and in some embodiments may comprise, consist essentially of, or consist of one or more of polycrystalline semiconductor material (e.g., polycrystalline silicon), metal (e.g., tungsten), metal oxide (e.g., titanium oxide), etc.

The first lines 18 are laterally spaced from one another by first spaces 20. The first lines 18 and first spaces 20 may be considered together to form a first line-and-space (L/S) pattern 22, with such first L/S pattern 22 being over the first material 14.

A mold material 24 is formed over the first lines 18 and within the first spaces 20. The mold material 24 may comprise any suitable composition(s) having appropriate etch properties for the processing described herein; and in some embodiments may comprise, consist essentially of, or consist of carbon formed by a spin-on process (i.e., spin-on carbon, SOC).

The mold material 24 has an upper surface 25. The upper surface 25 may be referred to as a second upper surface to distinguish it from the first upper surface 15. The upper surface 25 may be substantially planar (with the term "substantially planar" meaning planar to within reasonable tolerances of fabrication and measurement). The substantially planar upper surface 25 may result from the spin-on processing utilized to form mold material 24 or may be imparted with a suitable planarization process.

Second lines 28 are formed over the upper surface 25 of the mold material 24. The second lines 28 extend along a second direction corresponding to an illustrate y-axis. The second direction (the direction along the y-axis) crosses the first direction (the direction along the x-axis). Accordingly, the second lines 28 cross the first lines 18. In the shown embodiment, the second direction of the second lines 28 is substantially orthogonal to the first direction of the first lines 18; with the term "substantially orthogonal" meaning orthogonal to within reasonable tolerances of fabrication and measurement. In other embodiments, the second lines 28 may extend along a direction which is not substantially orthogonal to the direction of the first lines 18, provided that the second lines 28 cross the first lines 18.

The second lines 28 comprise a second-line-material 26. The material 26 may comprise any suitable composition(s) having appropriate etch properties for the processing described herein. In some embodiments, the material 26 may comprise photoresist over a thin silicon hardmask.

The second lines 28 are laterally spaced from one another by second spaces 30. The second lines 28 and second spaces 30 may be considered together to form a second line-and-space (L/S) pattern 32, with such second L/S pattern 32 being over the first L/S pattern 22.

In the illustrated embodiment, the first lines 18 have a first width $W_1$ (shown relative to FIG. 1) along the second direction of the y-axis, and the second lines 28 have a second width $W_2$ (shown relative to FIG. 1) along the first direction of the x-axis; with the second width being about the same as the first width. The term "about the same" is to be understood to mean the same to within reasonable tolerances of fabrication and measurement. In other embodiments (described below) the width of the second lines may be different than the width of the first lines.

In the illustrated embodiment, the first spaces 20 have a third width $W_3$ (shown relative to FIG. 1) along the second direction of the y-axis, and the second spaces 30 have a fourth width $W_4$ (shown relative to FIG. 1) along the first direction of the x-axis; with the fourth width being about the same as the third width. In other embodiments, the fourth width $W_4$ of the second spaces 30 may be different than the third width $W_3$ of the first spaces 20.

In the shown embodiment, all of the widths $W_1$, $W_2$, $W_3$ and $W_4$ are about the same as one another.

The materials 14, 16, 24 and 26 form a vertical stack 34 over the target material 12. Such vertical stack extends along a third direction corresponding to an illustrated z-axis.

The materials 12, 14, 16, 24 and 26 may be considered to be within a construction 36. In some embodiments, the construction 36 may be considered to comprise the vertical stack 34 over the target material 12.

The second lines 28 cross the first lines 18 at first crossing regions 38, with example first crossing regions 38 being diagrammatically identified with dashed-line boxes. In some embodiments, the first and second lines 18 and 28 may be considered to have crossing portions 19 and 29, respectively, which cross one another within the first crossing regions 38 (example crossing portions 19 and 29 are identified in FIGS. 1A and 1B).

The second spaces 30 cross the first spaces 20 at second crossing regions 40, with example second crossing regions 40 being diagrammatically identified with dashed-line boxes. In some embodiments, the first and second spaces 20 and 30 may be considered to have crossing portions 21 and 31, respectively, which cross one another within the second crossing regions 40 (example crossing portions 21 and 31 are identified in FIG. 1C).

The first and second crossing regions 38 and 40 may be considered together to form a pattern 42.

Figure 2B:
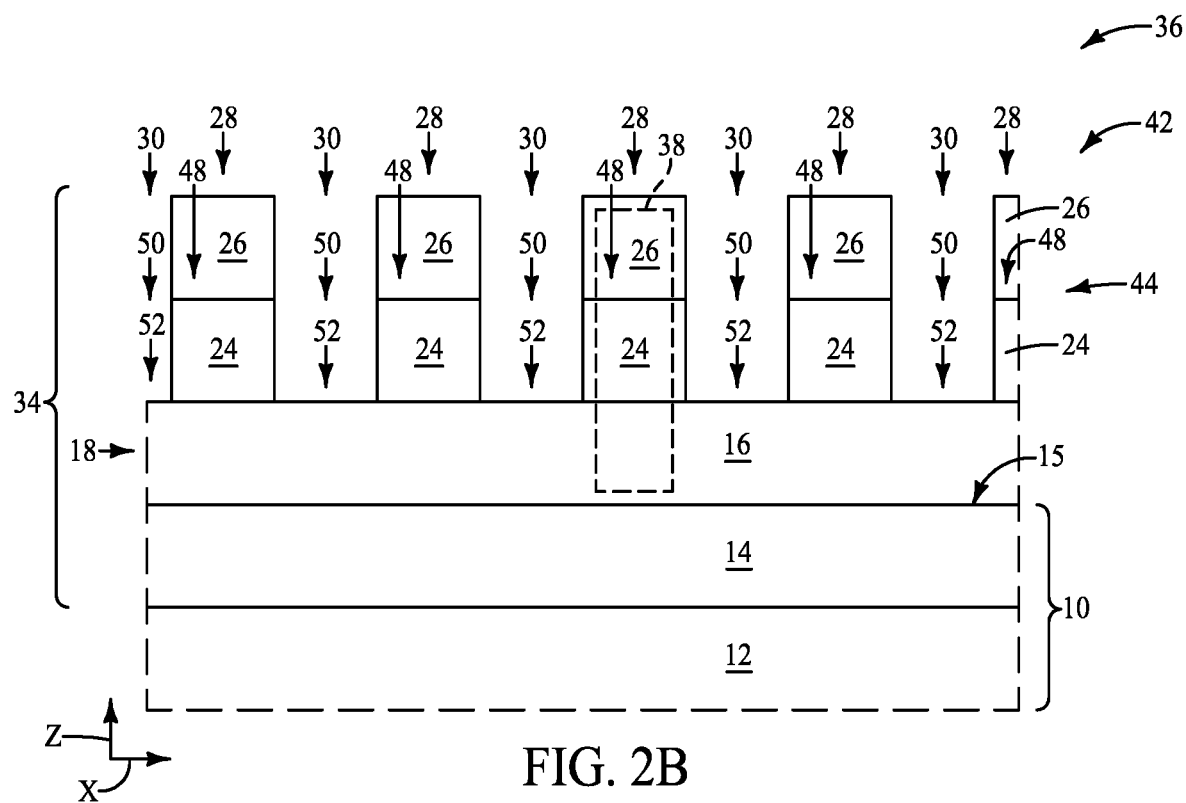
Figure 2C:
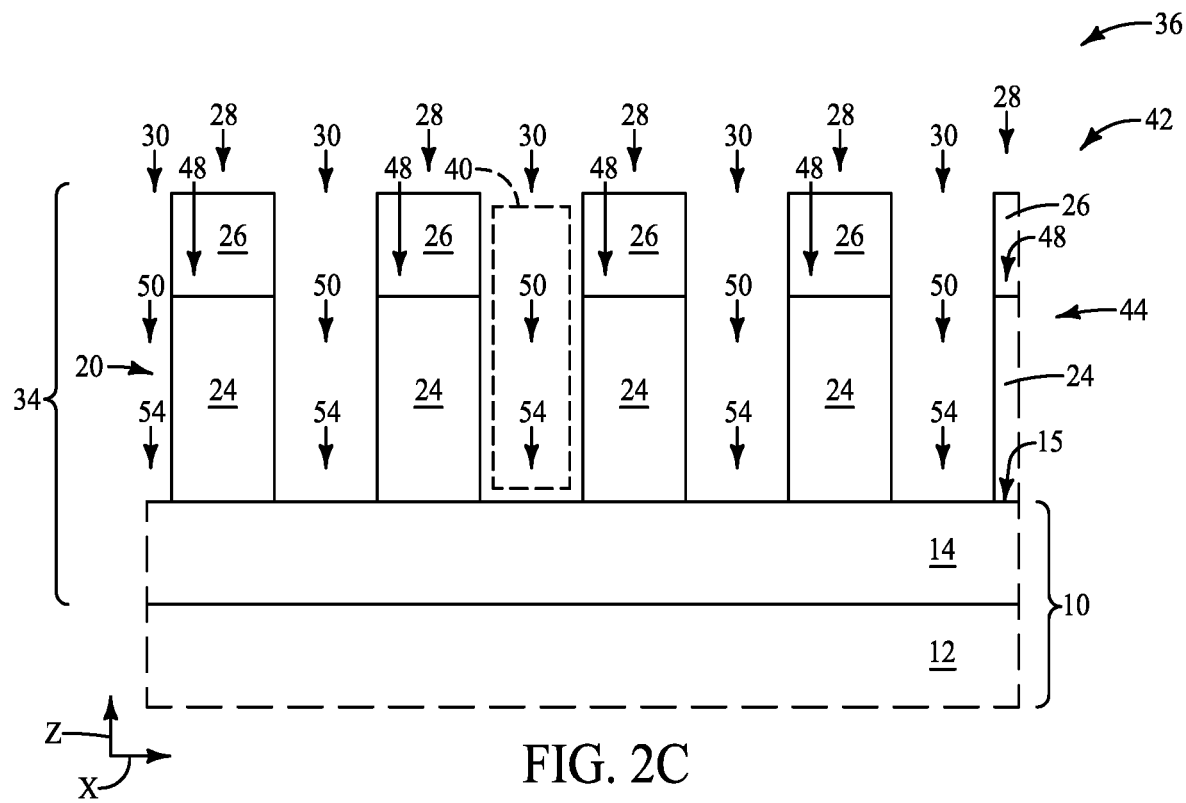

Referring to FIGS. 2-2C, a pattern of the second lines 28 is transferred into the mold material 24. Such forms a pattern 44 within the mold material 24. In some embodiments, the pattern 44 may be referred to as a first pattern formed in the mold material.

The patterned mold material 24 has third lines 48 aligned with the second lines 28, and has third spaces 50 aligned with the second spaces 30. In some embodiments, the third spaces 50 may be considered to comprise first gap regions 52 directly over the first lines 18 (i.e., directly over the first-line-material 16 as shown in FIG. 2), and to comprise second gap regions 54 aligned with the first spaces 20 (i.e., directly over the masking material 14 as shown in FIG. 2).

Figure 3:
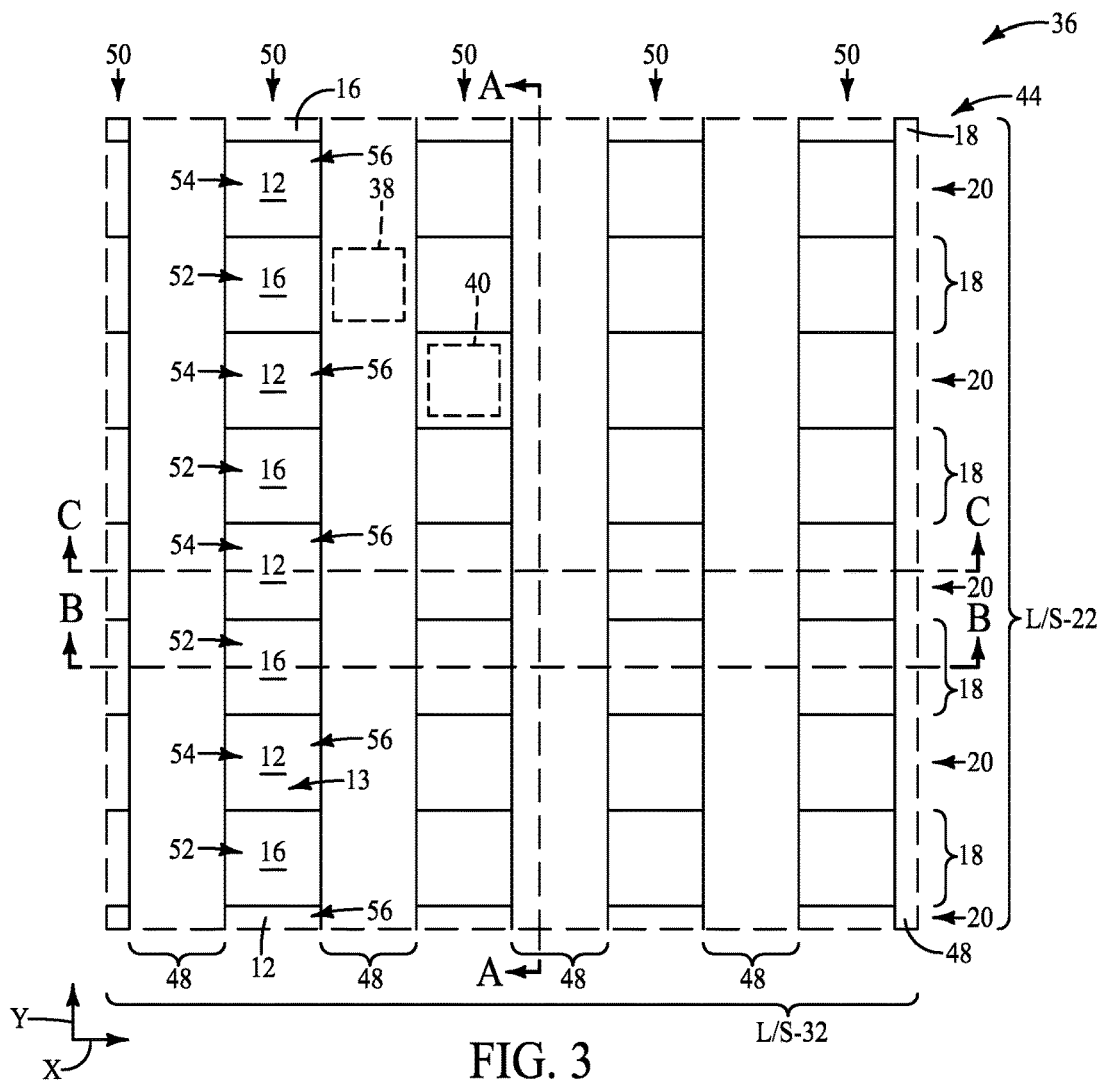
Figure 3A:
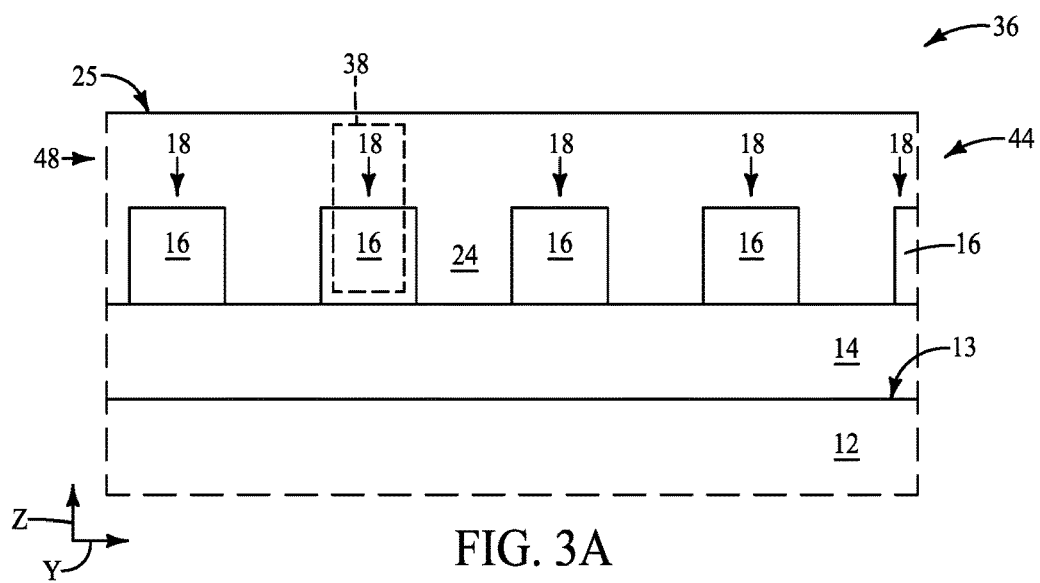
Figure 3B:
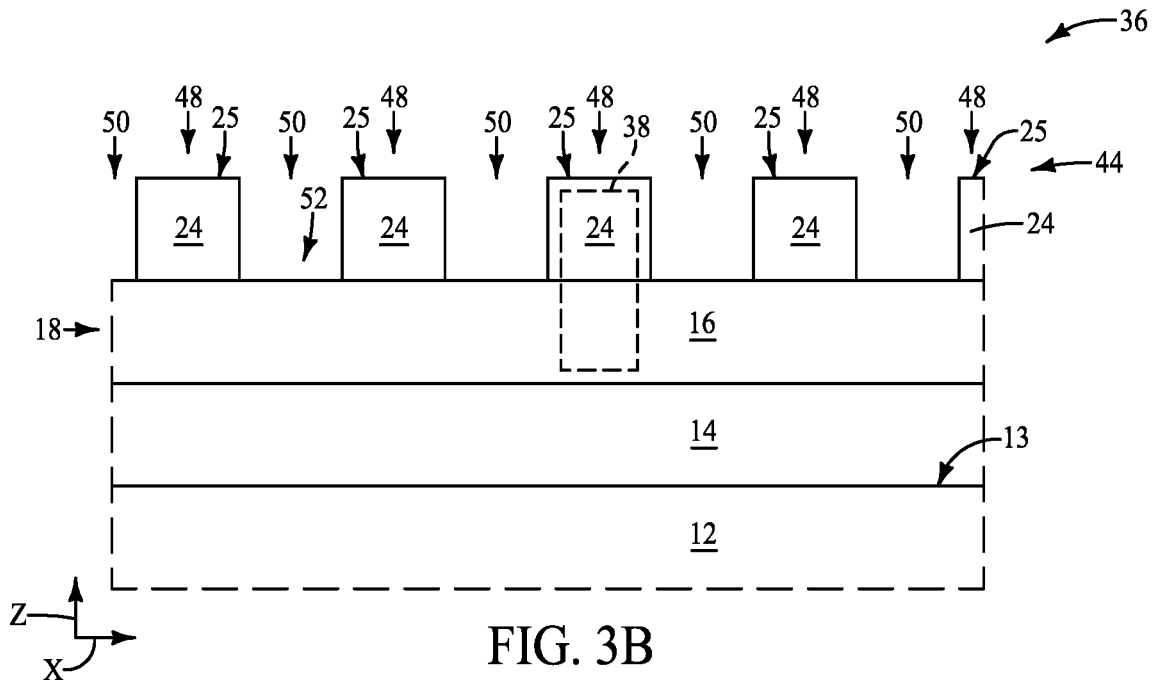
Figure 3C:
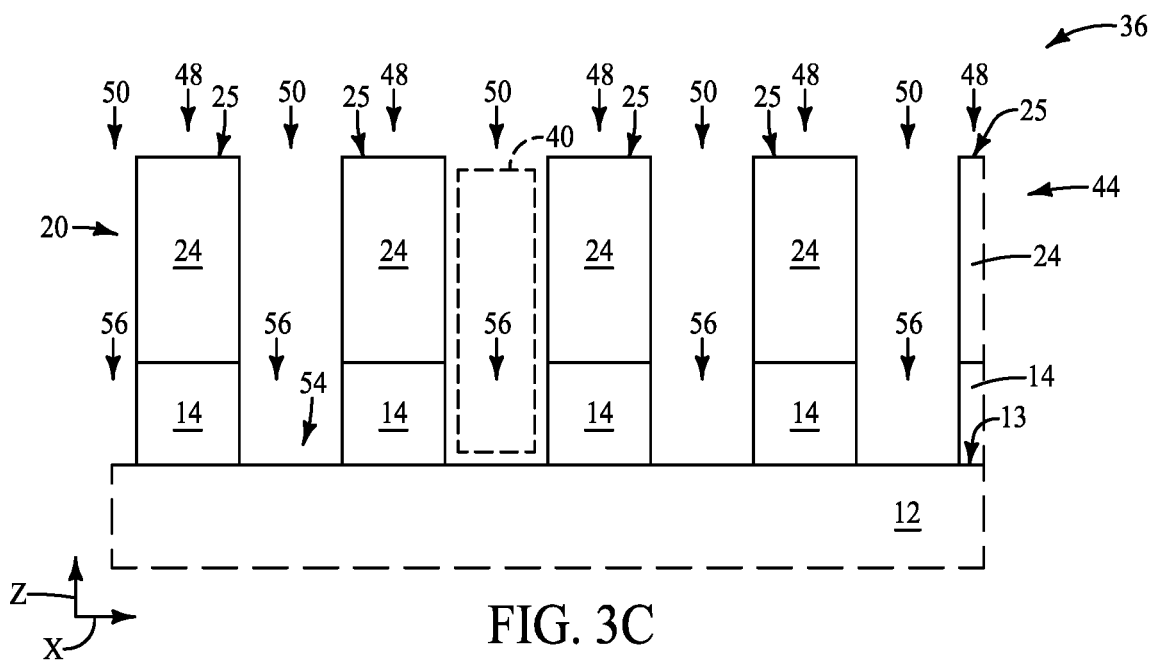

Referring to FIGS. 3-3C, the second gap regions 54 are extended into the masking material 14 to form openings 56 within the masking material. In the illustrated embodiment, the openings 56 extend entirely through the masking material 14 to expose an upper surface 13 of the target material 12. In some embodiments, the openings 56 may be referred to as first openings in the masking material 14 to distinguish them from second openings which will be formed at a later processing stage.

The gap regions 54 may be extended into the masking material 14 with any suitable etch. Such etch is selective for the masking material 14 relative to the mold material 24 and the first-line-material 16. For purposes of interpreting this disclosure and the claims that follow, an etch is considered to be selective for a first material relative to a second material if the etch removes the first material faster than the second material, which can include, but is not limited to, etches which are 100% selective for the first material relative to the second material. The etch utilized to form the openings 56 within the masking material 14 may be referred to as a first etch to distinguish it from other etches utilized at subsequent process stages.

The processing stage of FIGS. 3-3C shows the second lines 28 (FIGS. 2-2C) removed to expose the upper surface 25 of the mold material 24. The second lines 28 may be removed before or after the openings 56 are formed in the masking material 14, depending on the composition of the lines 28 and the etching conditions utilized to form the openings 56. The remaining mold material 24 includes a pattern of third lines 48 and third spaces 50 that had been aligned with the second lines 28 (FIG. 2) and the second spaces 30 (FIG. 2). The third lines 48 replace the second lines 28 in the L/S pattern 32, and the third spaces 50 replace the second spaces 30 (FIG. 2) in the L/S pattern 32.

The formation of the openings 56 within the masking material 14 extends the second crossing regions 40 (i.e., the regions where spaces of the second L/S pattern 32 cross spaces of the first L/S pattern 22) into the masking material 14. In some embodiments, the openings 56 may be considered to be directly under the second crossing regions 40, rather than being extensions of the second crossing regions 40.

Figure 4:
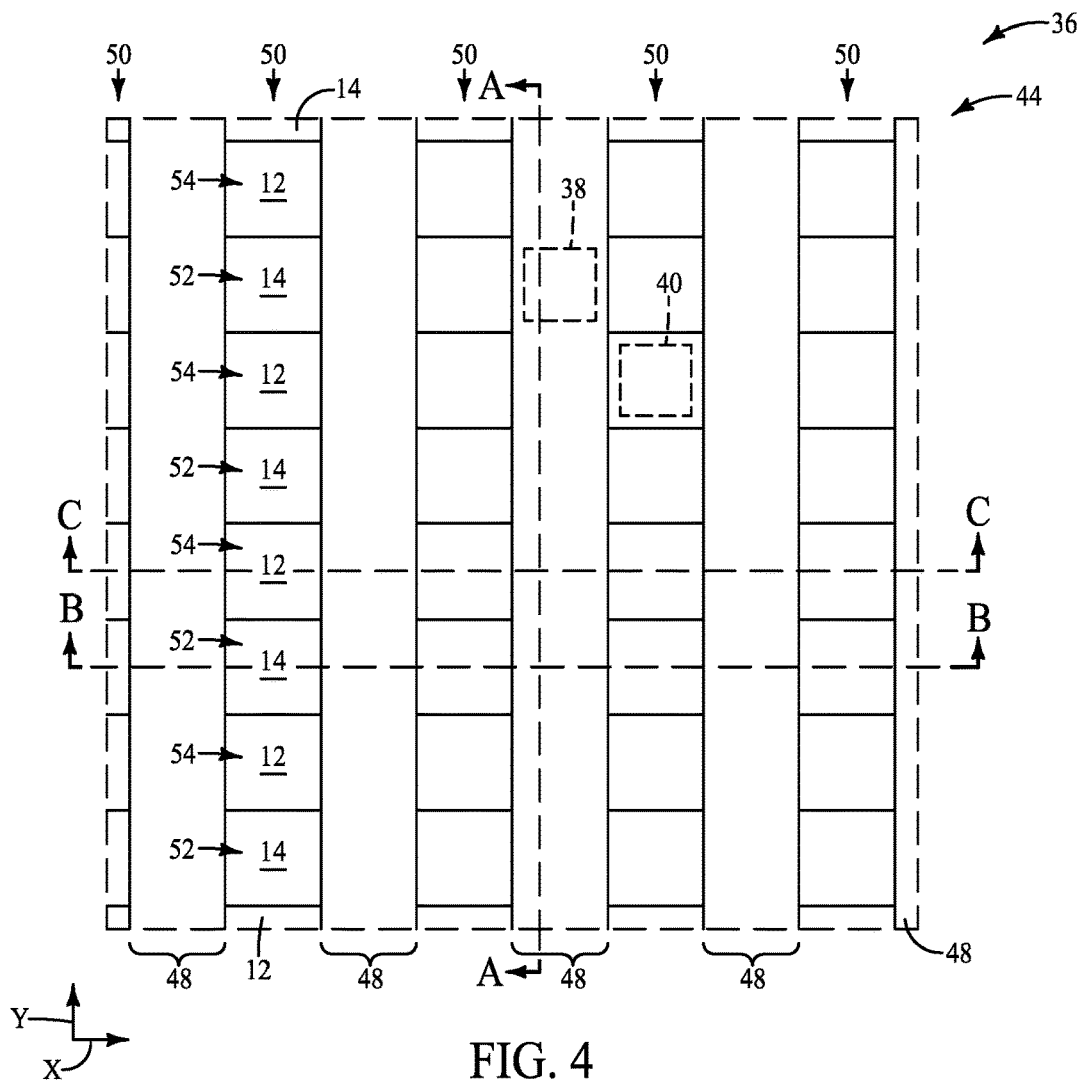
Figure 4A:
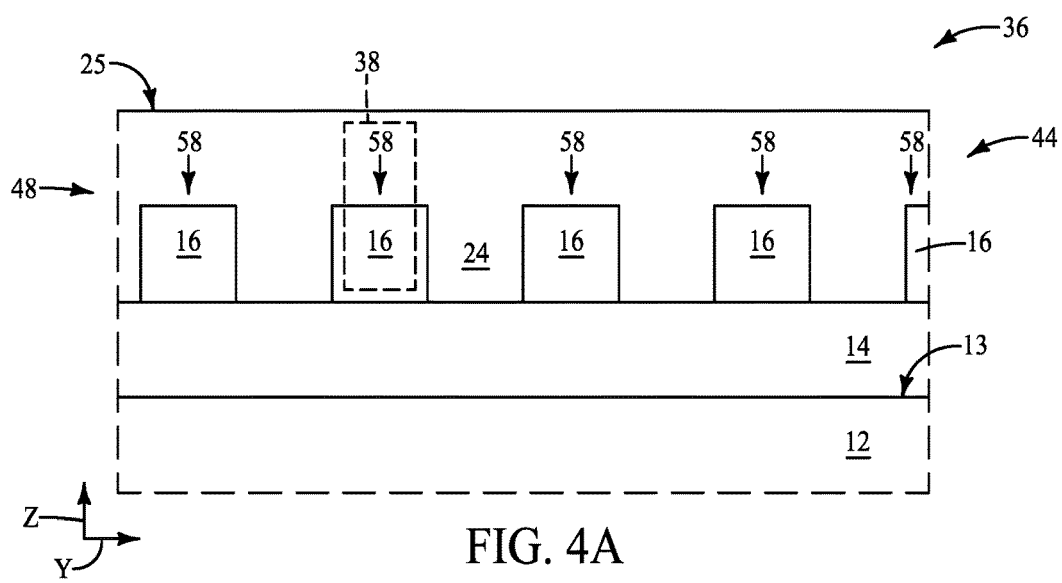
Figure 4B:
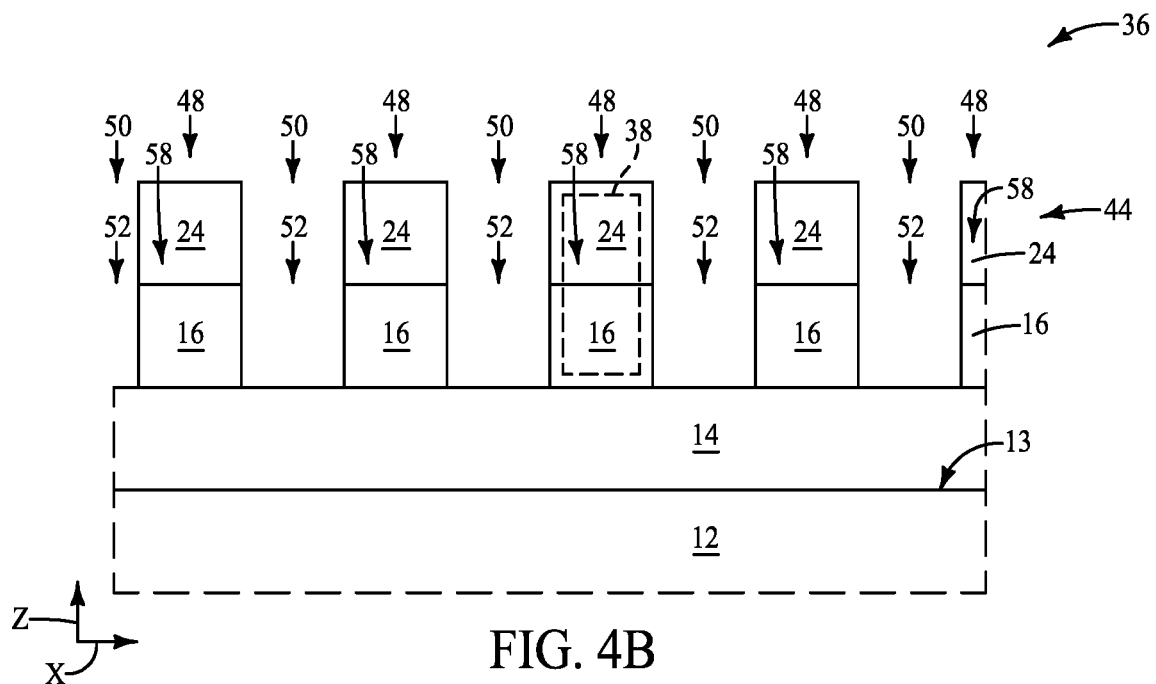
Figure 4C:
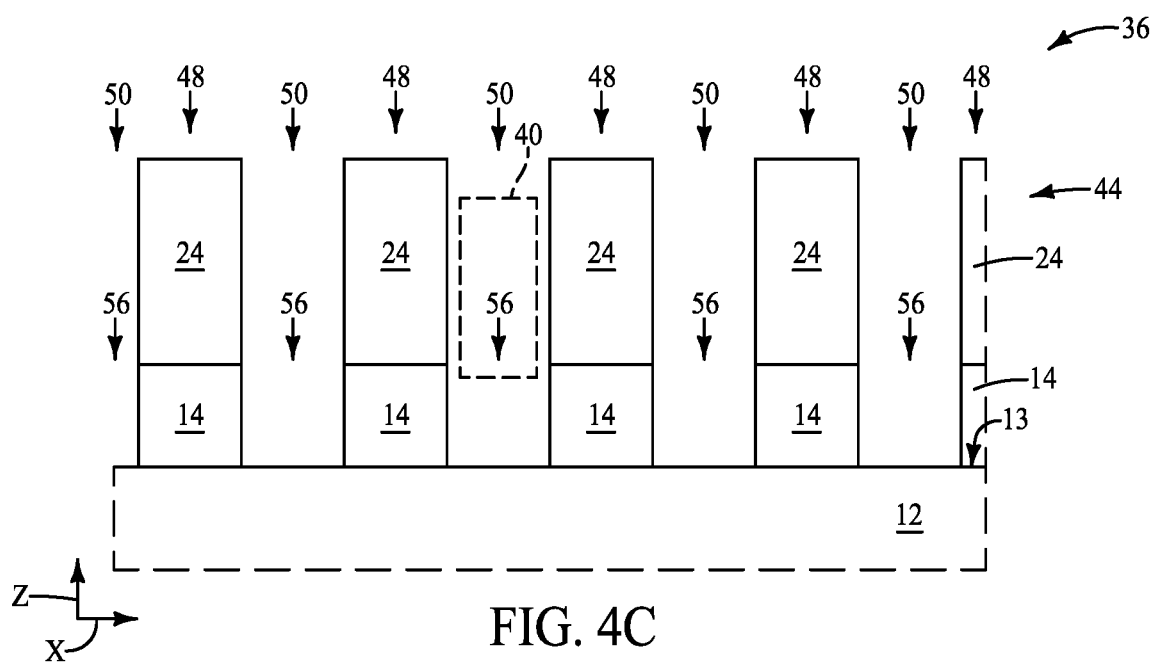

Referring to FIGS. 4-4C, the first gap regions 52 are extended into the first lines 18 (FIGS. 3-3C) to pattern the first-line-material 16 into pillars 58. Each of the pillars is located in a first crossing region 38 where the lines of the first L/S pattern 22 (FIG. 3) cross the lines of the second L/S pattern 32 (FIG. 3).

Figure 5:
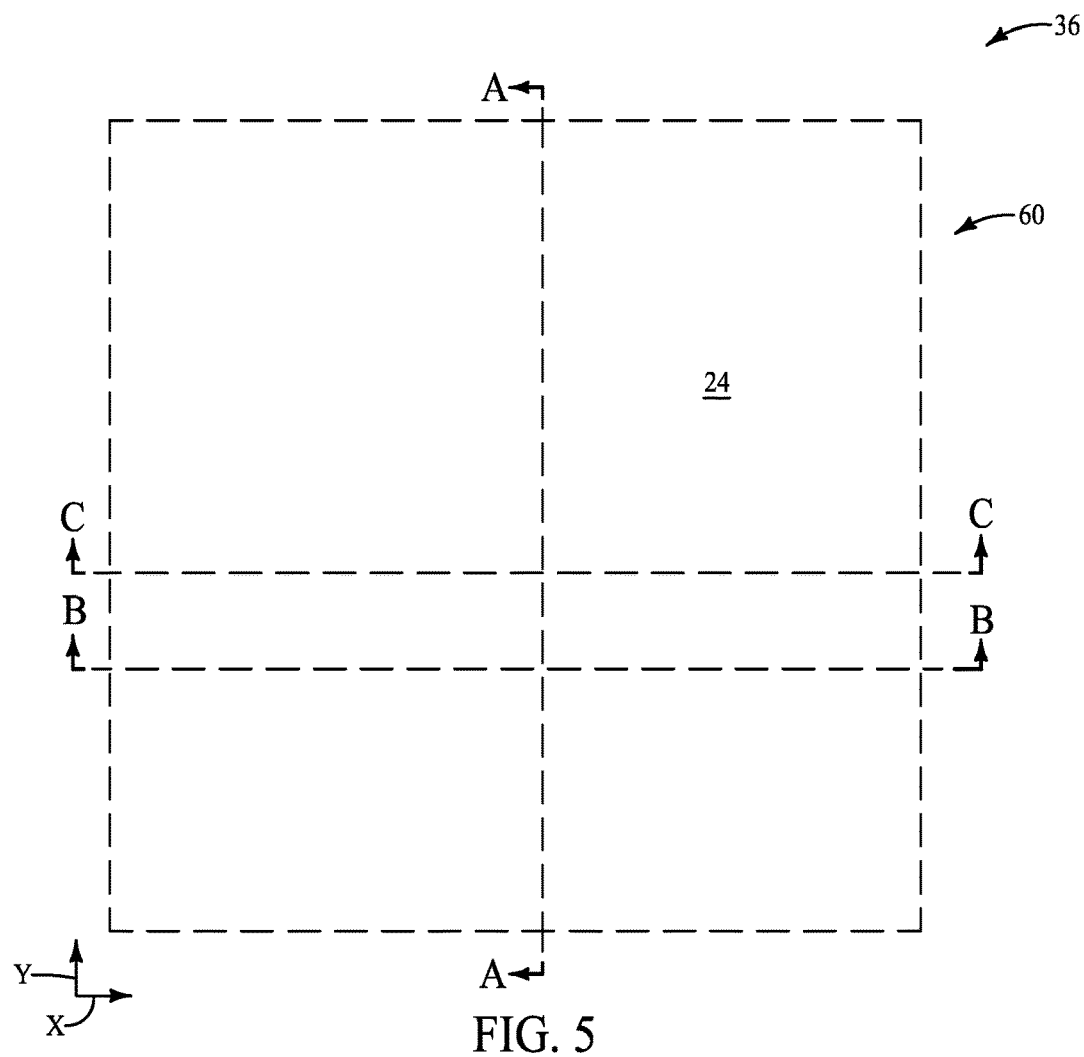
Figure 5A:
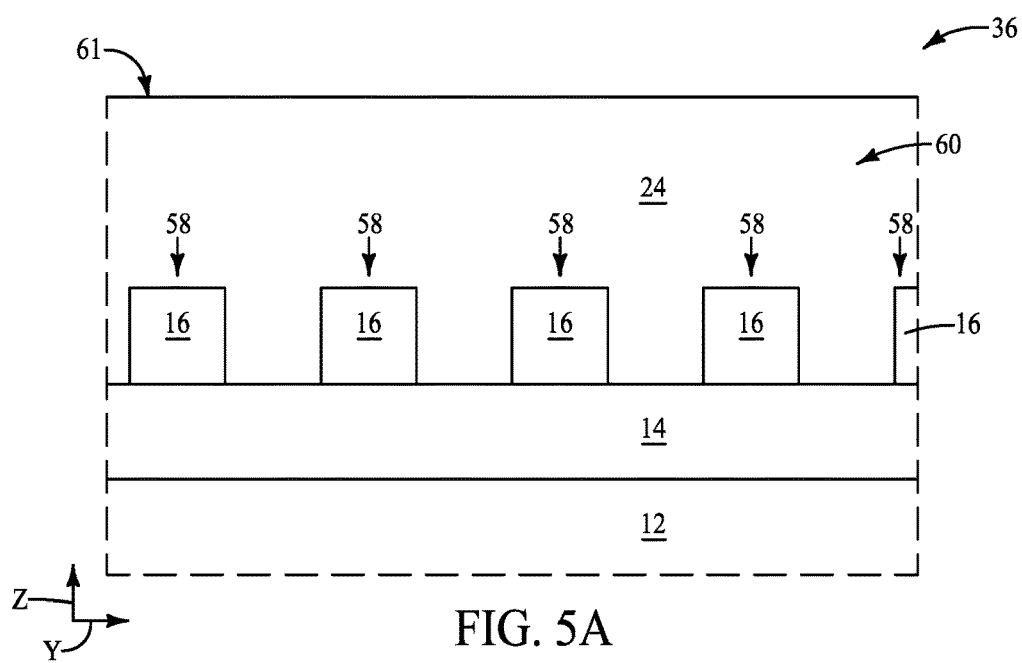
Figure 5B:
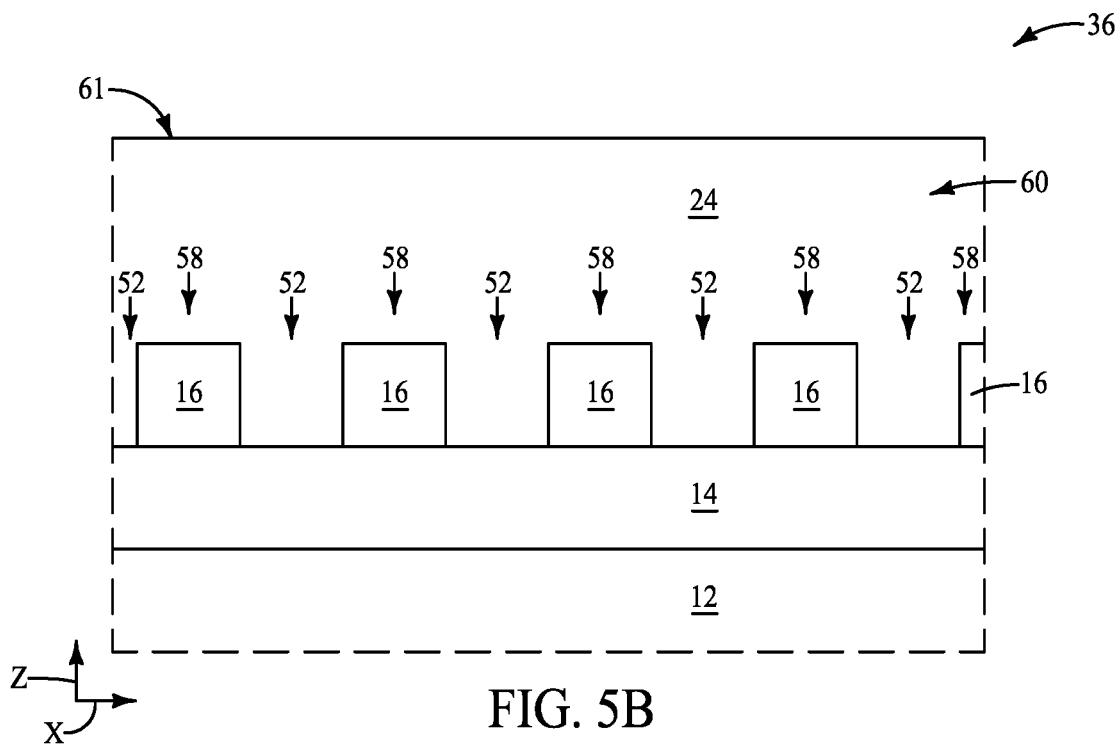
Figure 5C:
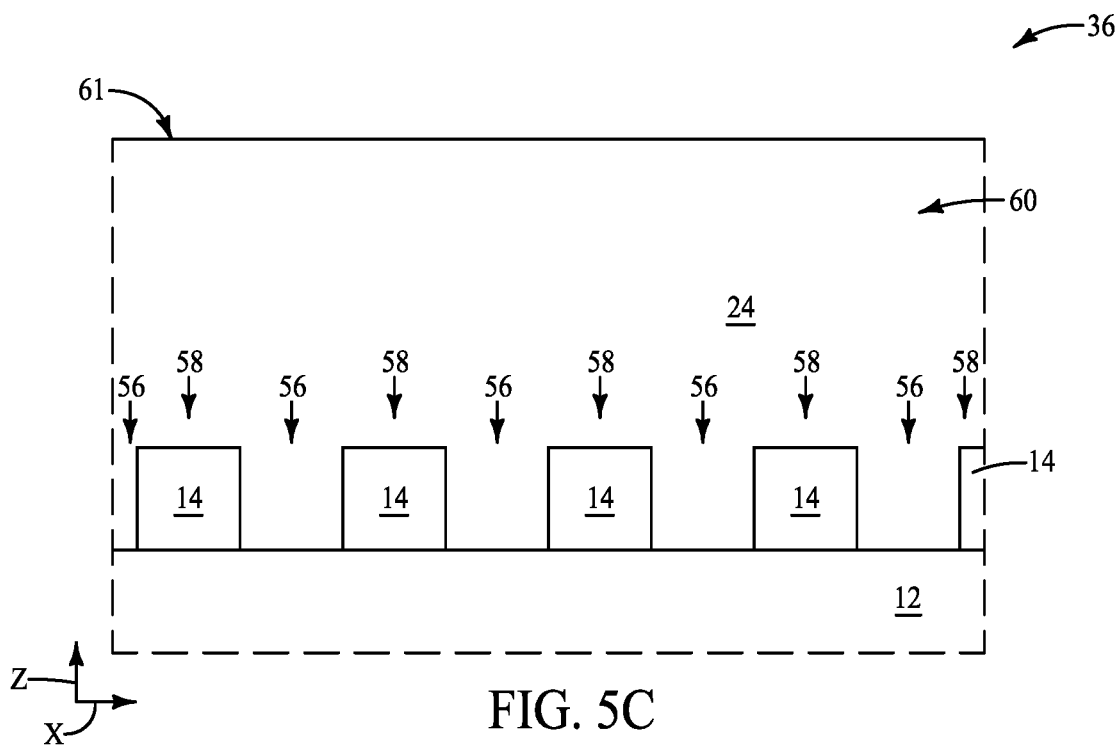

Referring to FIGS. 5-5C, additional mold material 24 is formed over the lines 48 (FIG. 4) and within the spaces 50 between the lines 48. The additional mold material fills the openings 56 within the masking material 14, as shown in FIG. 5C; and fills the openings 52 which extend between the pillars 48, as shown in FIG. 5B.

The lines 48 and spaces 50 of FIG. 4 may be considered to be comprised by the first pattern 44 (FIG. 4) of the mold material. Accordingly, the additional mold material 24 may be considered to be formed within the first pattern 44. The additional mold material 24 fills the first pattern 44 (FIG. 4), and together with the mold material of the first pattern forms a mold material mass 60. The mold material mass 60 has an upper surface 61 which is above the previous upper surface 25 (FIG. 4A) of the mold material 24 within the pattern 44. In some embodiments, the upper surface 61 may referred to as third upper surface to distinguish it from the first and second upper surfaces 15 and 25 described above with reference to FIGS. 1-1C.

Figure 6:
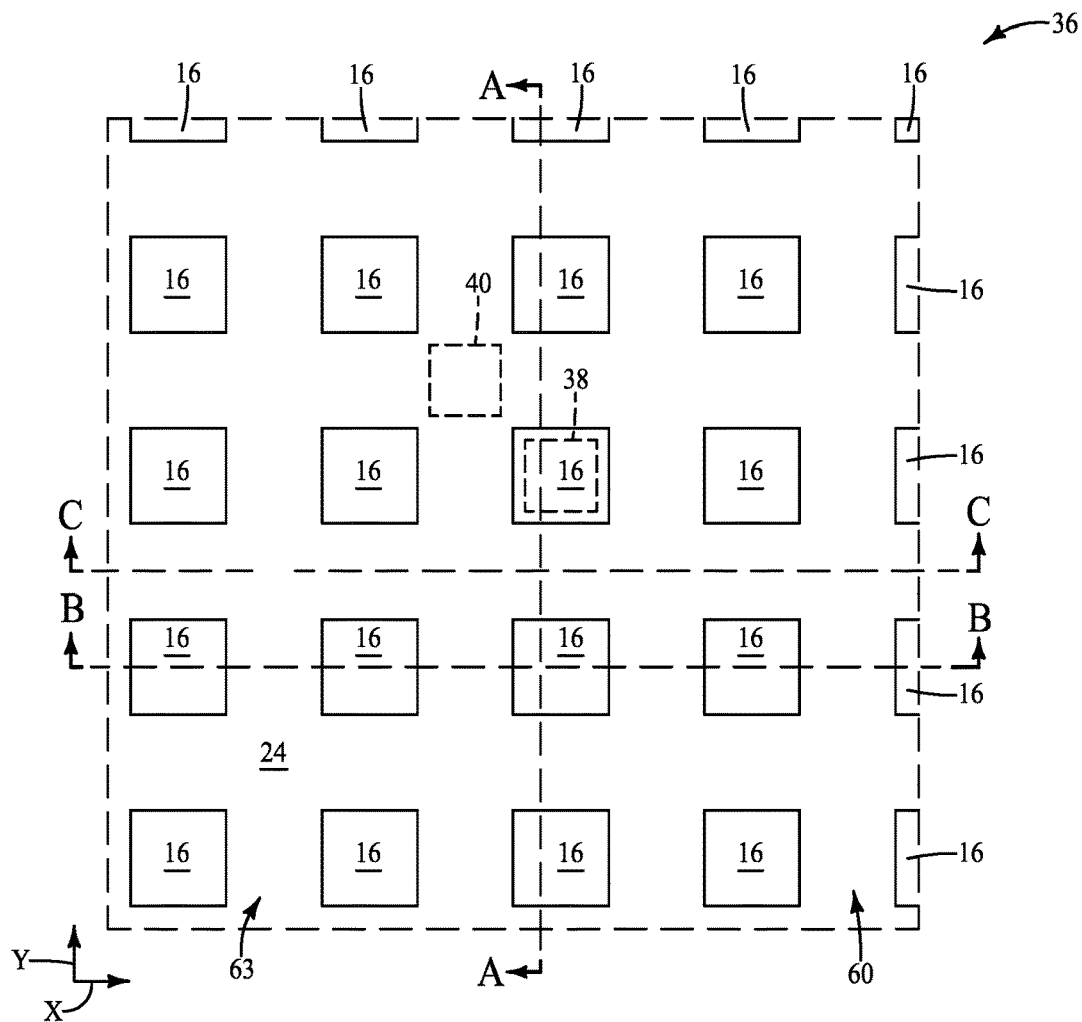
Figure 6A:
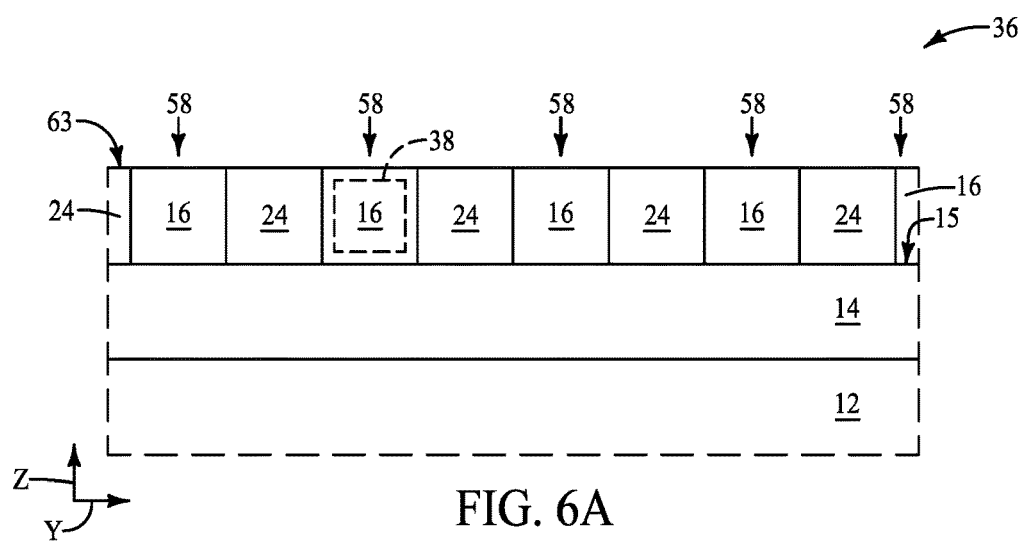
Figure 6B:
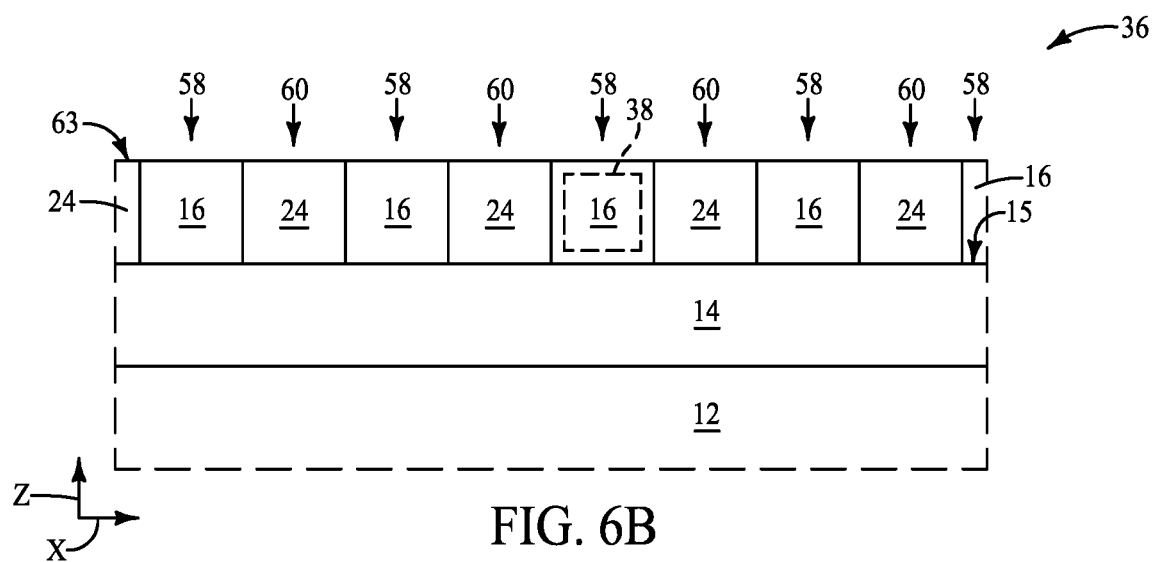
Figure 6C:
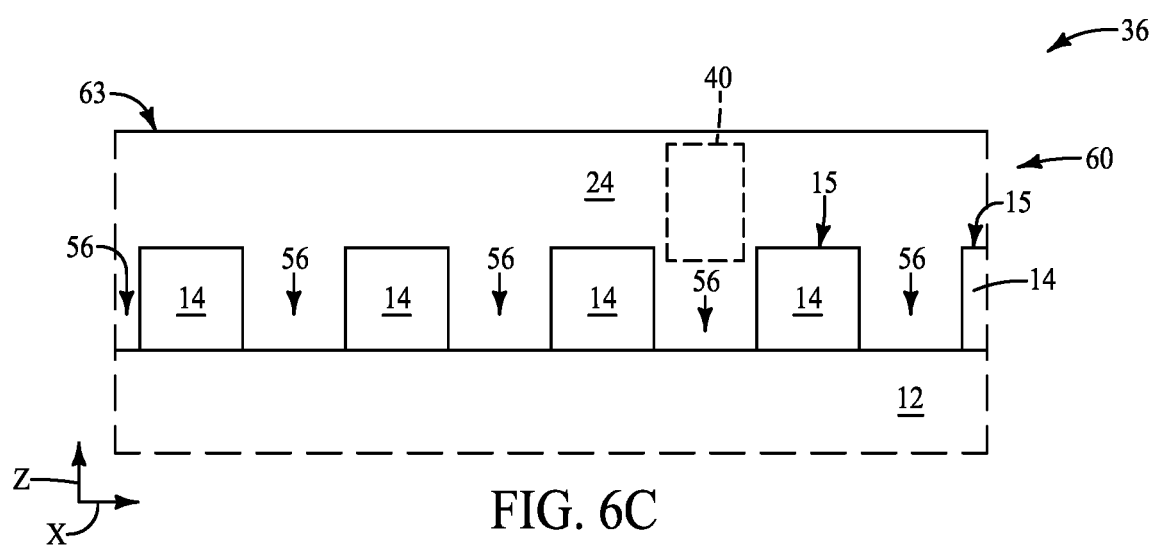

Referring to FIGS. 6-6C, an upper surface of the mold material mass 60 is removed to form a fourth upper surface 63 that extends along upper surfaces of the pillars 58, and along upper surfaces of regions of the mold material mass 60 between the pillars. The fourth upper surface 63 is above the first upper surface 15 of the masking material 14.

Figure 7:
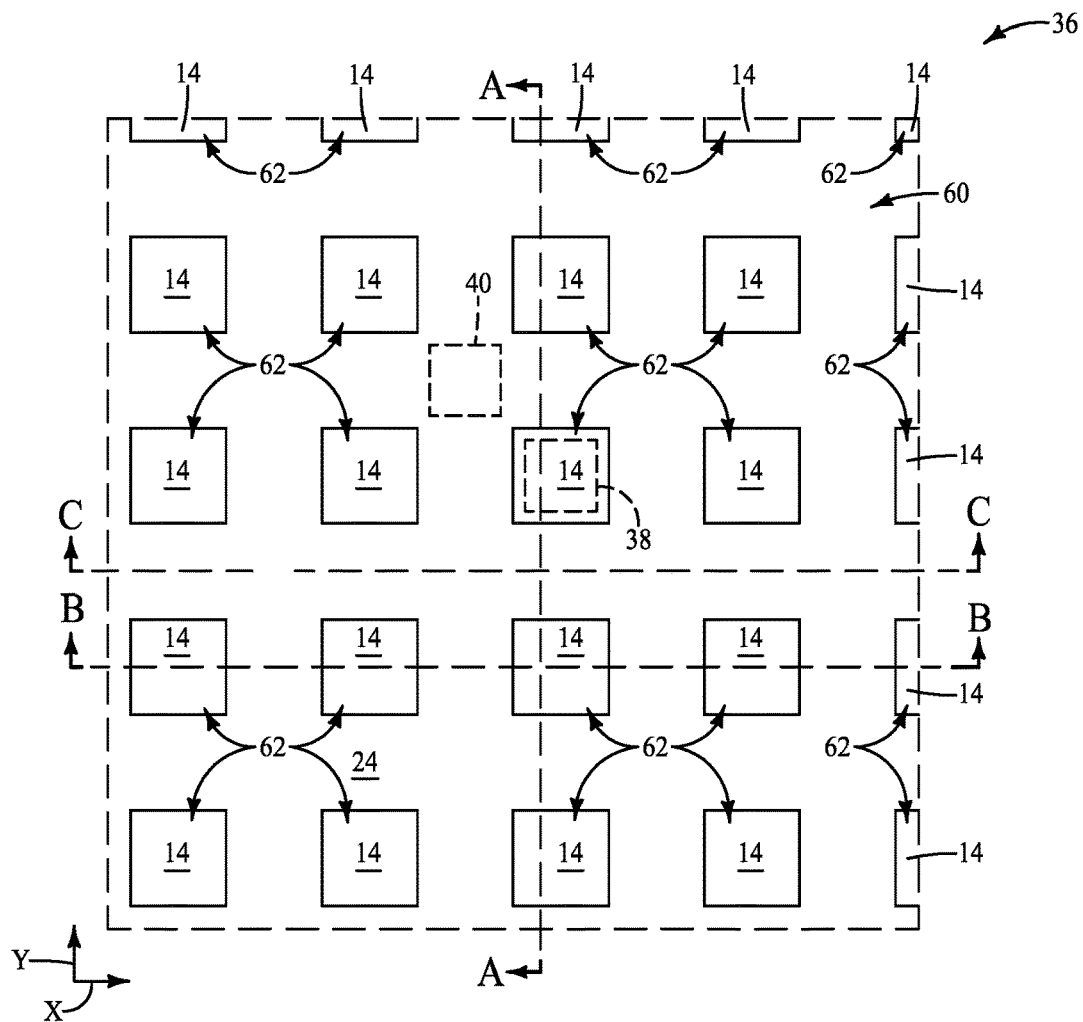
Figure 7A:
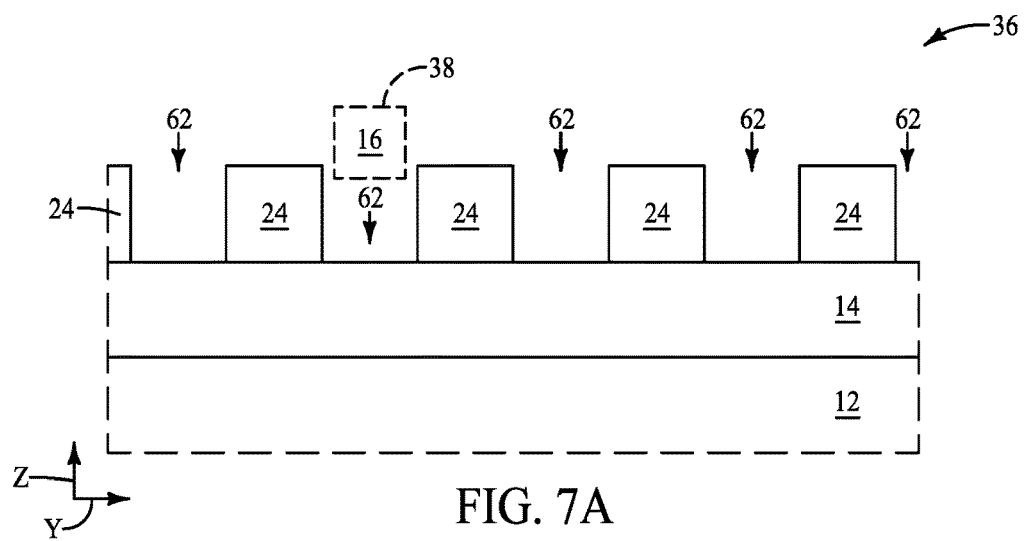
Figure 7B:
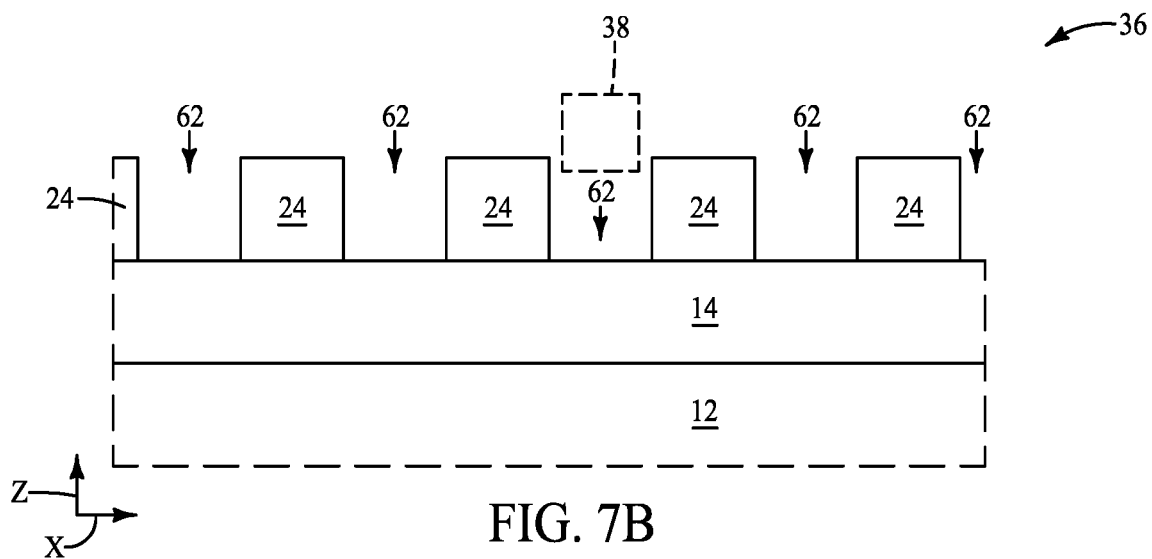
Figure 7C:
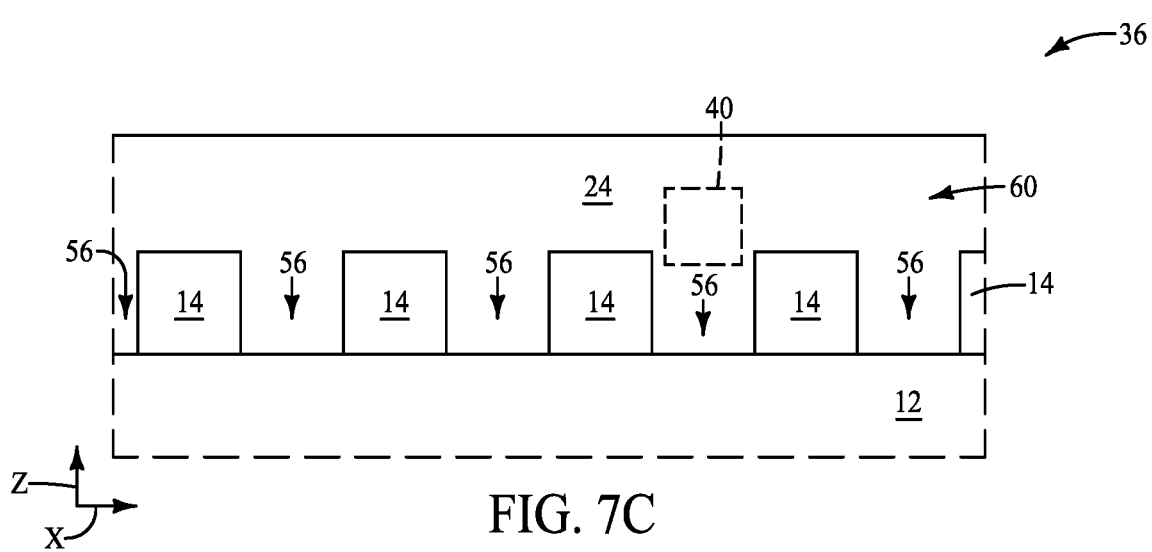

Referring to FIGS. 7-7C, the pillars are removed to leave openings 62 extending through the mold material mass 60. The pillars may be removed with an etch selective for the material 16 (FIGS. 6-6C) relative to the material 24.

Each of the openings 62 is located in a first crossing region 38 where the lines of the first L/S pattern 22 (FIG. 1) cross the lines of the second L/S pattern 32 (FIG. 1).

Figure 8:
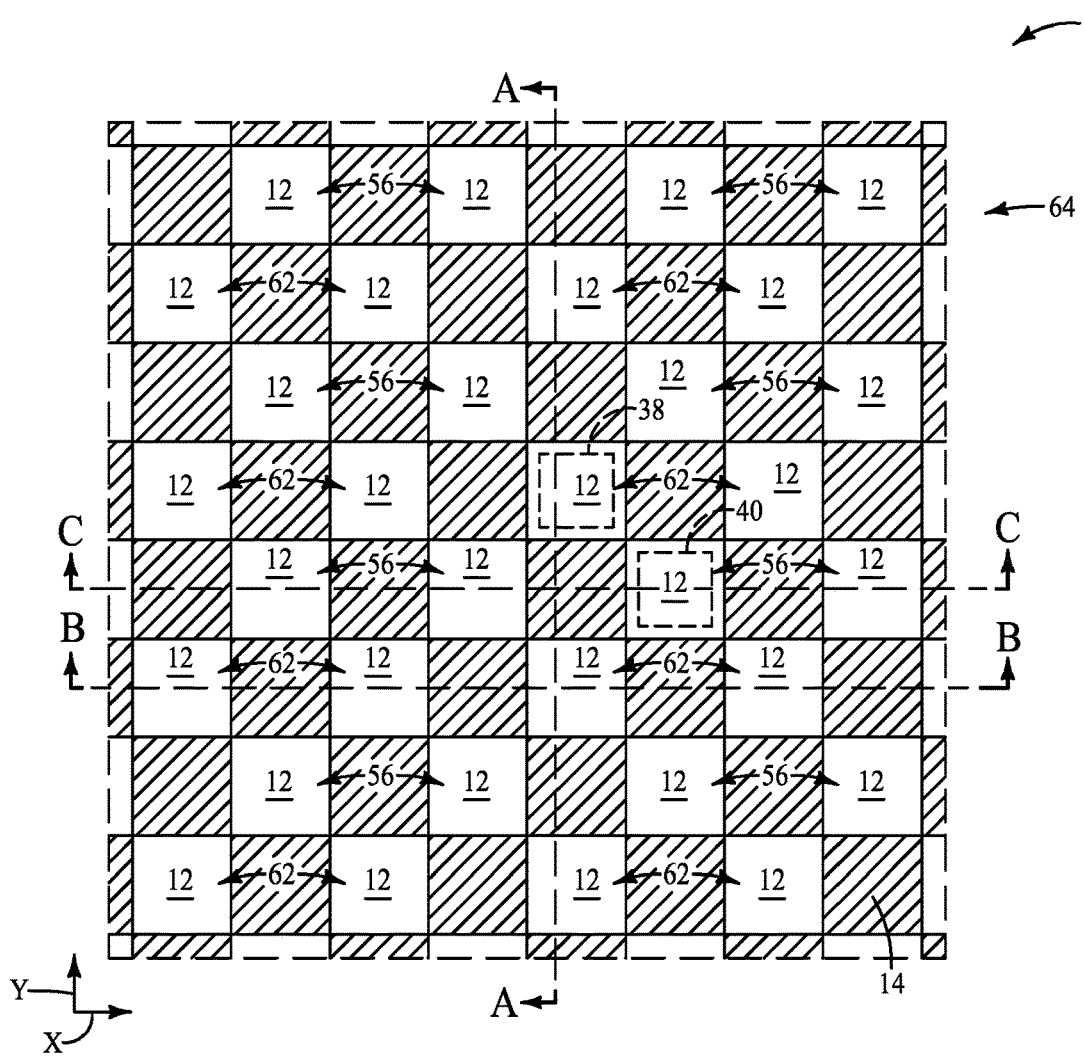
Figure 8A:
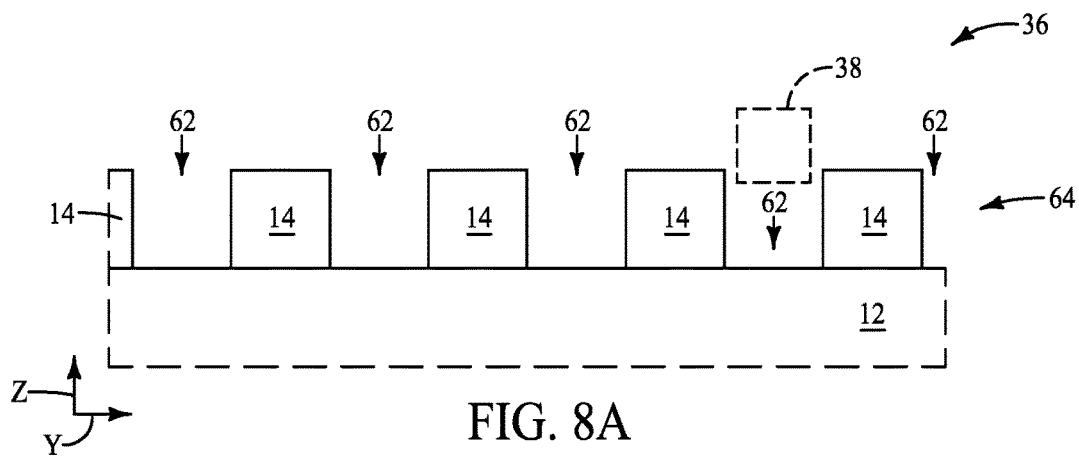
Figure 8B:
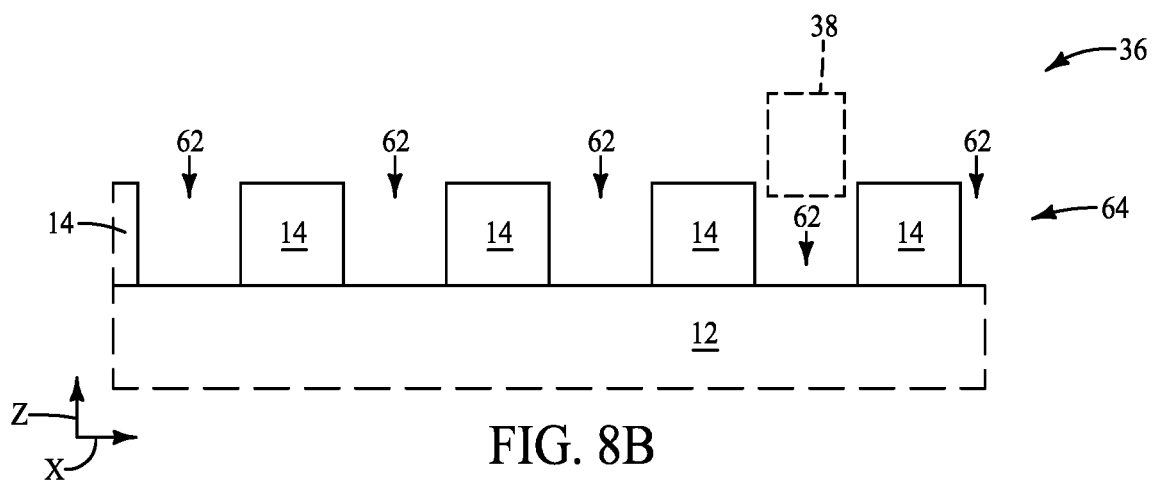
Figure 8C:
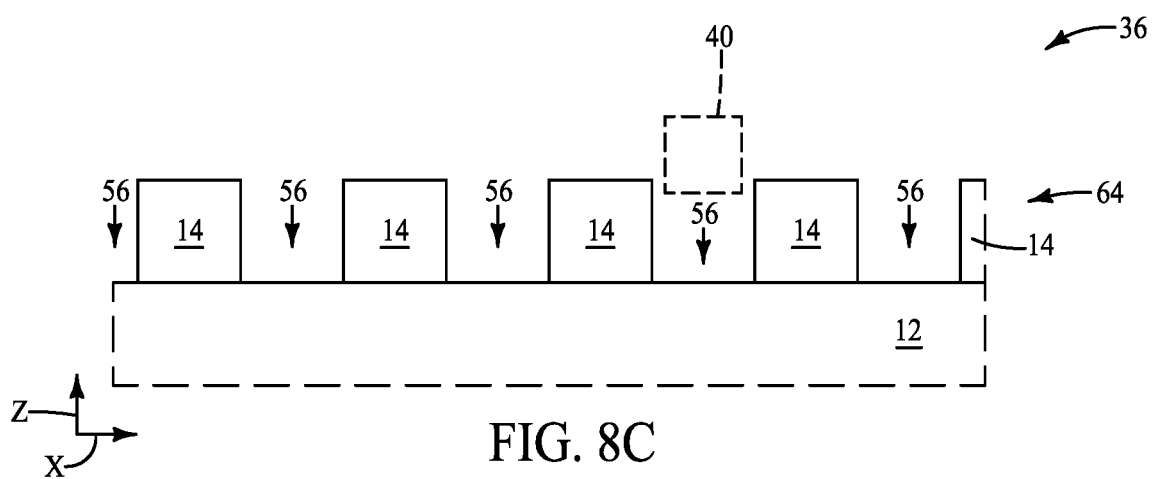

Referring to FIGS. 8-8C, the openings 62 are extended into the masking material 14, and subsequently the mold material 24 (FIGS. 7-7C) is removed. The openings 62 may be referred to as second openings to distinguish them from the first openings 56 that had been previously formed in the masking material 14 at the processing stage of FIGS. 3-3C. In some embodiments, the openings 62 may be considered to be extended into the masking material 14 with a second etch which occurs at a later processing stage than the first etch utilized to form the first openings 56. The masking material 14 is shown with crosshatching in the top view FIG. 8 so that may be readily distinguished from the target material 12.

The first openings 56 are formed at locations defined by the second crossing regions 40 (i.e. where the spaces of the first L/S pattern 22 (FIG. 1) cross the spaces of the second L/S pattern 32 (FIG. 1)); and the second openings 62 are formed at locations defined by the first crossing regions 38 (i.e. where the lines of the first L/S pattern 22 (FIG. 1) cross the lines of the second L/S pattern 32 (FIG. 1)). The openings 56 and 62 together form a pattern 64 within the masking material 14. Such pattern may be referred to as a second pattern to distinguish it from the first pattern 44 that had been formed in the mold material 24 at the processing stage of FIGS. 2-2C.

In some embodiments, the pattern 64 of FIGS. 8-8C may be considered to result from a transfer of an initial pattern of the crossing regions 40 and 38 (shown at the processing stage of FIGS. 1-1C) into the masking material 14 to form the first and second holes 56 and 62 in the masking material in locations directly under the crossing regions 40 and 38, respectively. In the illustrated embodiment, the first and second holes 56 and 62 are substantially square-shaped (with the term "substantially square-shaped" meaning square-shaped to within reasonable tolerances of fabrication and measurement), but in other embodiments may have other shapes.

In some embodiments, the first holes 56 may be considered to be formed by removing portions of the masking material 14 that correspond to segments defined under the crossing portions 21 and 31 (FIG. 1C) of spaces 20 and 30 (FIG. 1-1C) from the first and second L/S patterns 22 and 32 (FIG. 1-1C), respectively.

In some embodiments, the second holes 62 may be considered to be formed by removing portions of the masking material 14 that correspond to segments defined under the crossing portions crossing portions 19 and 29, respectively, of lines 18 and 28 (FIG. 1-1C) from the first and second L/S patterns 22 and 32 (FIG. 1-1C), respectively.

An advantage of the processing of FIGS. 1-8 is that such forms a dense pattern 64 of openings (56/62) within the masking material 14. Such dense pattern may be utilized for fabricating highly-integrated circuitry. The pattern of FIG. 8 may be much denser than patterns formed utilizing conventional methods because the pattern of FIG. 8 is formed by a method which forms openings at locations where the lines of the L/S patterns cross and also where the spaces of the L/S patterns cross; in contrast to conventional methods which either form openings at locations where lines of L/S patterns cross, or at locations where spaces of L/S patterns cross.

Figure 9:
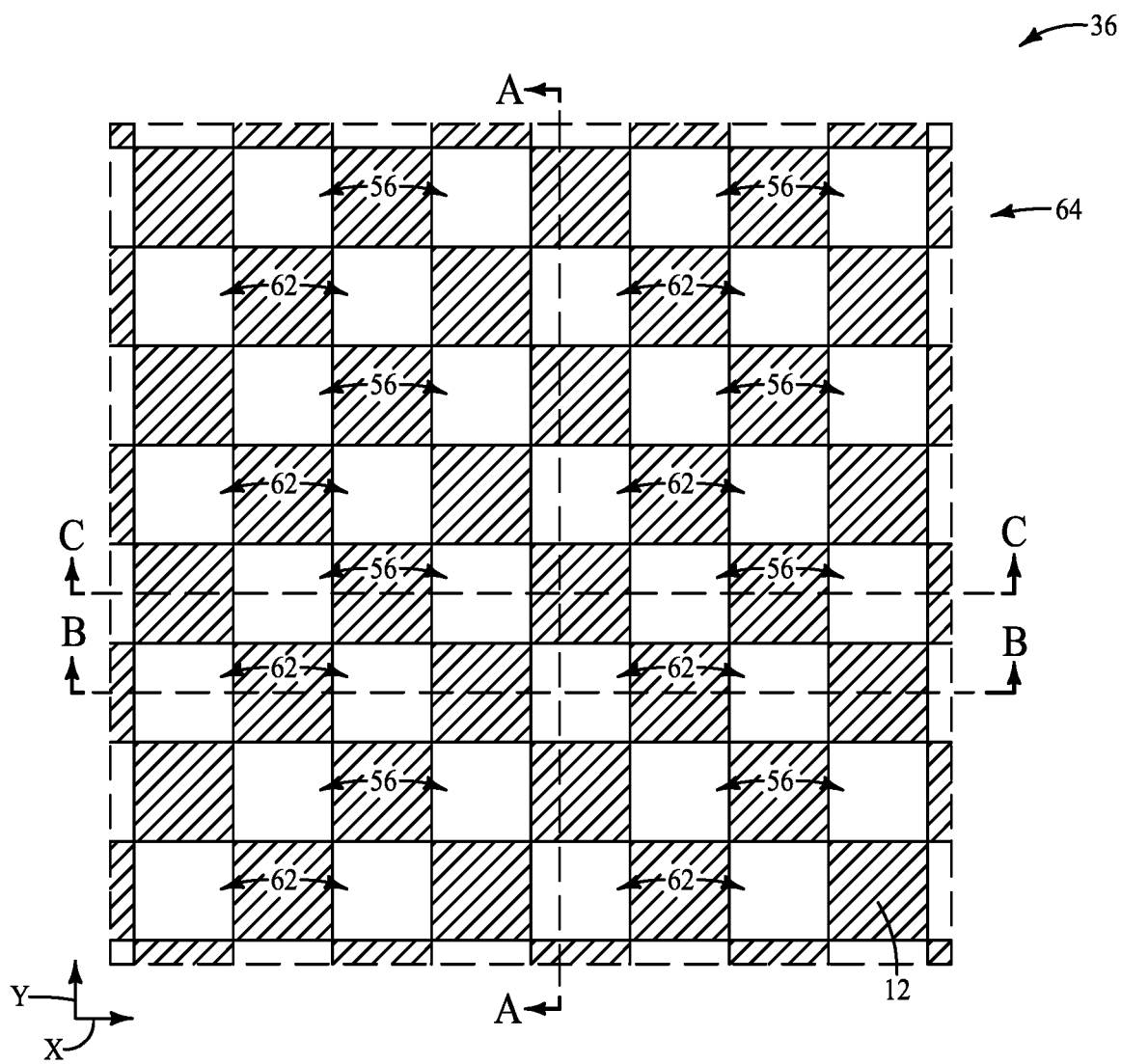
Figure 9A:
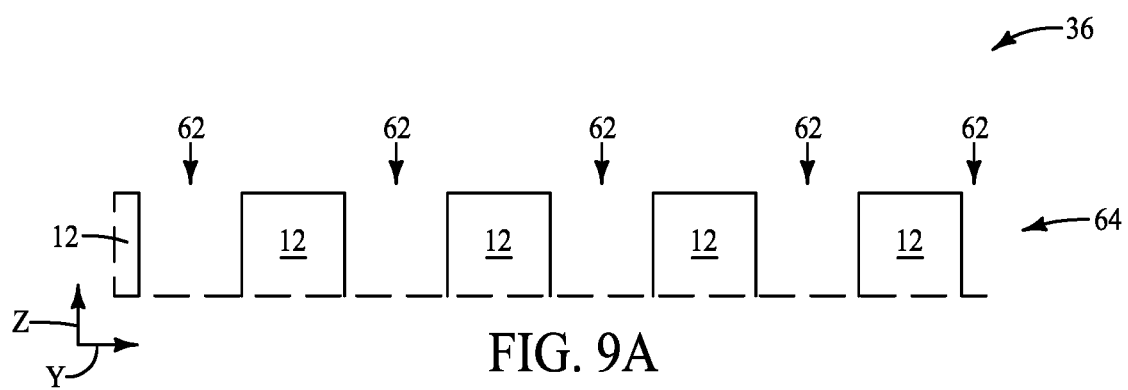
Figure 9B:
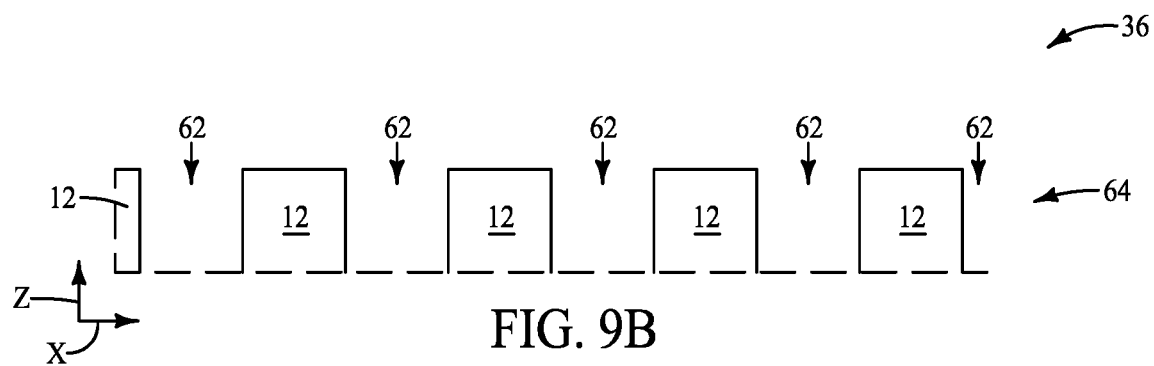
Figure 9C:
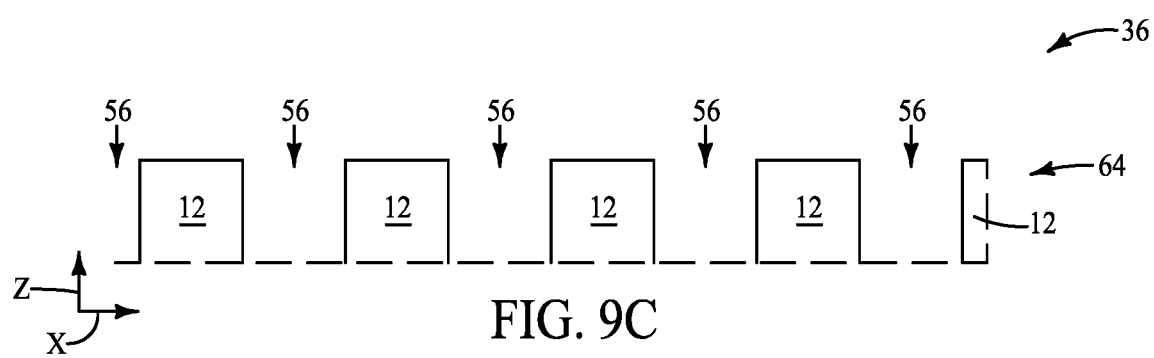

Referring to FIGS. 9-9C, the second pattern 64 is transferred from the masking material 14 (FIGS. 8-8C) to the target material 12, and the masking material is removed. In other words, the first and second holes 56 and 62 of FIGS. 8-8C are extended into the target material 12. The target material 12 is illustrated with crosshatching in the top view of FIG. 9 so that the pattern of the holes 56 and 62 may be readily identified by the reader.

Figure 10:
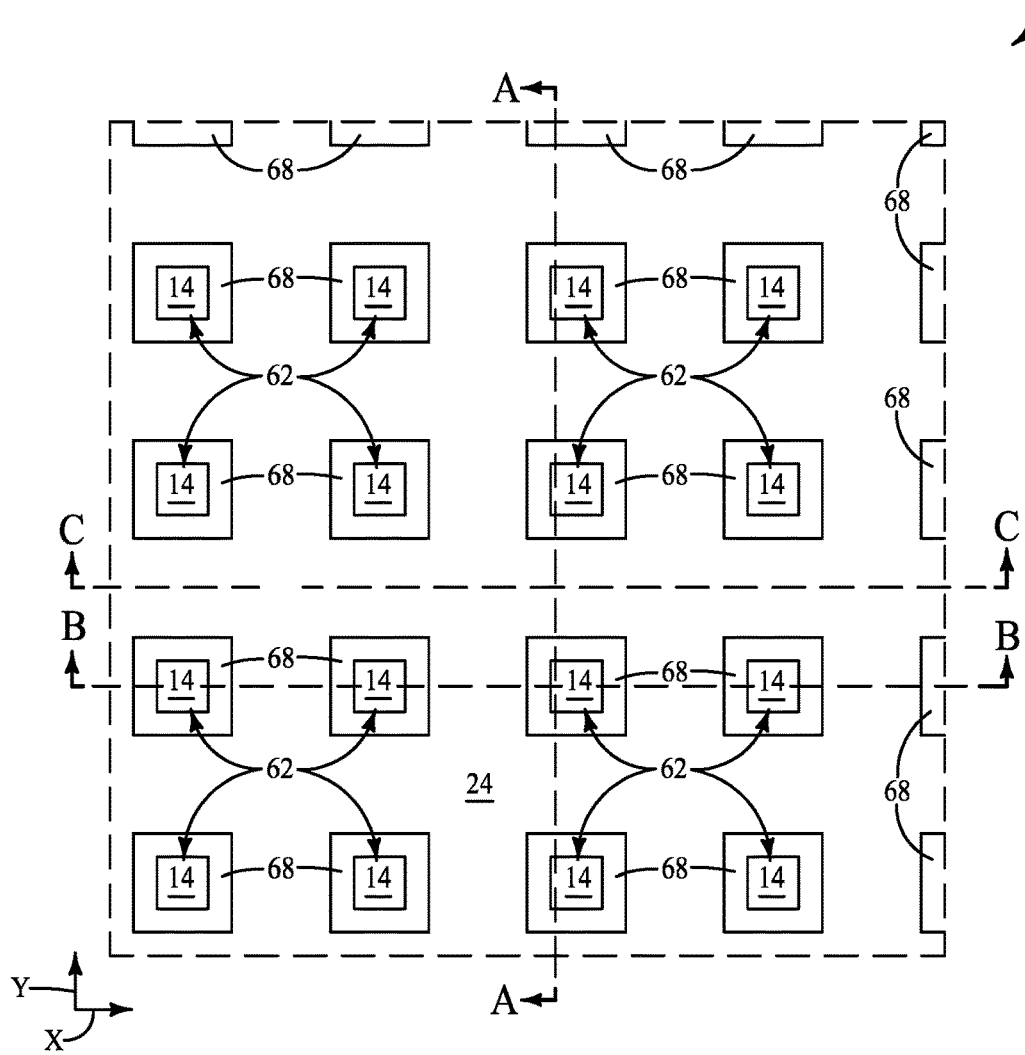
FIGS. 10-12 are diagrammatic top views of an example assembly at example process stages of an example method for forming an example repeating pattern.
Figure 10A:
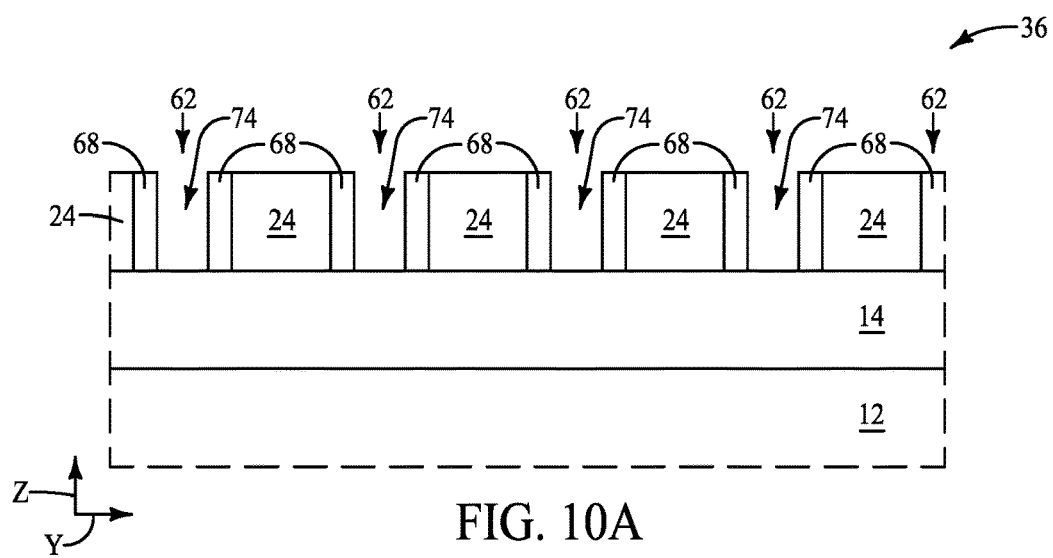

In some embodiments, the first and second openings 56 and 62 may be narrowed with spacers prior to transferring the openings into the target material 12. For instance, FIGS. 10-10C show an embodiment in which spacers 66 narrow the first openings 56, and in which spacers 68 narrow the second openings 62. The spacers 66 and 68 may comprise any suitable composition(s); and may comprise the same composition(s) as one another or different composition(s) relative to one another. In some embodiments, the spacers 66 may comprise anisotropically-etched material having a composition identical to the composition of the masking material 14, and the spacers 68 may comprise anisotropically-etched carbon-containing material.

Figure 10B:
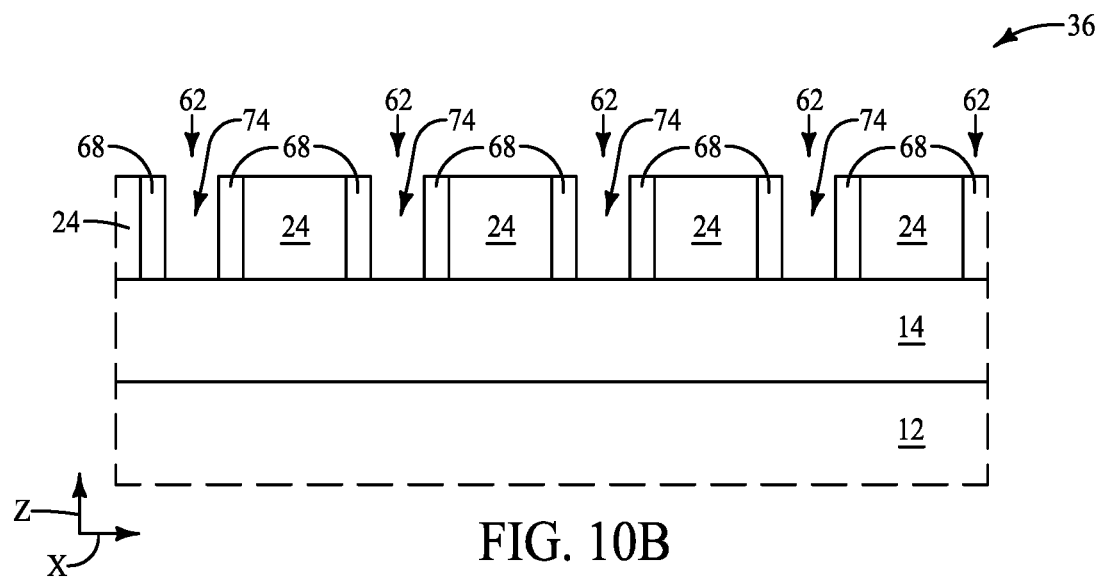
Figure 10C:
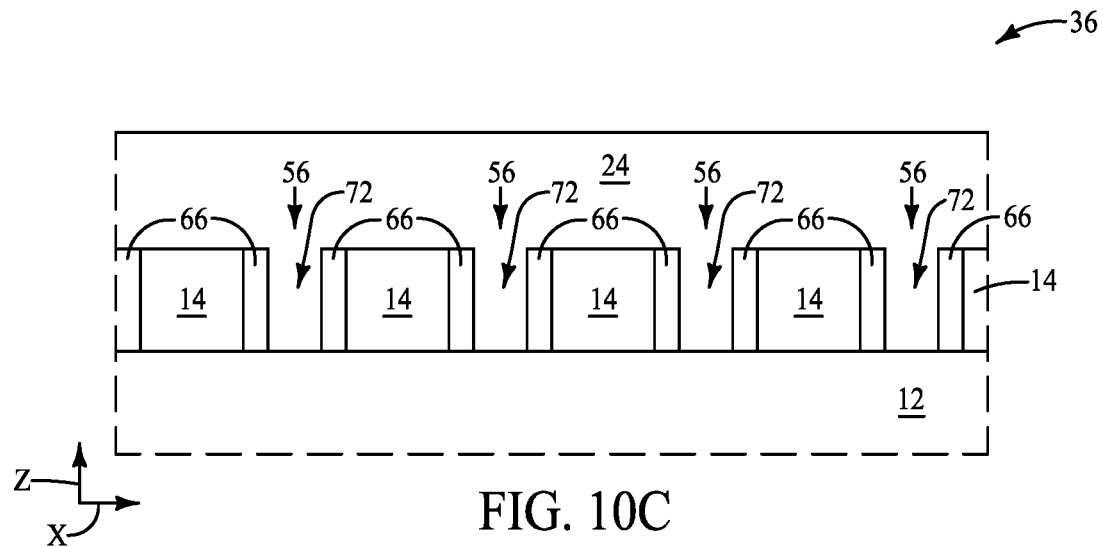

The processing stage of FIGS. 10-10B may follow that of FIGS. 7-7B, and the processing stage of FIG. 10C may follow that of FIG. 4C. Accordingly, the spacers 68 within the second openings 62 may be formed subsequent to the spacers 66 within the first openings 56. In some embodiments, the narrowing of the first holes 56 with the spacers 66 may be considered to convert the first holes into third holes 72, and the narrowing of the second holes 62 with the spacers 68 may be considered to convert the second holes into fourth holes 74.

Figure 11:
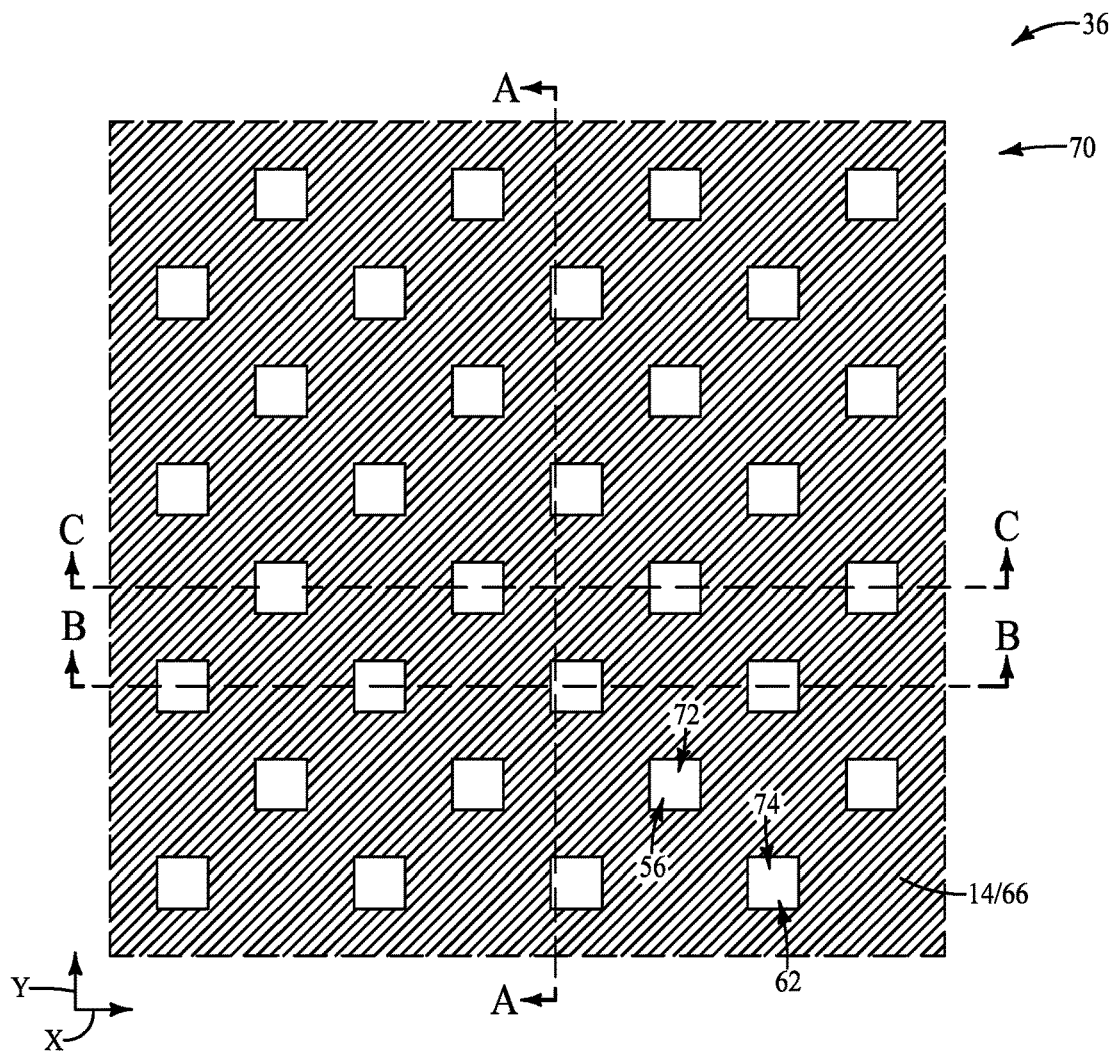
Figure 11A:
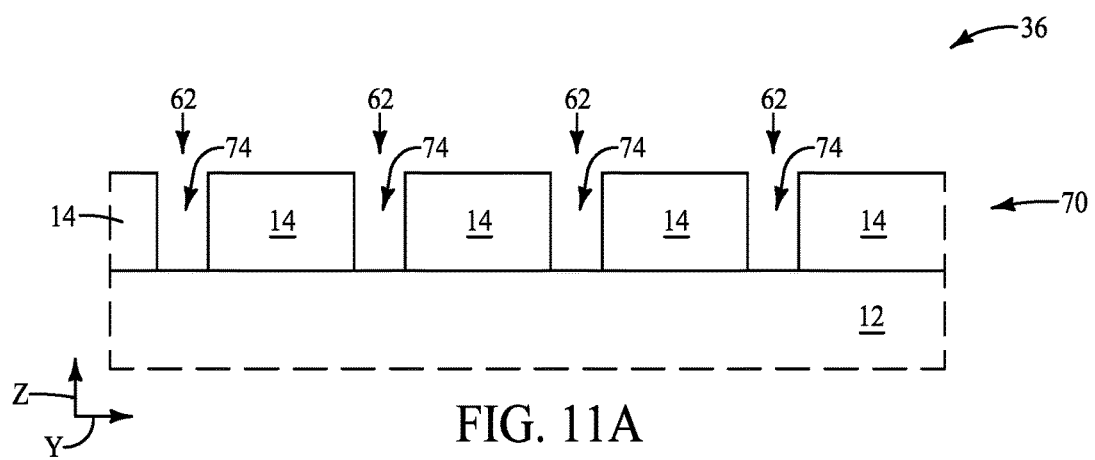
Figure 11B:
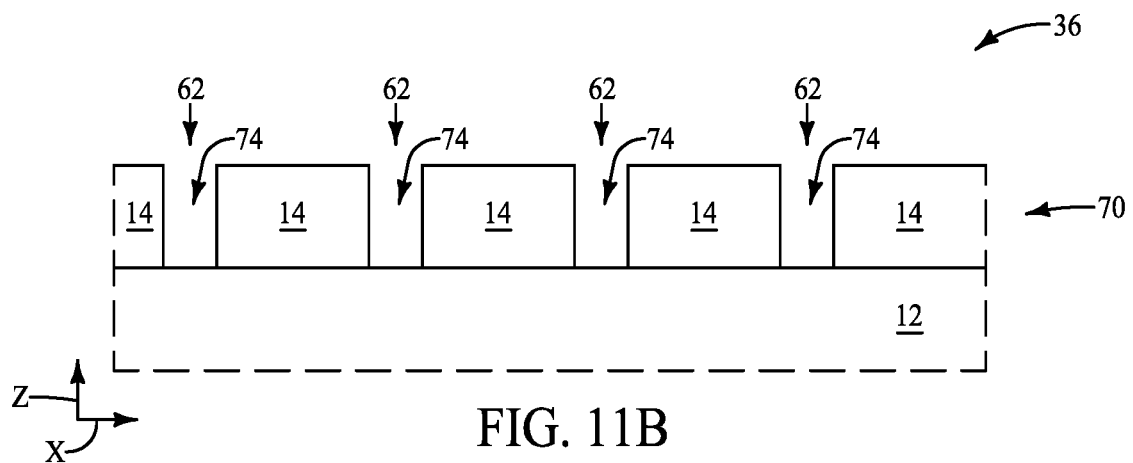
Figure 11C:
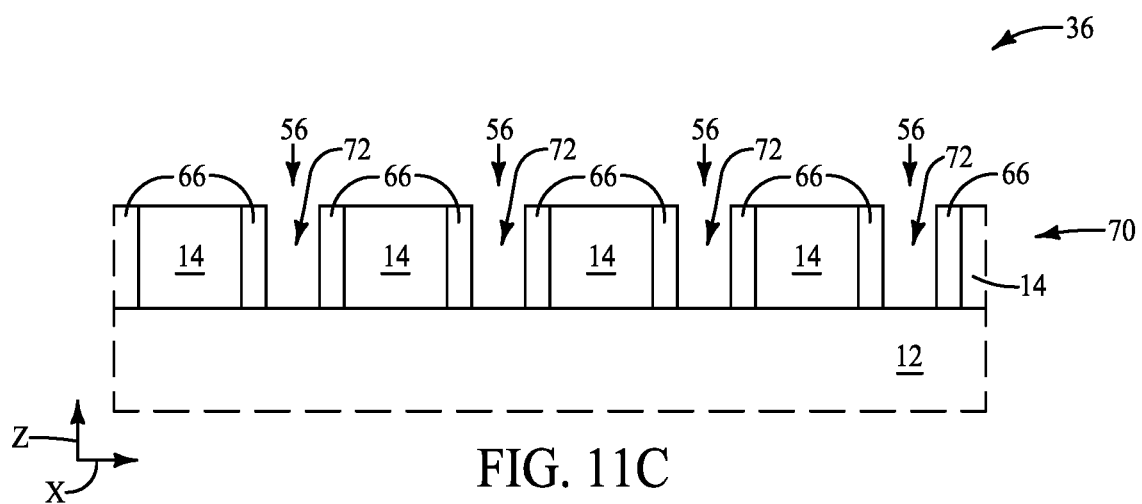

Referring to FIGS. 11-11C, the narrowed openings 62 (i.e., the fourth holes 74) are transferred into the masking material 14, and the mold material 24 and spacers 68 are removed. Accordingly, a pattern 70 is formed within the remaining materials 14 and 66, with such pattern being analogous to the pattern 64 of FIGS. 8-8C. However, the openings 56 and 62 within the pattern 70 are narrower than the analogous openings within the pattern 64 of FIGS. 8-8C. In some embodiments, the narrowed openings 56 and 62 of FIGS. 11-11C may be referred to as third and fourth openings 72 and 74, respectively.

The materials 14 and 66 are shown with crosshatching in the top view of FIG. 11 (and identified as a structure 14/66) so that the pattern 70 of holes 56 and 62 may be readily identified by the reader.

Figure 12:
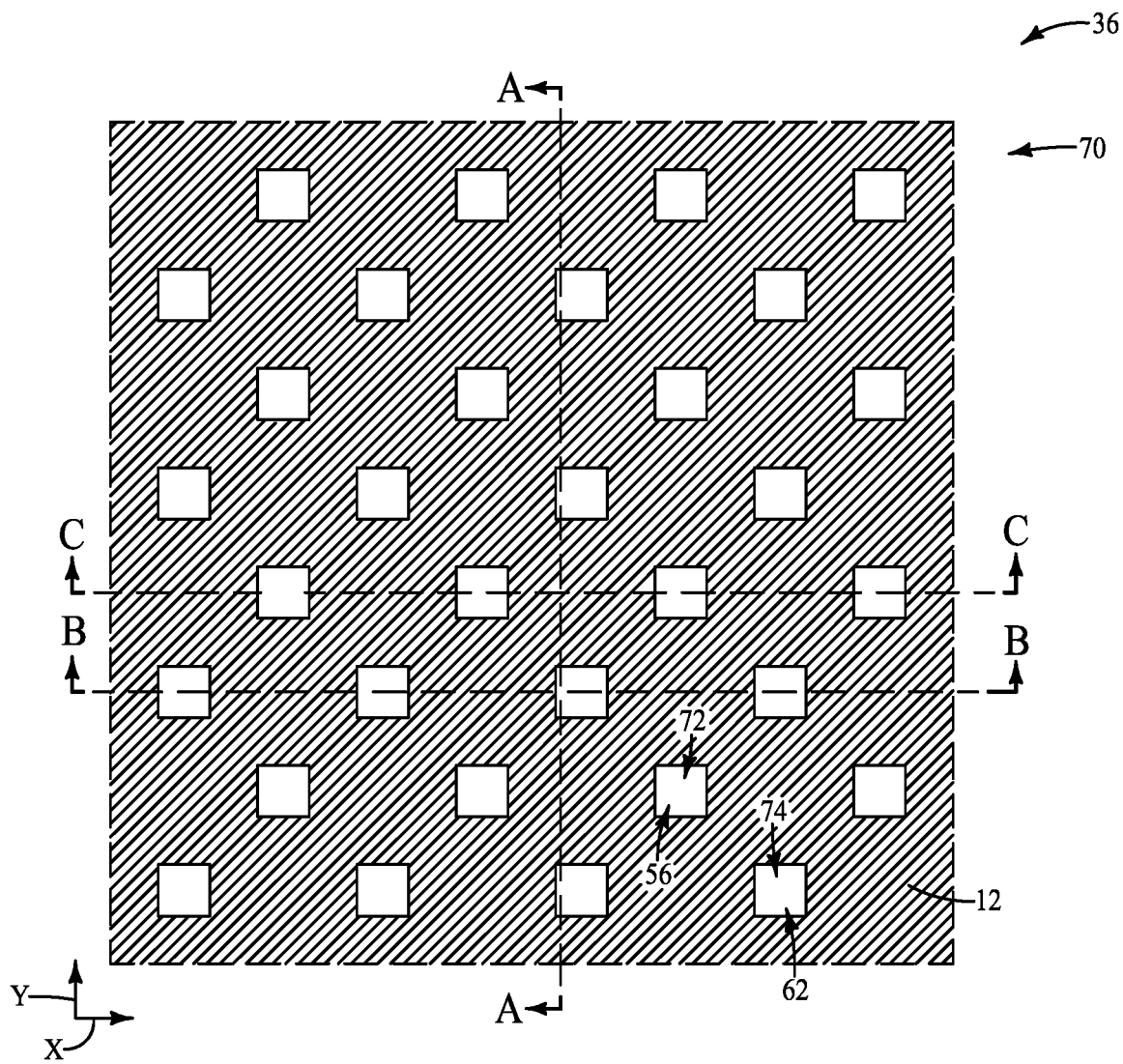
Figure 12A:
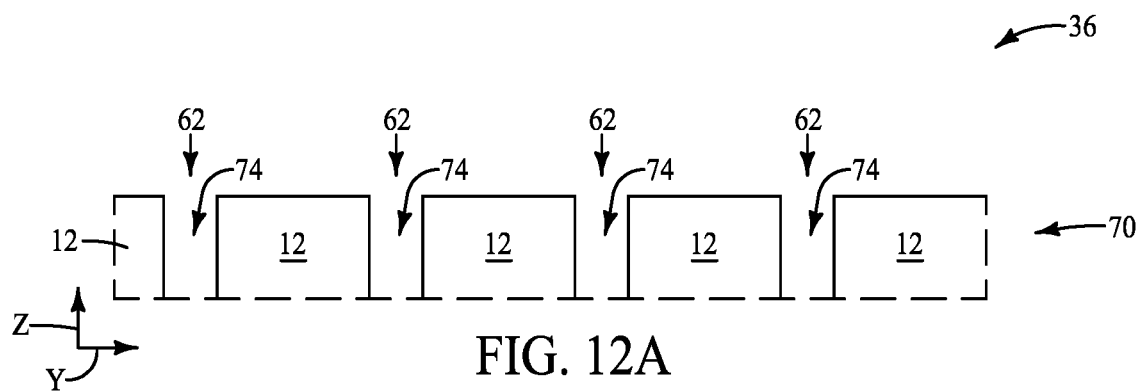
Figure 12B:
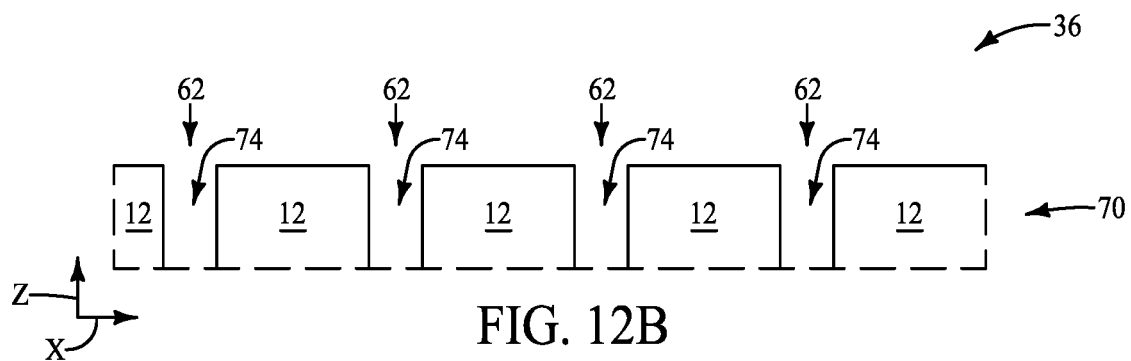
Figure 12C:
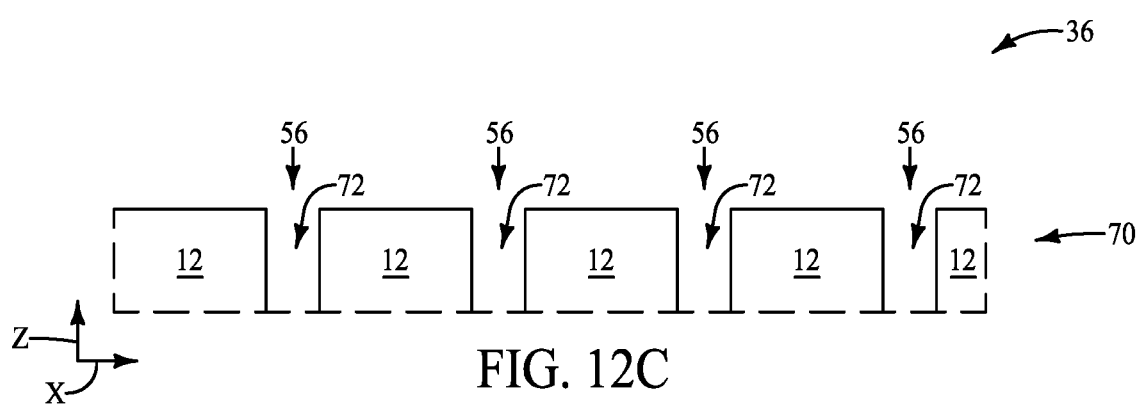

Referring to FIGS. 12-12C, the pattern 70 is transferred into the target material 12 to form a configuration analogous to that described above with reference to FIGS. 9-9C, but comprising narrower openings 56 and 62 than the configuration of FIGS. 9-9C (and in some embodiments may be considered to comprise the third and fourth openings 72 and 74, instead of the first and second openings 56 and 62).

Figure 13:
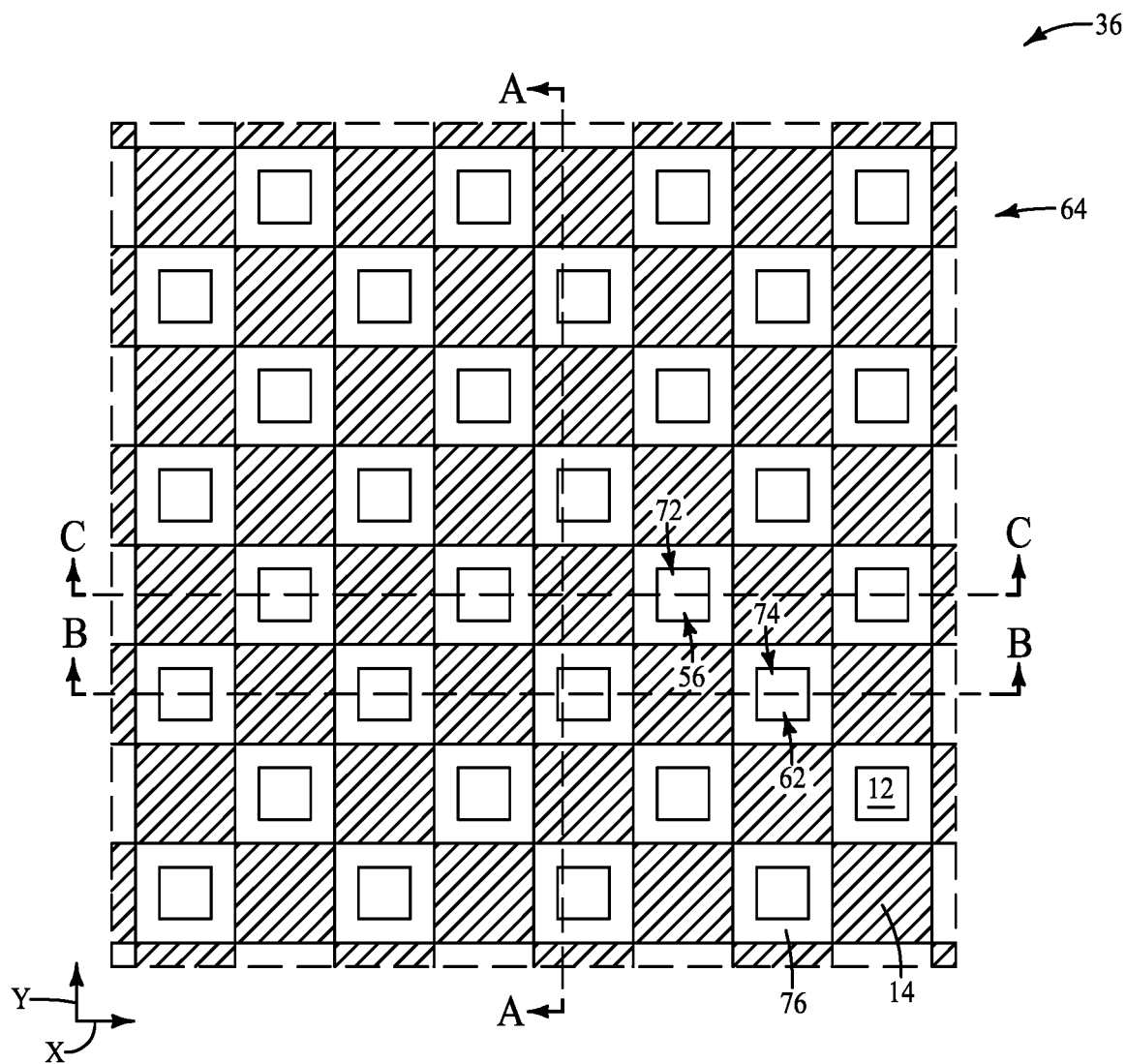
FIGS. 13-13C are diagrammatic views of an example assembly at an example process stage of an example method for forming an example repeating pattern.
Figure 13A:
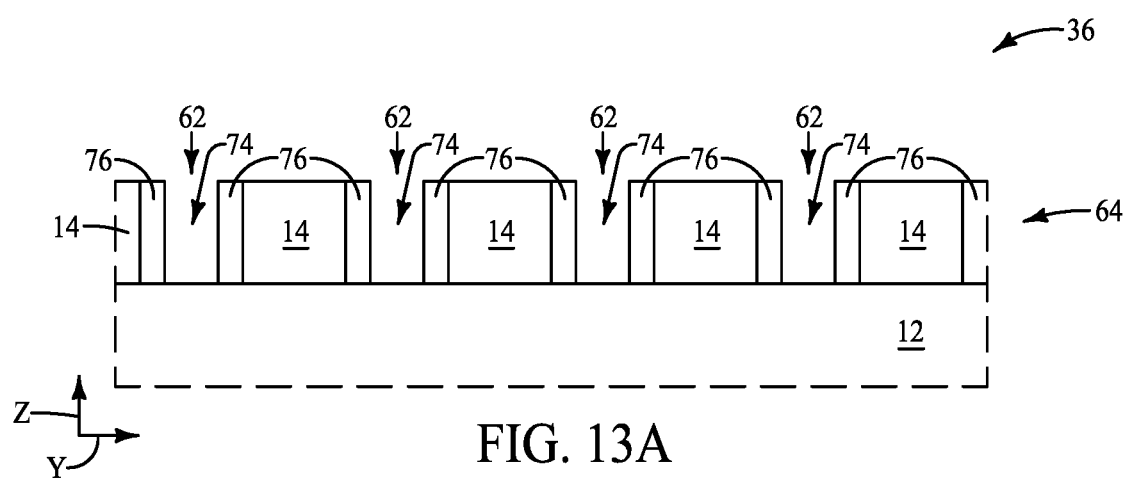
Figure 13B:
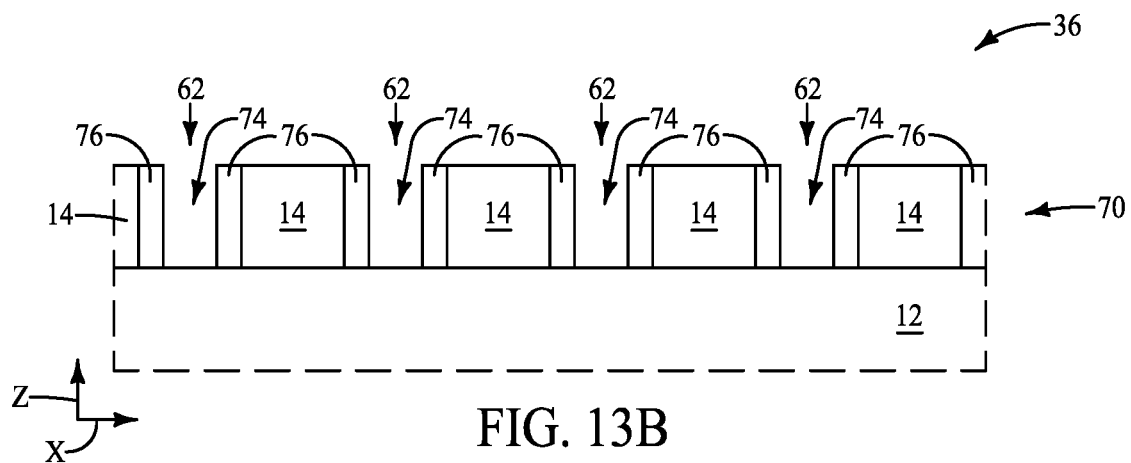
Figure 13C:
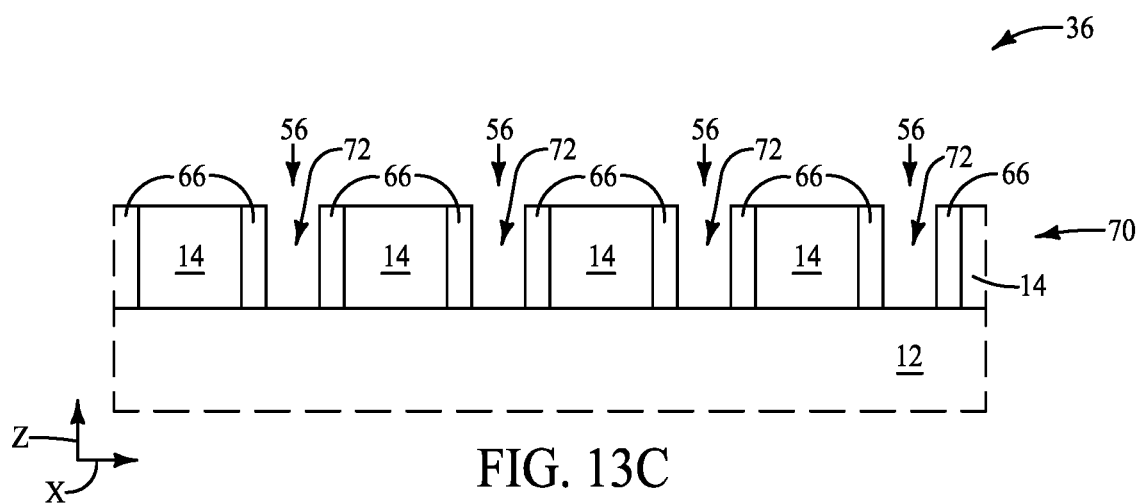

In some embodiments, the openings within the masking material 14 may be narrowed at a processing stage subsequent to that of FIGS. 8-8C by forming spacers within the openings 56 and 62. For instance, FIGS. 13-13C show a configuration at a processing stage following that of FIGS. 8-8C, and after spacers 76 are provided within the openings 56 and 62 to narrow such openings. The spacers 76 may comprise any suitable composition(s); and in some embodiments may comprise, consist essentially of, or consist of silicon nitride or silicon oxide. The spacers 76 may be formed by depositing spacer material over material 14 and within the openings 56 and 62, and then anisotropically etching the spacer material.

The embodiment of FIGS. 13-13C simultaneously forms spacers within the first and second openings 56 and 62. In some embodiments, the narrowed openings 56 and 62 at the processing stage of FIGS. 13-13C may be considered to correspond to the third and fourth openings 72 and 74.

The masking material 14 is shown with crosshatching in the top view of FIG. 13 to enable the reader to readily identify the pattern of the openings 56 and 62.

The pattern of FIGS. 13-13C may be transferred into the underlying target material 12 with any suitable processing to form a configuration analogous to that described above with reference to FIGS. 12-12C.

Figure 14:
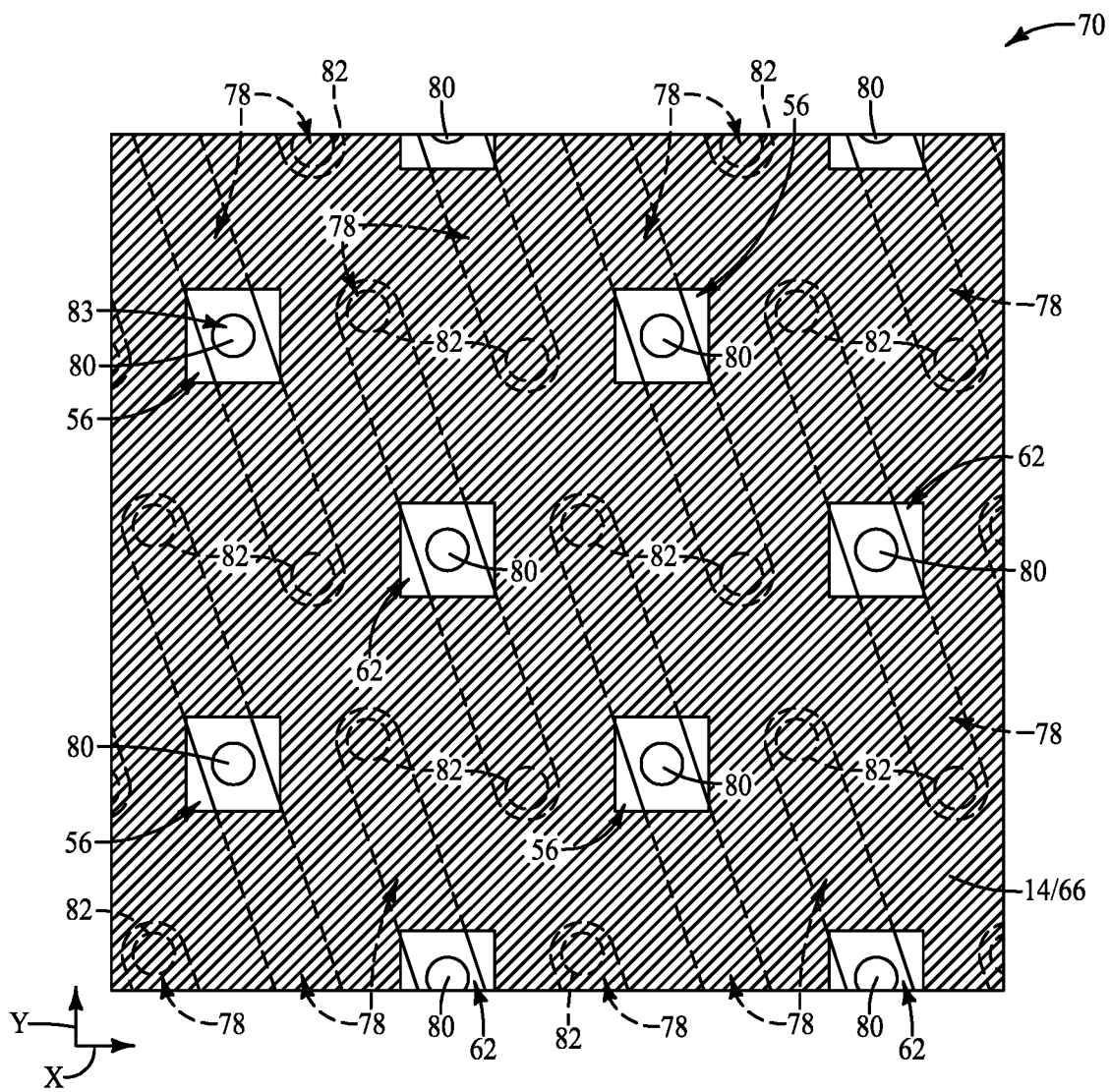
FIG. 14 is a diagrammatic top view of an assembly at an example process stage of an example method for forming an example repeating pattern.

The target material 12 of the embodiments described herein may comprise any suitable configuration. In some embodiments, the target material may comprise active regions of semiconductor material configured for utilization in fabricating memory (e.g., DRAM). FIG. 14 shows a configuration analogous to that of FIG. 11, and in which the underlying target material 12 comprises active regions 78. The active regions are shown in dashed view to indicate that they are beneath the masking structure comprising materials 14/66. The active regions 78 may correspond to pillars of semiconductor material (e.g., monocrystalline silicon), which are spaced from one another by intervening insulative material (e.g., silicon dioxide). Each of the active regions comprises a central location 80 between a pair of terminal locations 82. The terminal locations are capacitor-contact locations (or charge-storage-device-contact locations) which may be ultimately coupled with capacitors (or other suitable charge-storage-devices); and the central regions are bitline-contact locations which may be ultimately coupled with bitlines. Circles are used to diagrammatically illustrate the bitline-contact locations regions 80 and the capacitor-contact locations 82. The circles are to assist the reader in identifying the regions 80 and 82. The actual shape of the contact regions 80 and 82 may be any suitable shape; such as, for example, square, rectangular, elliptical, etc.

The openings 56 and 62 expose the bitline-contact locations 80 while leaving the capacitor-contact locations covered by the masking structure 14/66.

The lines of the L/S patterns 22 and 32 of FIG. 1 may be fabricated utilizing any suitable processing. In some embodiments, the lines of one or both of such patterns may be formed utilizing pitch-multiplication methodology (e.g., pitch-doubling methodology). Pitch-multiplication processes are described in, for example, U.S. Pat. Nos. 8,389, 383 and 8,852,851, and in U.S. patent publication number 2014/0091434, all of which are assigned to Micron Technology, Inc. An example process is described briefly with reference to FIGS. 15A-15F.

Figure 15A:
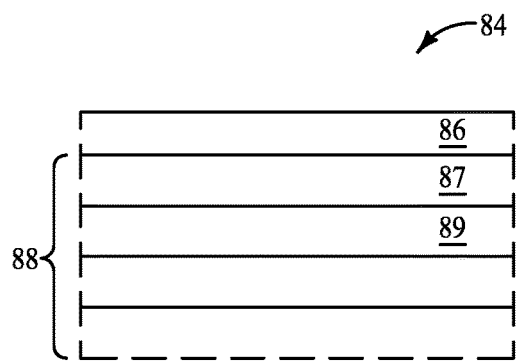
FIGS. 15A-15F are diagrammatic cross-sectional side views of an example assembly at example process stages of an example method for forming an example pattern.

Referring to FIG. 15A, an assembly 84 comprises a layer of photoresist 86 over a stack 88. The stack comprises an upper material 87 beneath the photoresist 86, and comprises another material 89 beneath the material 87.

Figure 15B:
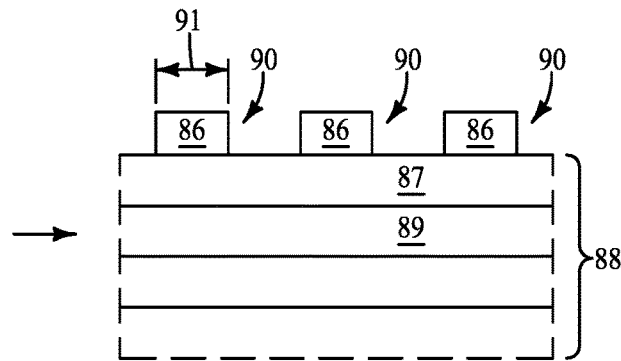

Referring to FIG. 15B, the photoresist is patterned with a lithographic (e.g., photolithographic) process. The lithographic process has a minimum feature size associated therewith, and does not readily form features to dimensions less than the minimum feature size. FIG. 15B shows the patterned photoresist forming features 90 having widths 91. Such widths may correspond to the minimum feature size of the process utilized to form the features 90.

Figure 15C:
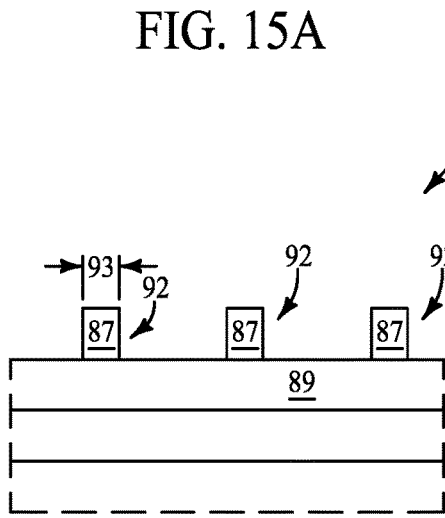

Referring to FIG. 15C, the upper material 87 is patterned into structures 92 utilizing the features 90 of photoresist 86. However, the structures 92 have widths 93 which are less than the widths 91 of the features 90. Such may be accomplished by laterally trimming the features 90 prior to transferring a pattern of the features 90 into the material 87 and/or by laterally trimming the structures 92 after forming the structures 92 from the material 87. Regardless, the structures 92 have widths 93 which are less than the minimum feature size of the lithographic process utilized to pattern the photoresist 86. The photoresist 86 is removed after formation of the structures 92.

Figure 15D:
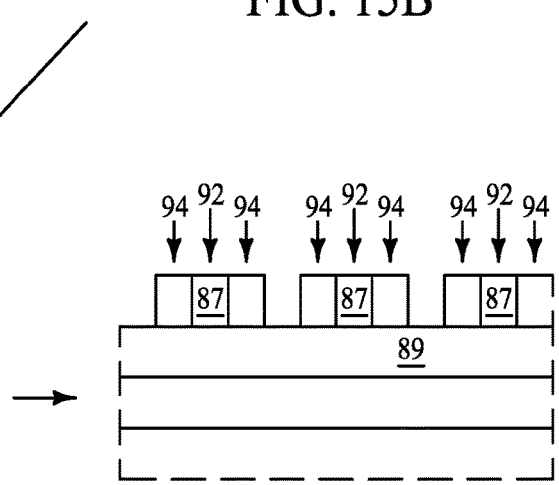
Figure 15E:
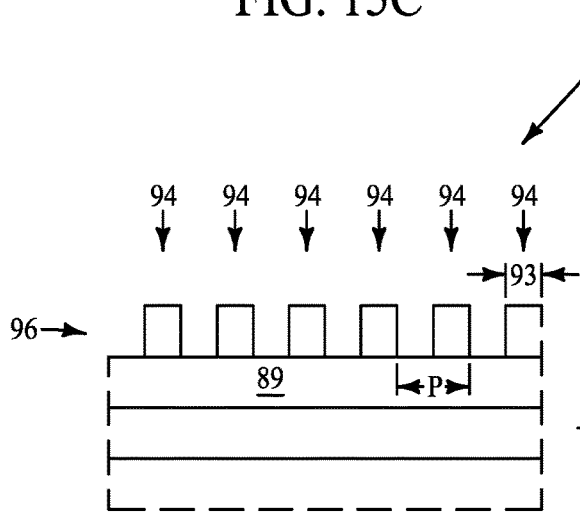

Referring to FIG. 15D, spacers 94 are formed along sidewalls of the structures 92.

Referring to 15E, the material 87 is removed to leave a pattern 96 having the spacers 94 along a pitch P. The spacers 94 have widths approximately the same as the width 93 of the structures 92 (FIG. 15C), and accordingly have widths less than the minimum feature size associated with the lithographic process utilized to form the features 90 (FIG. 15B) from the photoresist 86.

Figure 15F:
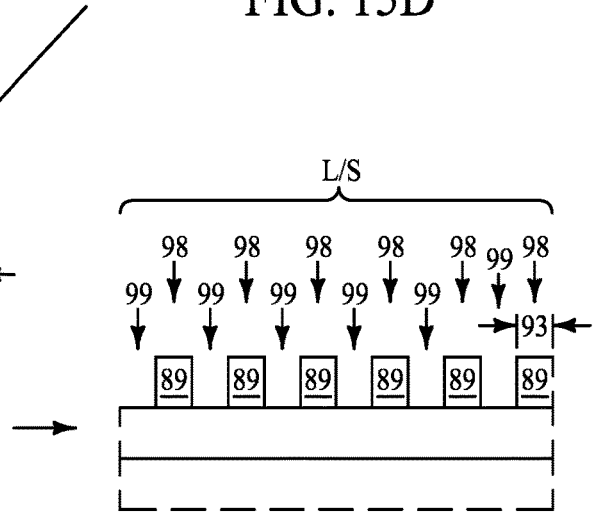

Referring to FIG. 15F, the pattern 96 is transferred into the material 89, and the spacers 94 are removed. In some embodiments, patterned material 89 comprises lines 98 extending in and out of the page relative to the cross-section of FIG. 15F, and comprises spaces 99 between the lines. The lines 98 have widths 93 less than the minimum feature size of the lithographic process utilized during fabrication of such lines (i.e., the lithographic process of FIG. 15B). The lines 98 and spaces 99 together form an L/S pattern. Such L/S pattern may correspond to either of the patterns 22 and 32 of FIG. 1.

In some embodiments, the lines 18 of FIG. 1 may be formed with a first lithographic process having a first minimum feature size associated therewith, and the lines 28 of FIG. 1 may be formed with a second lithographic process having a second minimum feature size associated therewith. Each of the first lines 18 has the first width $W_1$, and each of the second lines 28 has the second width $W_2$. In some embodiments, the first width $W_1$ may be less than the first minimum feature size and/or the second width $W_2$ may be less than the second minimum feature size.

Another example embodiment method for forming a pattern is described with reference to FIGS. 16-20.

Figure 16:
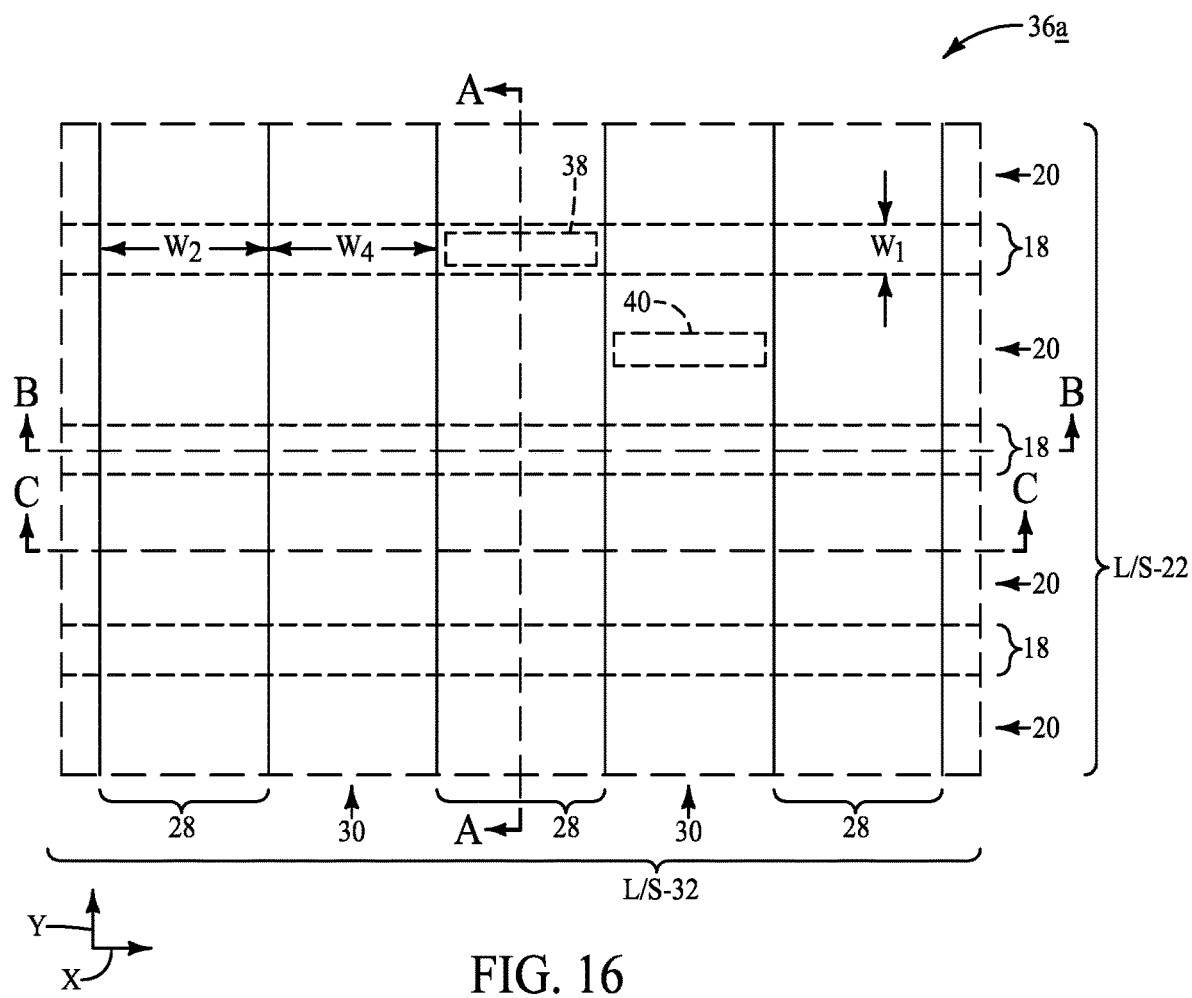
FIGS. 16-20 are diagrammatic top views of an example assembly at example process stages of an example method for forming an example repeating pattern.
Figure 16A:
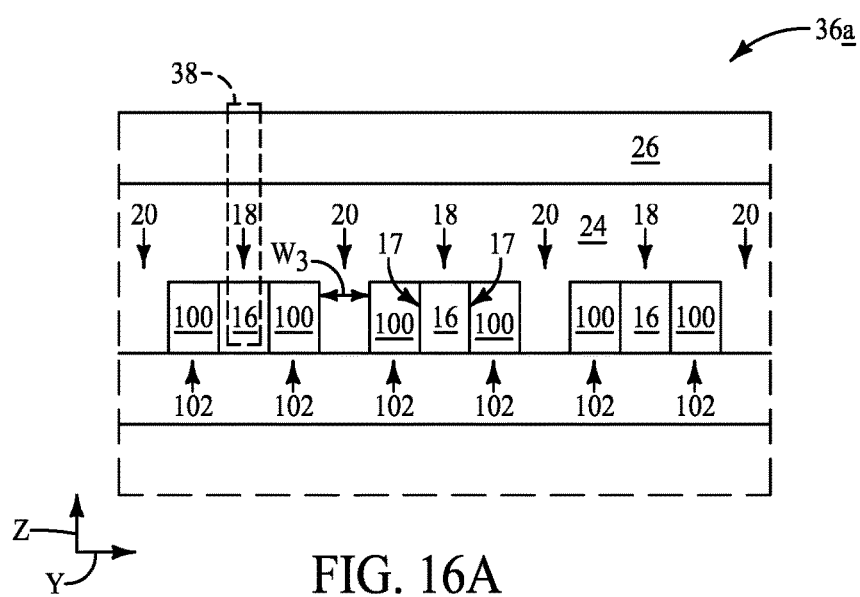
Figure 16B:
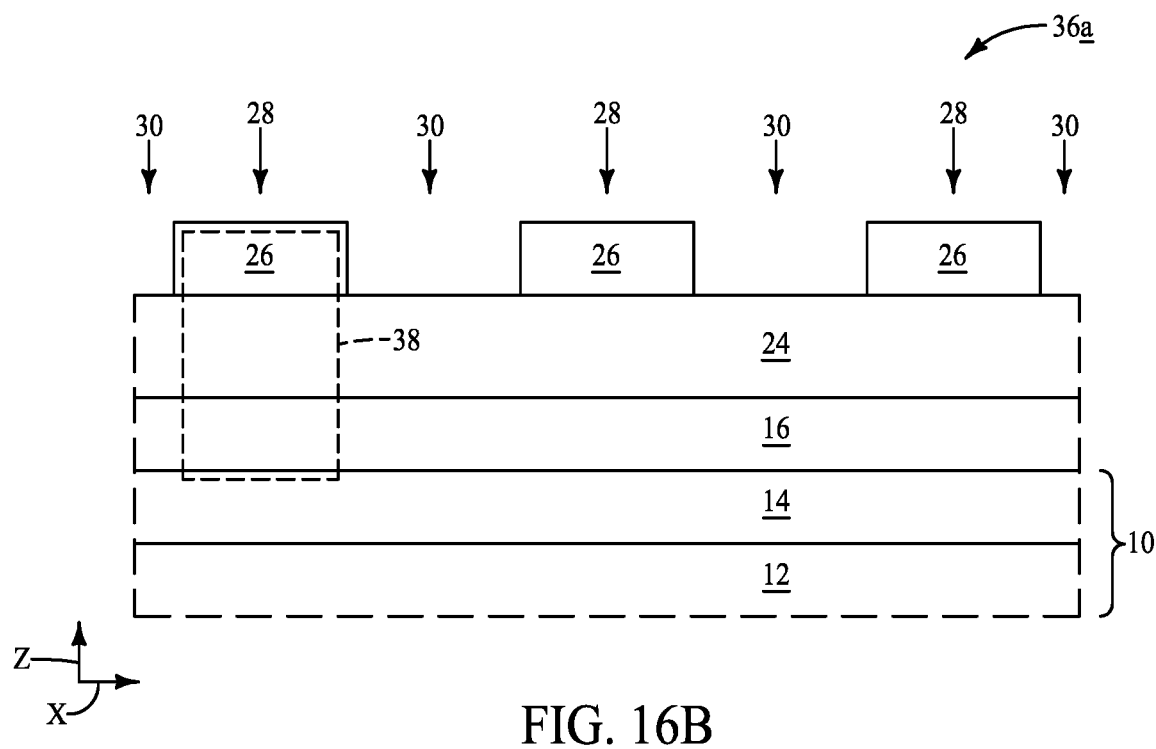
Figure 16C:
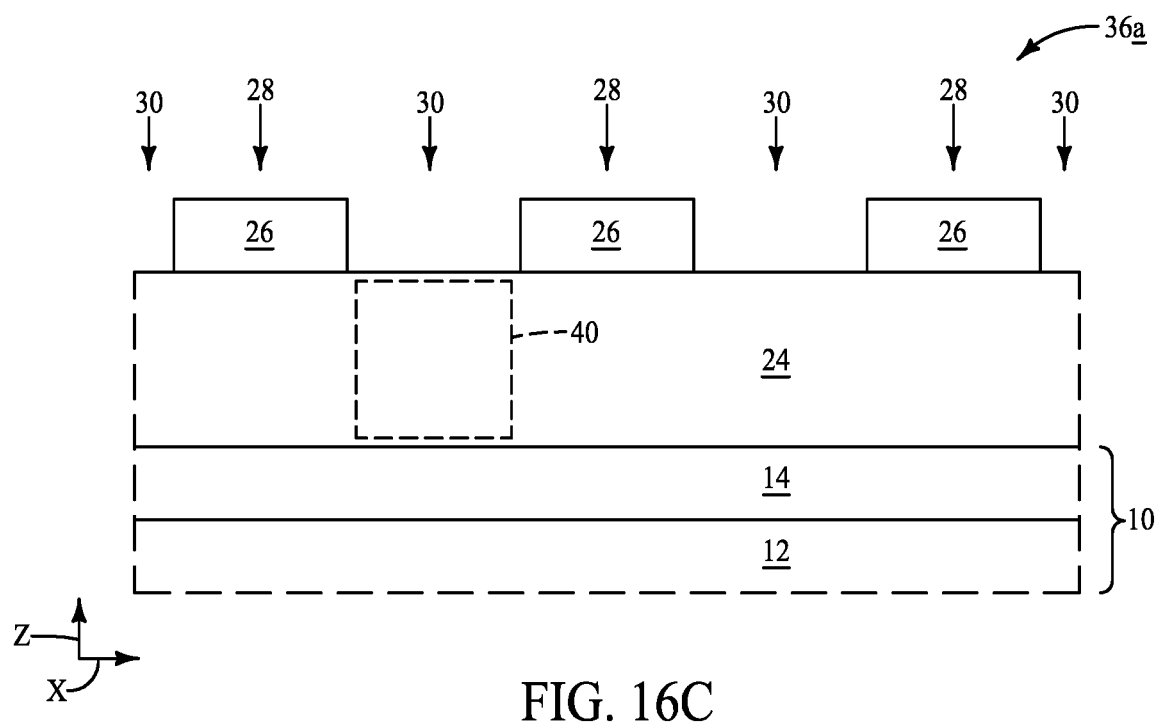

Referring to FIGS. 16-16C, a construction 36a is shown at process stage similar to that of FIGS. 1-1C. The construction 36a differs from the construction 36 of FIGS. 1-1C in that the first lines 18 are shown to be laterally flanked by spacers 102 comprising spacer material 100. In some embodiments, the spacers 102 may be considered to be sidewall spacers along sides (or side-surfaces) 17 of the lines 18 of the first L/S pattern 22, and to reduce the dimensions of spaces 20 of the first L/S pattern.

The spacer material 100 may comprise any suitable composition(s), and in some embodiments may comprise, consist essentially of, or consist of silicon dioxide.

The first spaces 20 of construction 36a each have a width $W_3$ (shown in FIG. 16A) which is less than the width $W_4$ (shown in FIG. 16) of each of the second spaces 30 (i.e., the first spaces 20 and second spaces 30 have different widths relative to one another). In the illustrated embodiment, each of the first lines 18a has a width $W_1$ which is different than the width $W_2$ of each of the second lines 28 (and which is smaller than the width $W_2$ in the shown embodiment).

Figure 17:
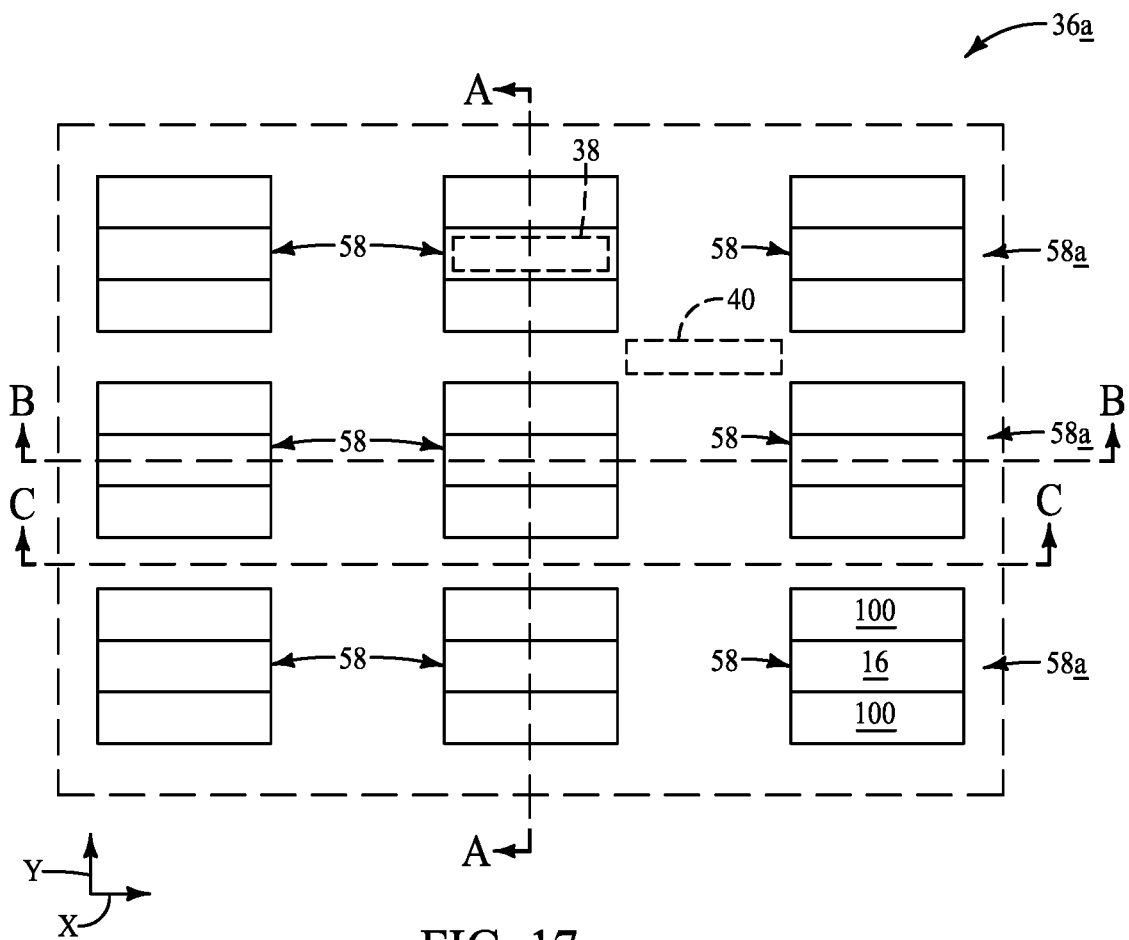
Figure 17A:
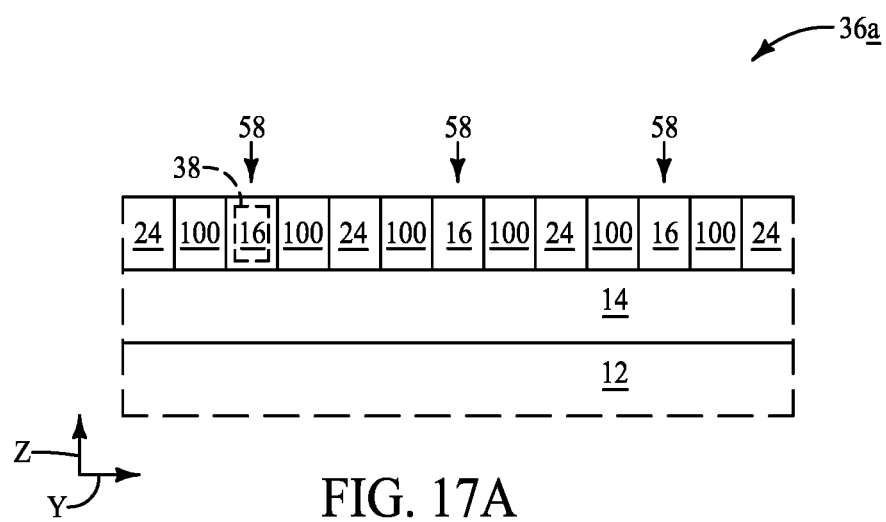
Figure 17B:
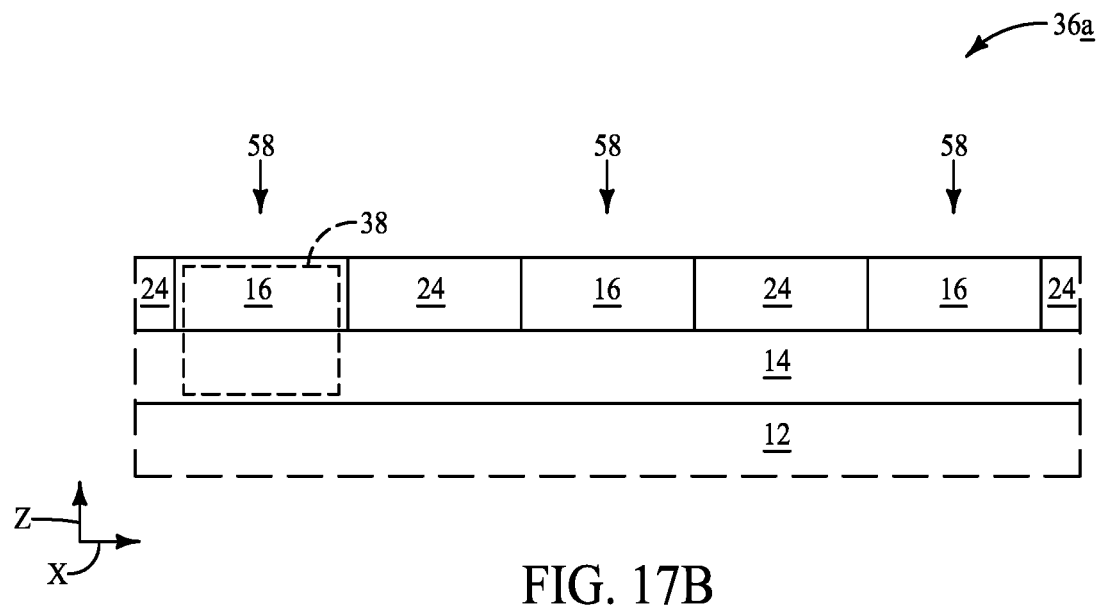
Figure 17C:
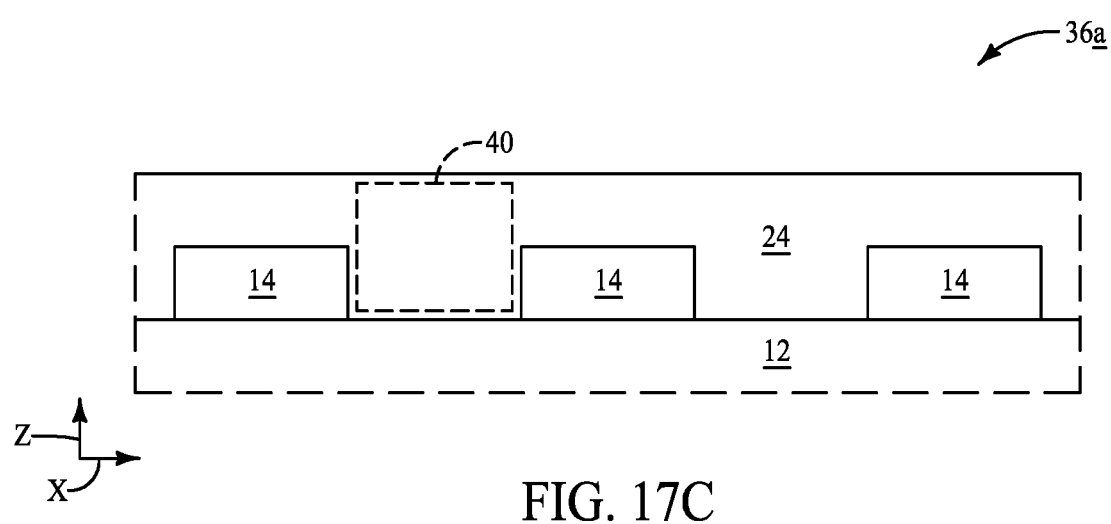

Referring to FIGS. 17-17C, the construction 36a is shown at a processing stage analogous to that described above with reference to FIGS. 6-6C. The lines 18 (FIGS. 16-16C) have been patterned into the pillars 58.

Figure 18:
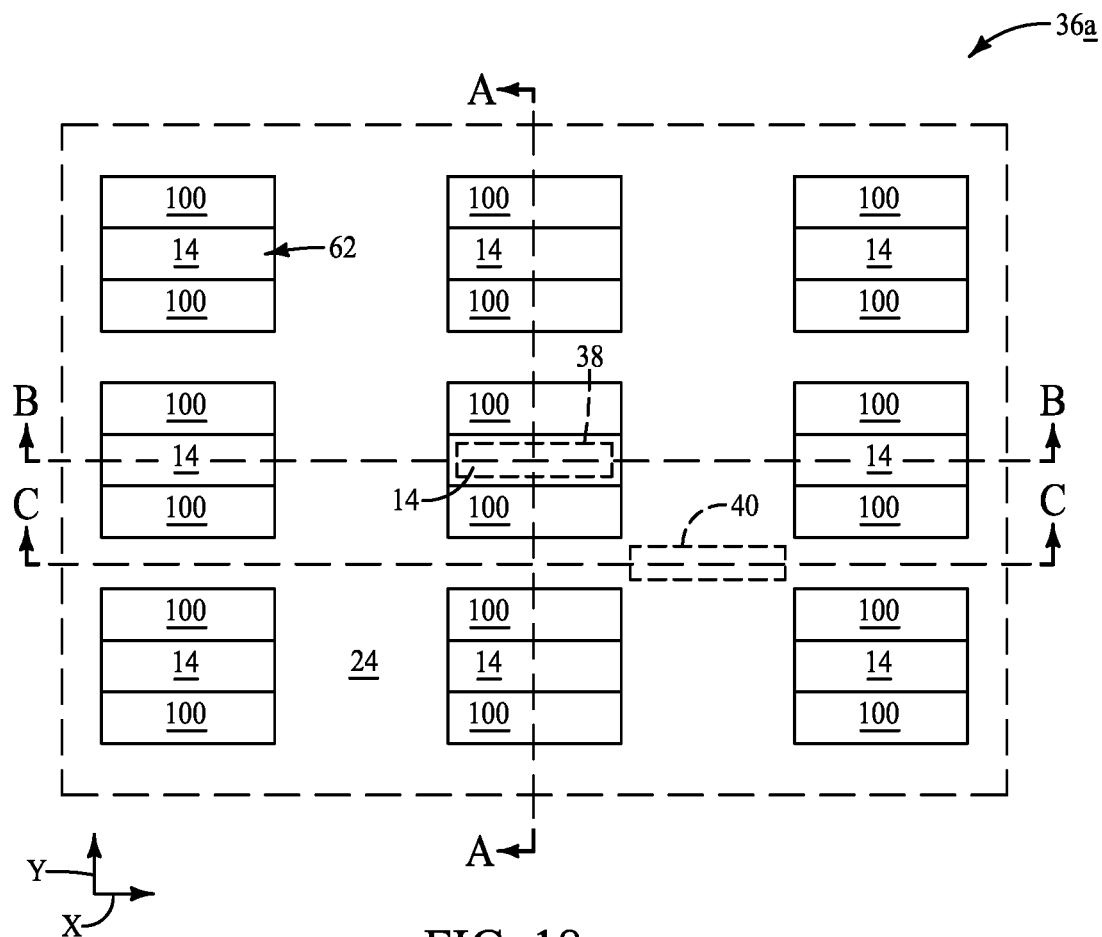
Figure 18A:
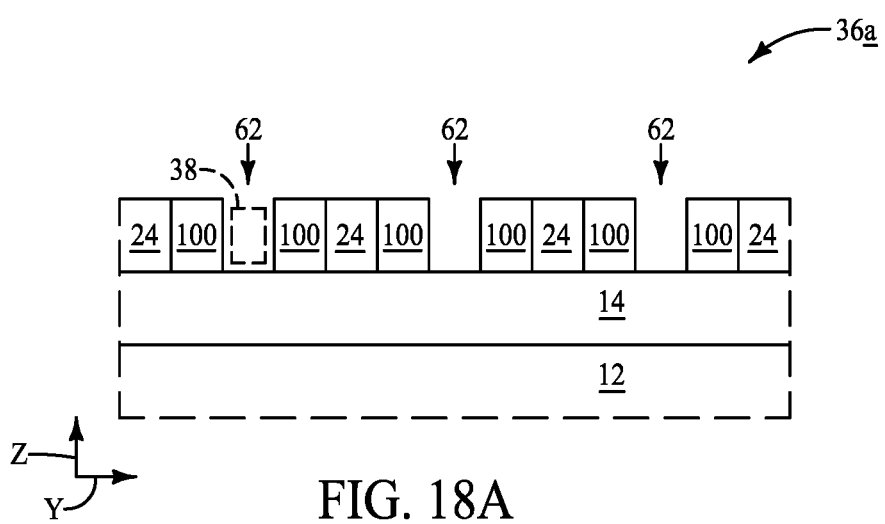
Figure 18B:
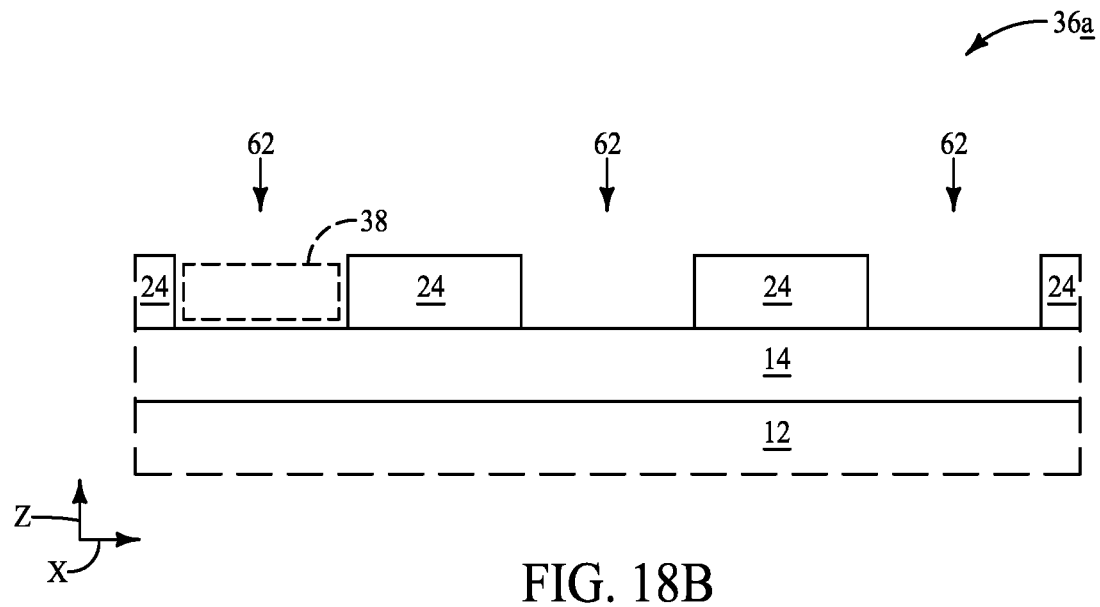
Figure 18C:
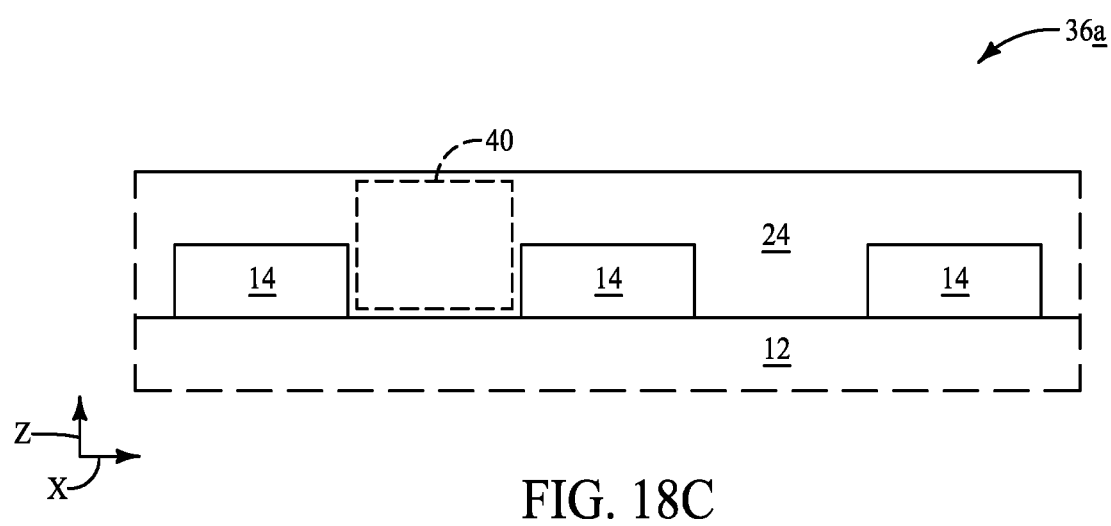

Referring to FIGS. 18-18C, the construction 36a is shown at a processing stage analogous to that described above with reference to FIGS. 7-7C. The pillars 58 are removed to leave the second holes (openings) 62.

Figure 19:
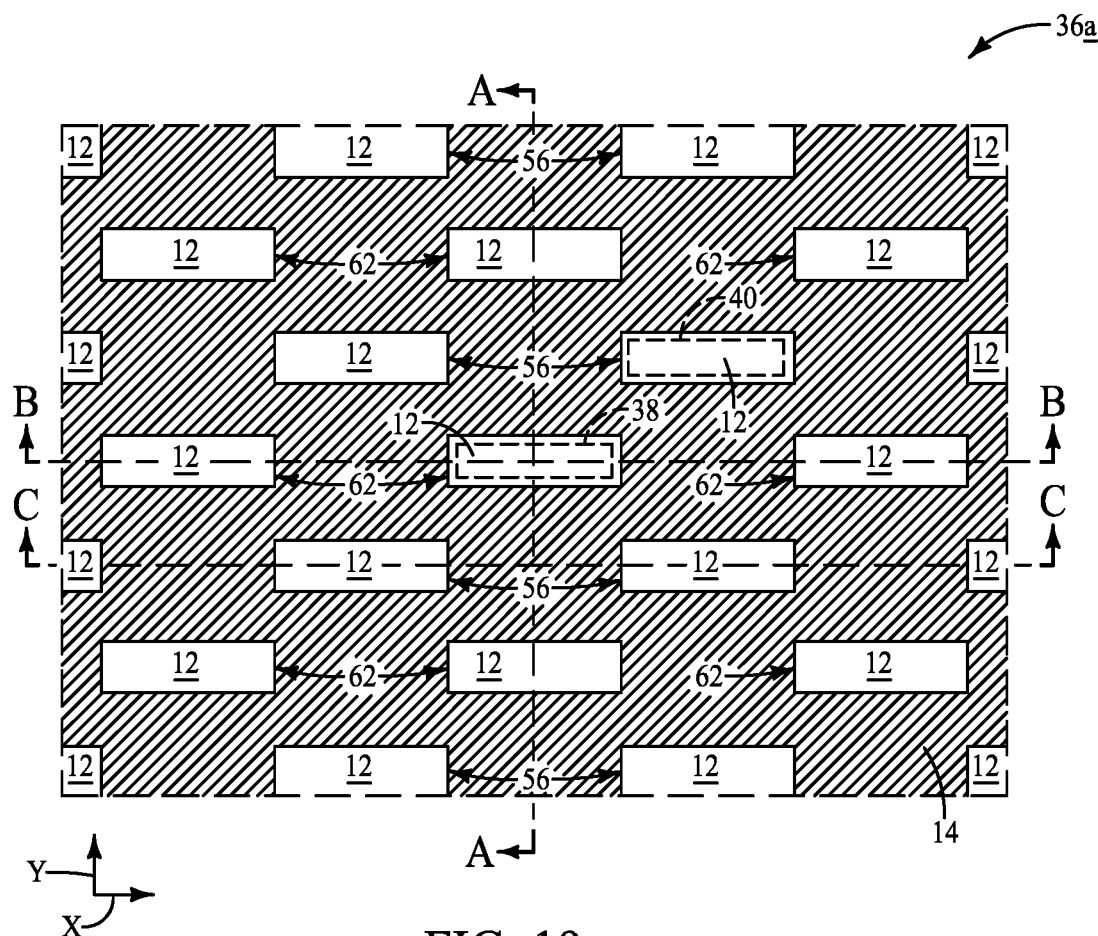
Figure 19A:
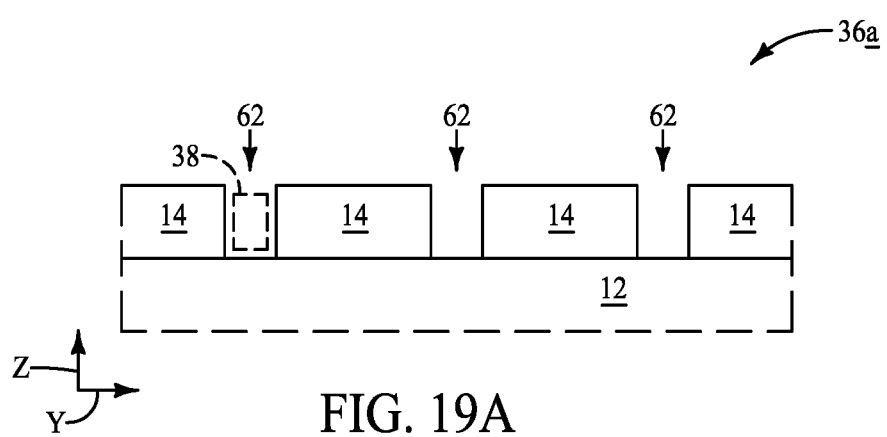
Figure 19B:
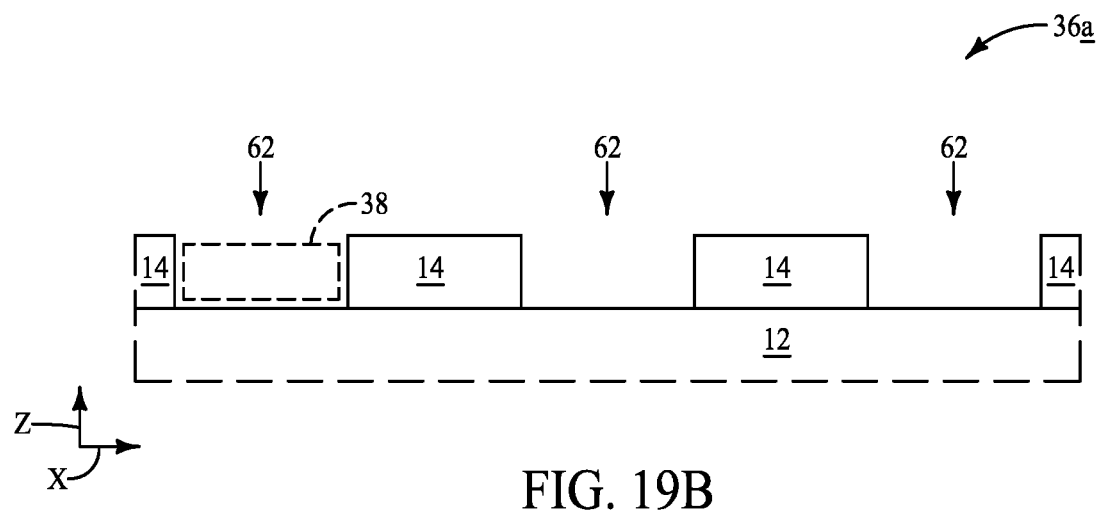
Figure 19C:
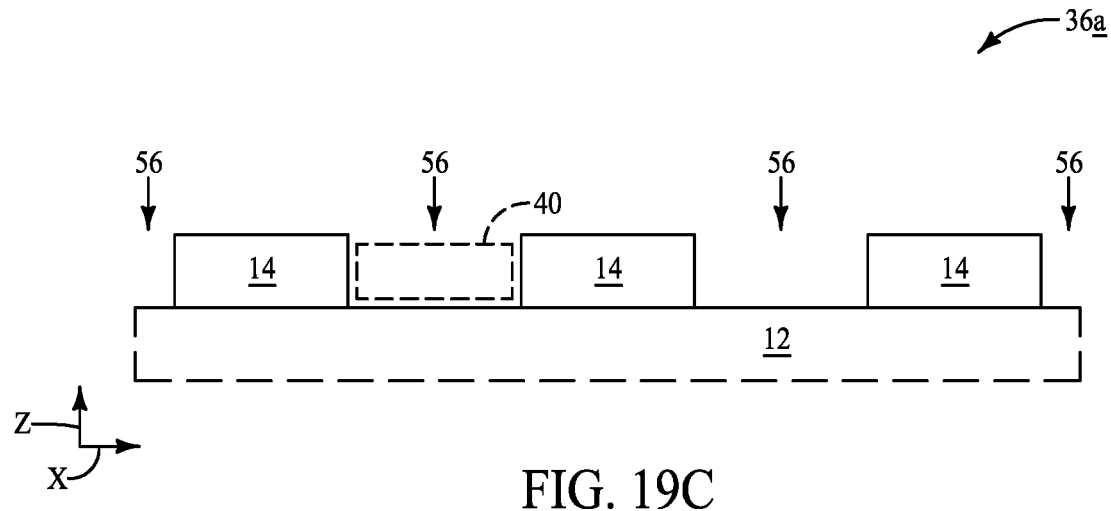

Referring to FIGS. 19-19C, the construction 36a is shown at a processing stage analogous to that described above with reference to FIGS. 8-8C. The second holes (openings) 62 are extended into the masking material 14; and the mold material 24 and spacer material 100 are removed. The masking material 14 is shown with crosshatching in the top view of FIG. 19 to assist the reader in identifying the openings 56 and 62. Notably, the openings 56 and 62 are rectangular in the embodiment of FIGS. 19-19C, rather than being square as in the embodiment of FIGS. 8-8C. The rectangular openings of FIGS. 19-19C may be particularly suited for some applications in integrated circuit fabrication. For instance, such rectangular openings may be useful for formation of redistribution interconnections associated with electrical connection to the capacitor-contact locations 82 described above with reference to FIG. 14. In the shown embodiment, the rectangular-shaped holes 56 and 62 are elongated along the first direction corresponding to the illustrated x-axis.

Figure 20:
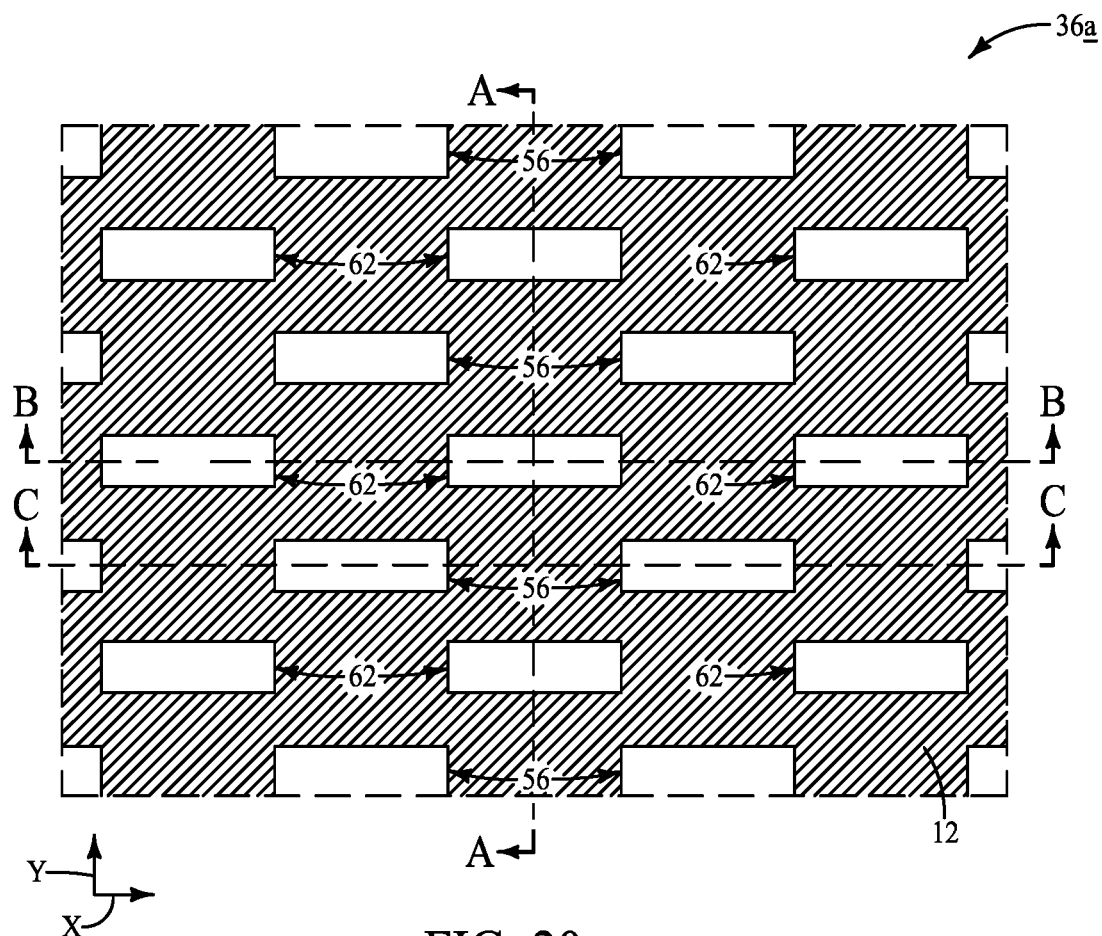
Figure 20A:
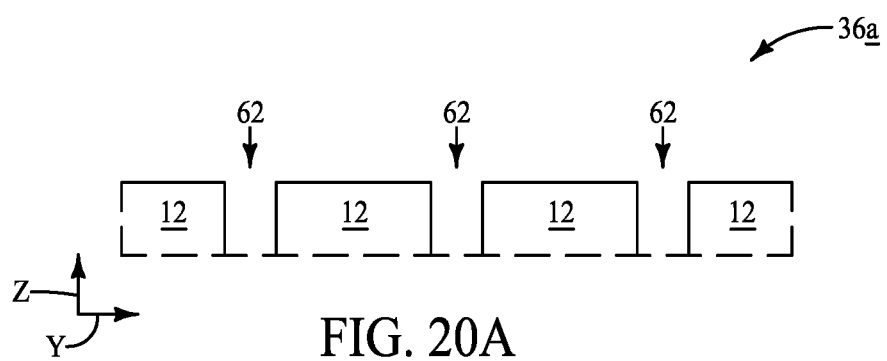
Figure 20B:
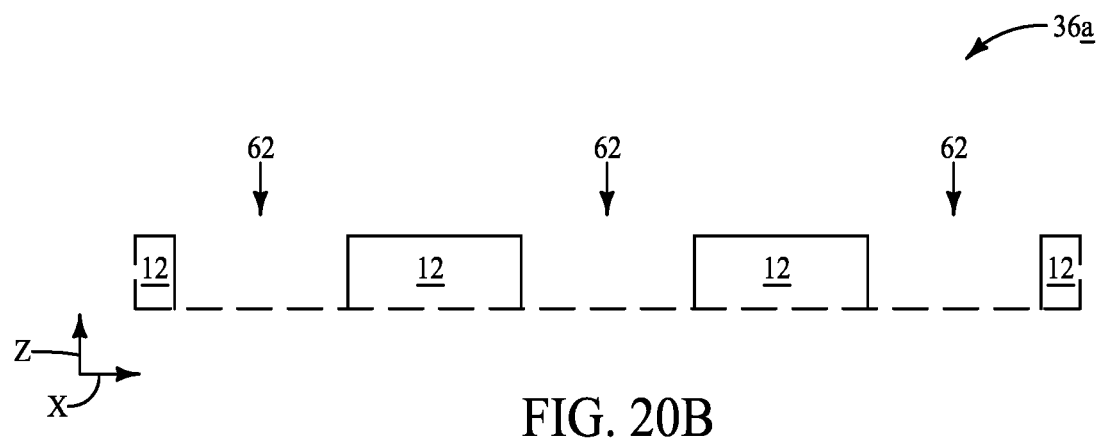
Figure 20C:
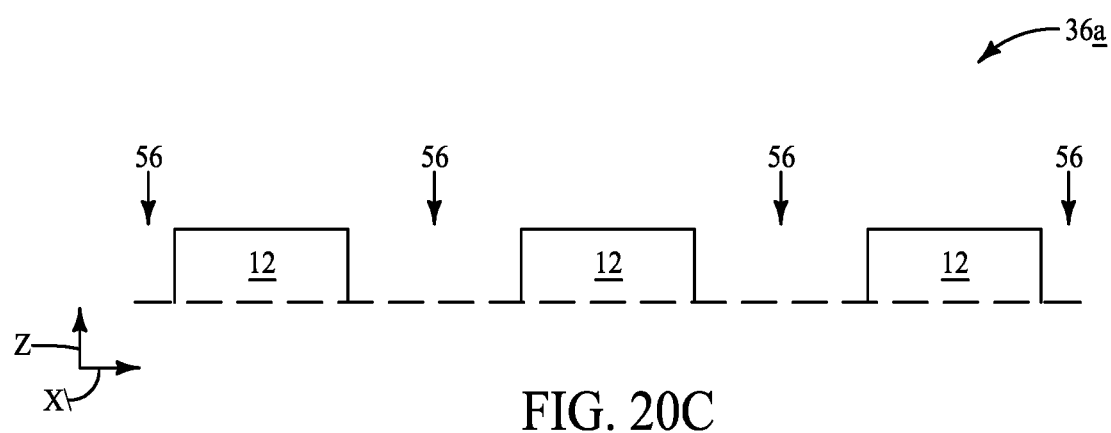

Referring to FIGS. 20-20C, the construction 36a is shown at a processing stage analogous to that described above with reference to FIGS. 9-9C. The openings 56 and 62 are extended into the target material 12, and the masking material 14 is removed. The target material 12 is shown with crosshatching in the top view of FIG. 20 to assist the reader in identifying the holes 56 and 62.

Another example embodiment method for forming a pattern is described with reference to FIGS. 21-26.

Figure 21:
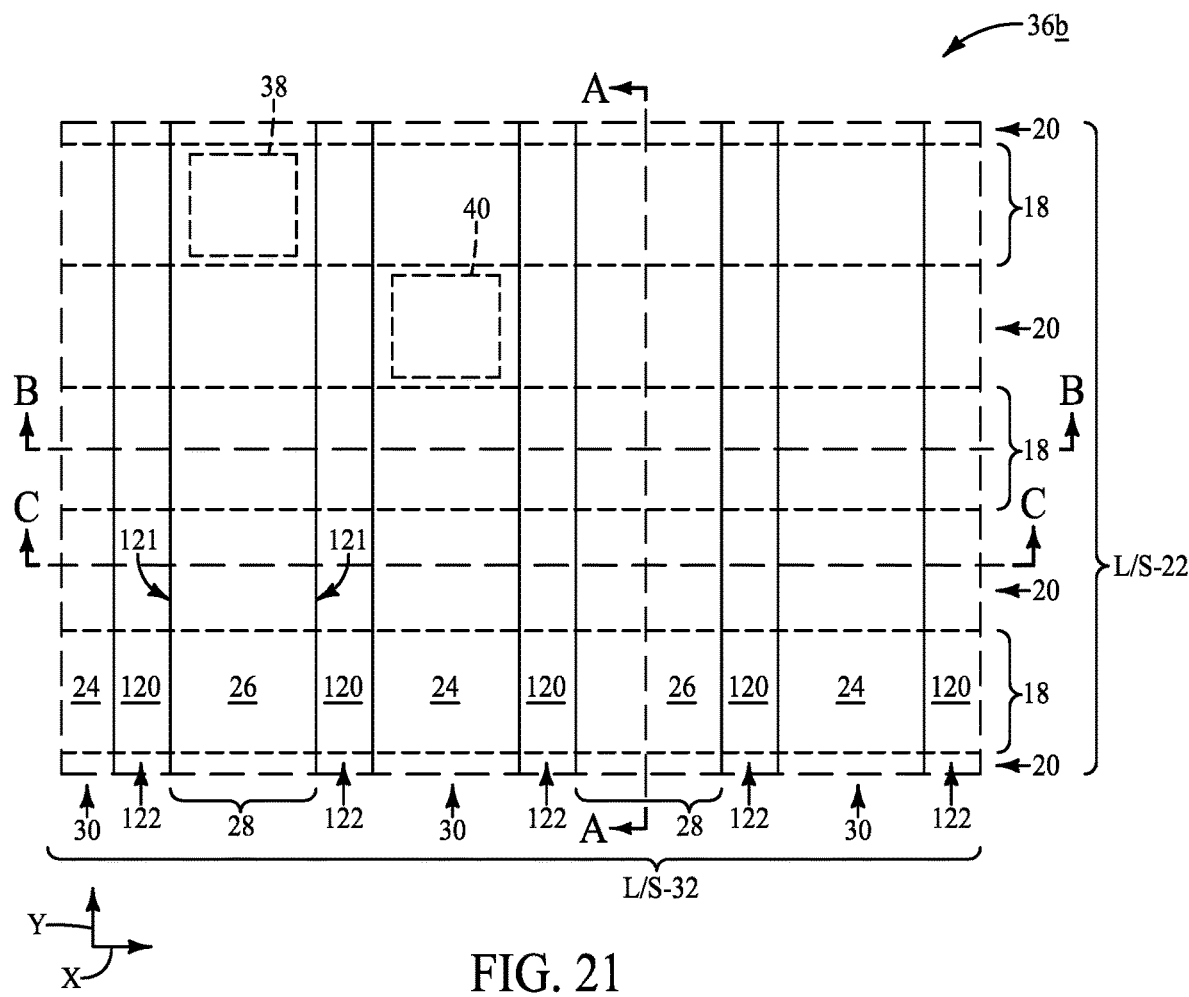
FIG. 21 is a diagrammatic top view of an example assembly at an example process stage of an example method for forming an example repeating pattern.
Figure 21A:
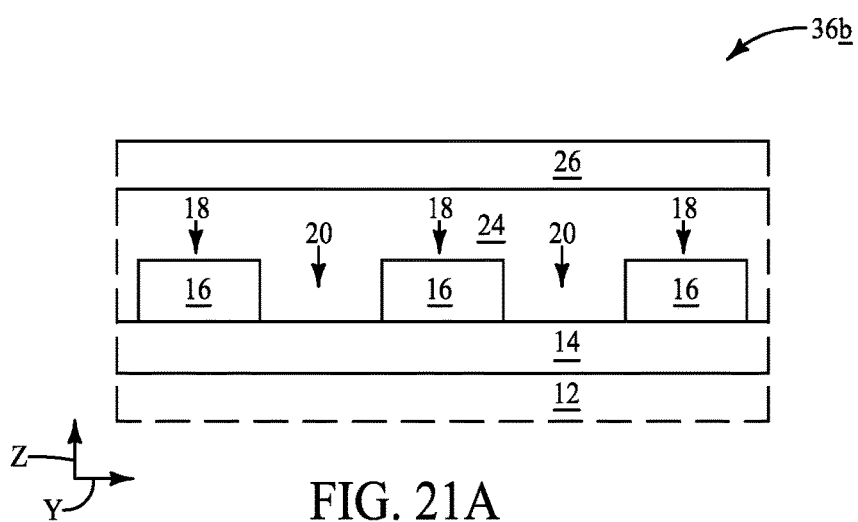
FIG. 21A is a diagrammatic cross-sectional side view along the line A-A of FIG. 21.
Figure 21B:
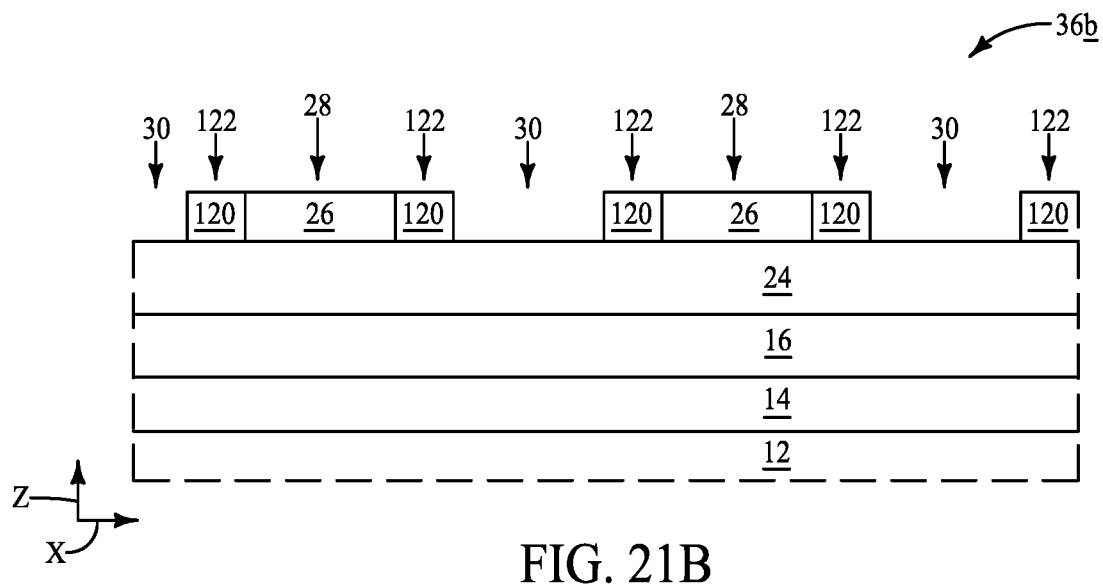
FIG. 21B is a diagrammatic cross-sectional side view along the line B-B of FIG. 21.
Figure 21C:
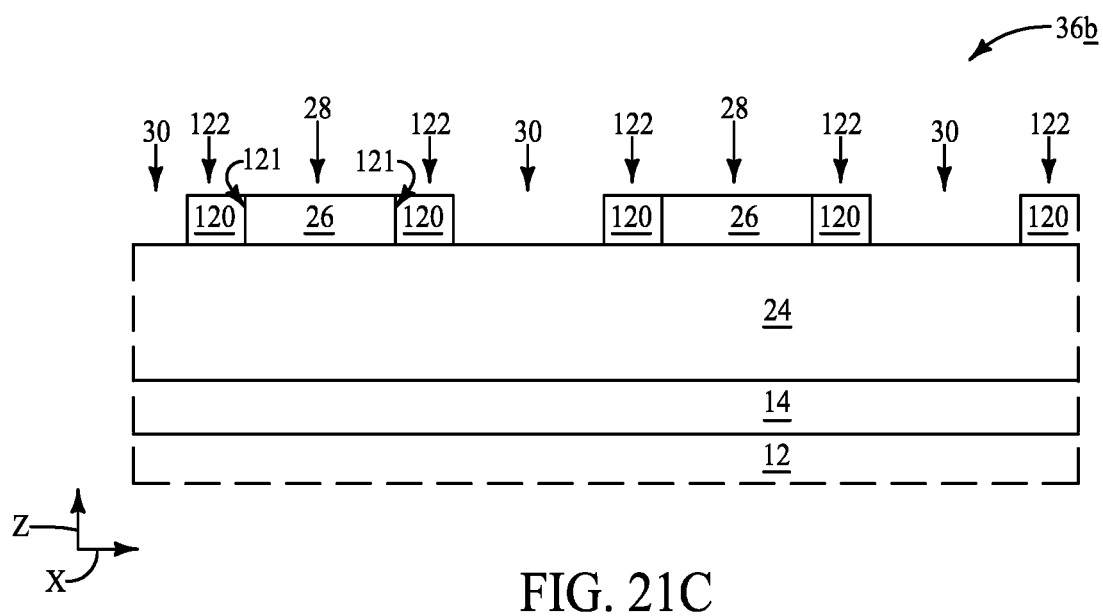
FIG. 21C is a diagrammatic cross-sectional side view along the line C-C of FIG. 21.
Figures 1, 21B:
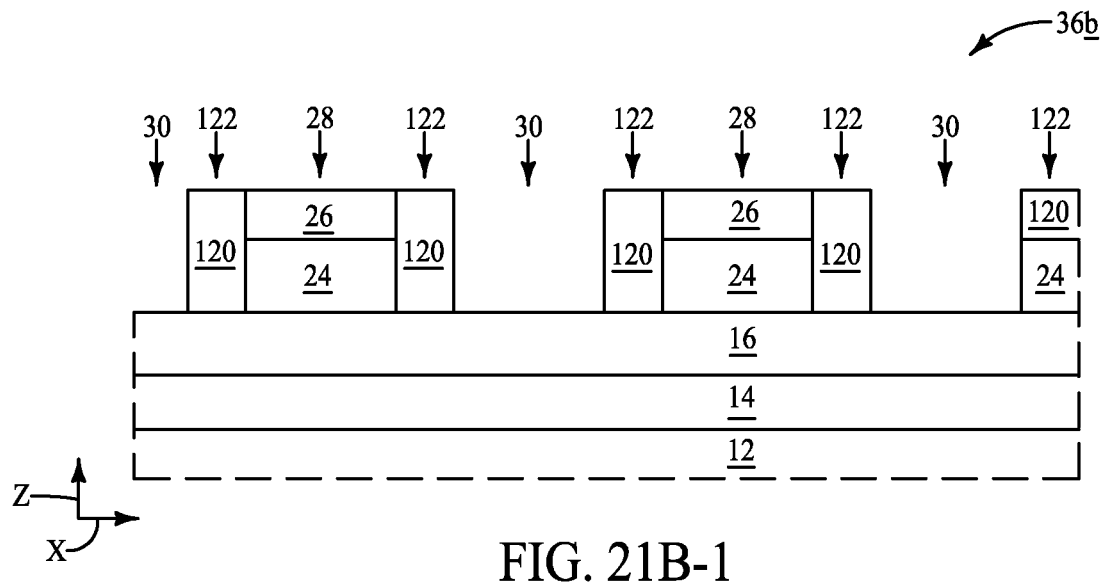
Figures 1, 21C:
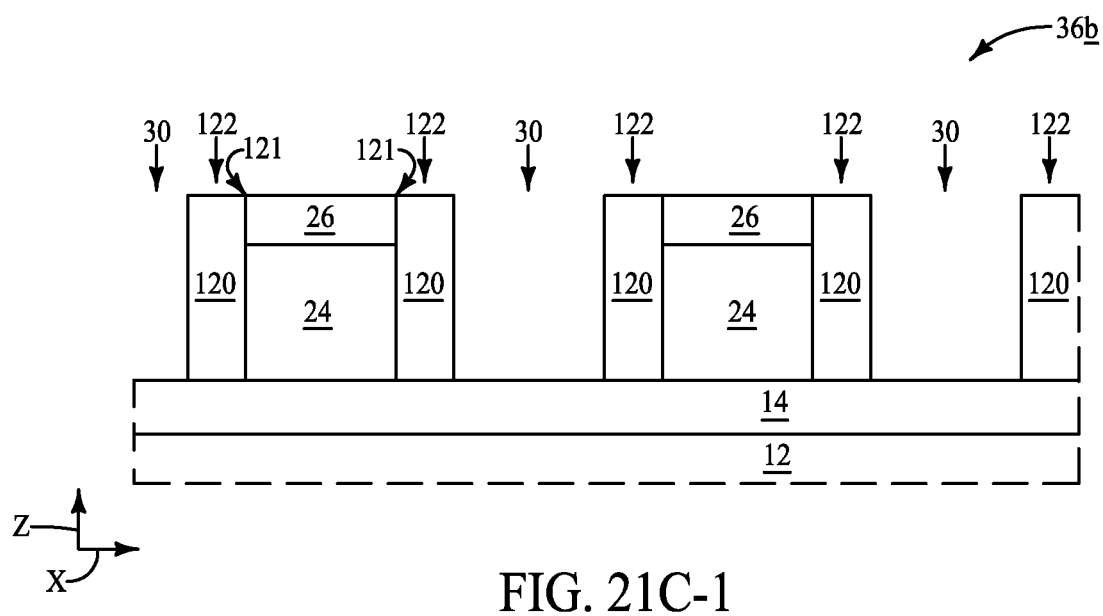

Referring to FIGS. 21-21C, a construction 36b is shown at process stage similar to that of FIGS. 1-1C. The construction 36b differs from the construction 36 of FIGS. 1-1C in that the second lines 28 are shown to be laterally flanked by spacers 122 comprising spacer material 120. In some embodiments, the spacers 122 may be considered to be sidewall spacers along sides (or side-surfaces) 121 of the lines 28 of the second L/S pattern 32, and to reduce the dimensions of the spaces 30 of the second L/S pattern. It is noted that the dimensions of the spaces 30 of the second L/S pattern can also be reduced, as shown in FIGS. 21B-1 and 21C-1, by patterning the second-line-material 26 and the mold material 24 together and then forming spacer material 120 through depositing and etching-back.

The spacer material 120 may comprise any suitable composition(s), and in some embodiments may comprise, consist essentially of, or consist of silicon dioxide.

Figure 22:
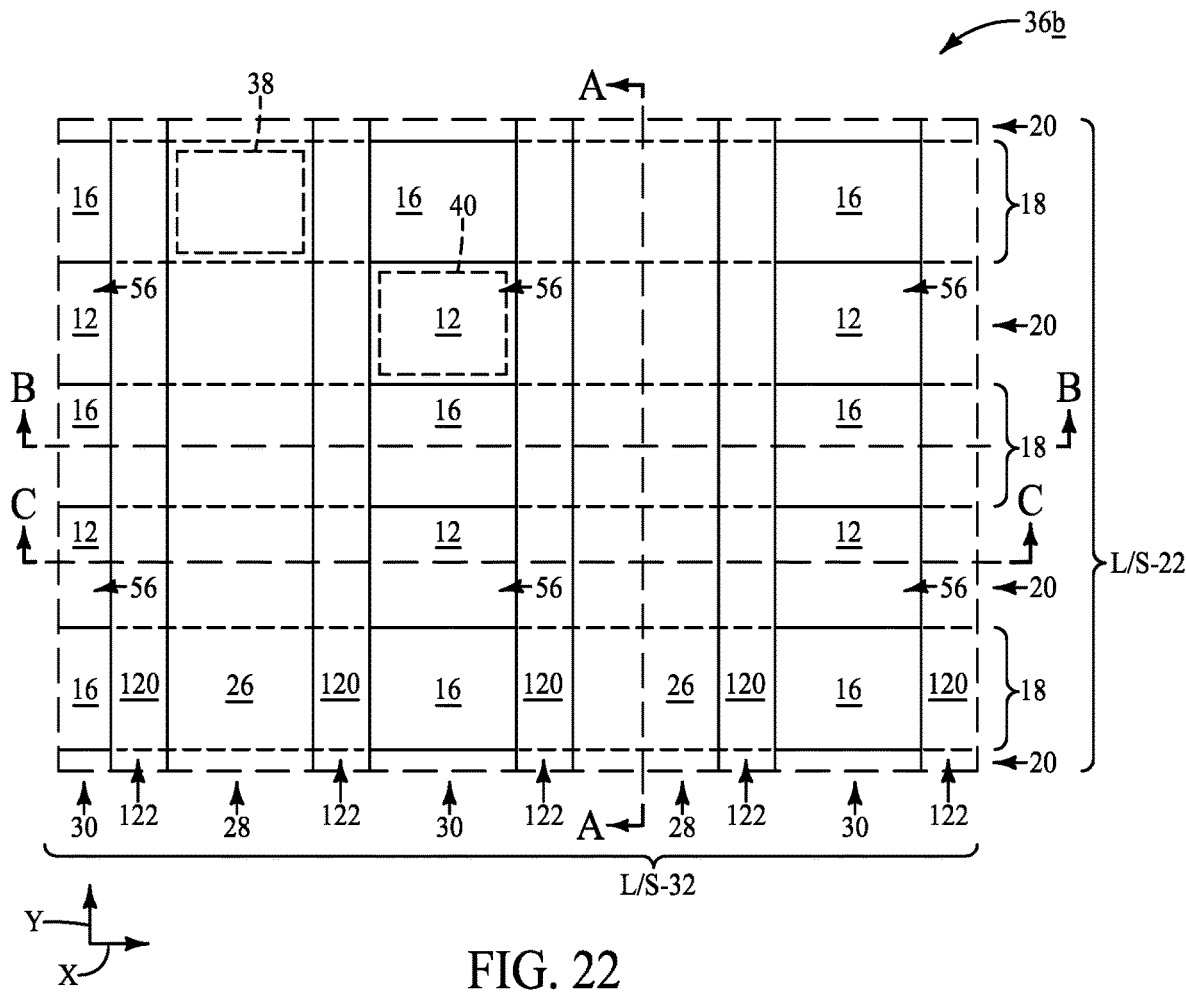
FIG. 22 is a diagrammatic top view of an example assembly at an example process stage which may follow the process stage of FIG. 21 in an example method for forming an example repeating pattern.
Figure 22A:
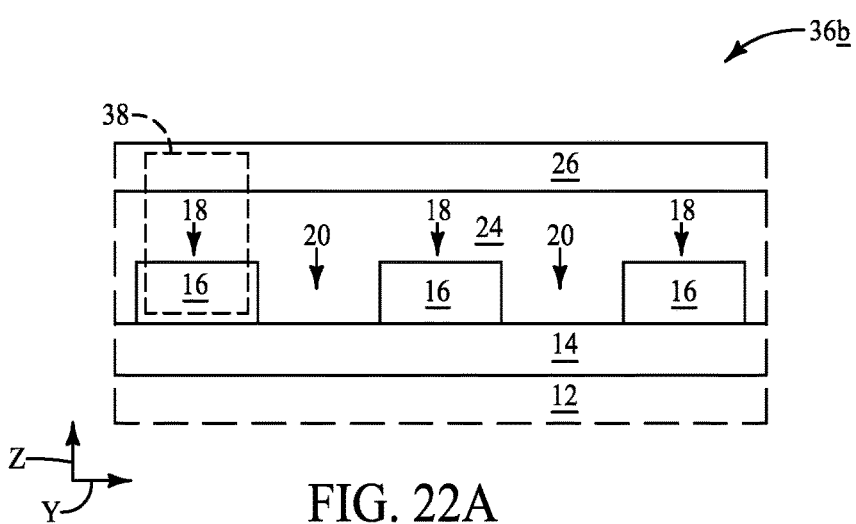
FIG. 22A is a diagrammatic cross-sectional side view along the line A-A of FIG. 22.
Figure 22B:
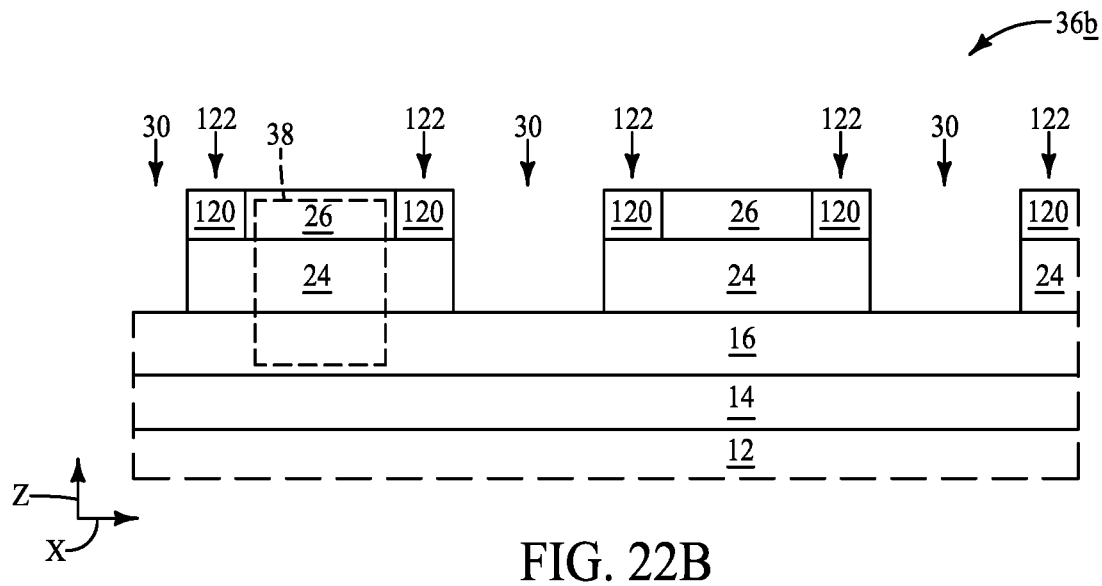
FIG. 22B is a diagrammatic cross-sectional side view along the line B-B of FIG. 22.
Figure 22C:
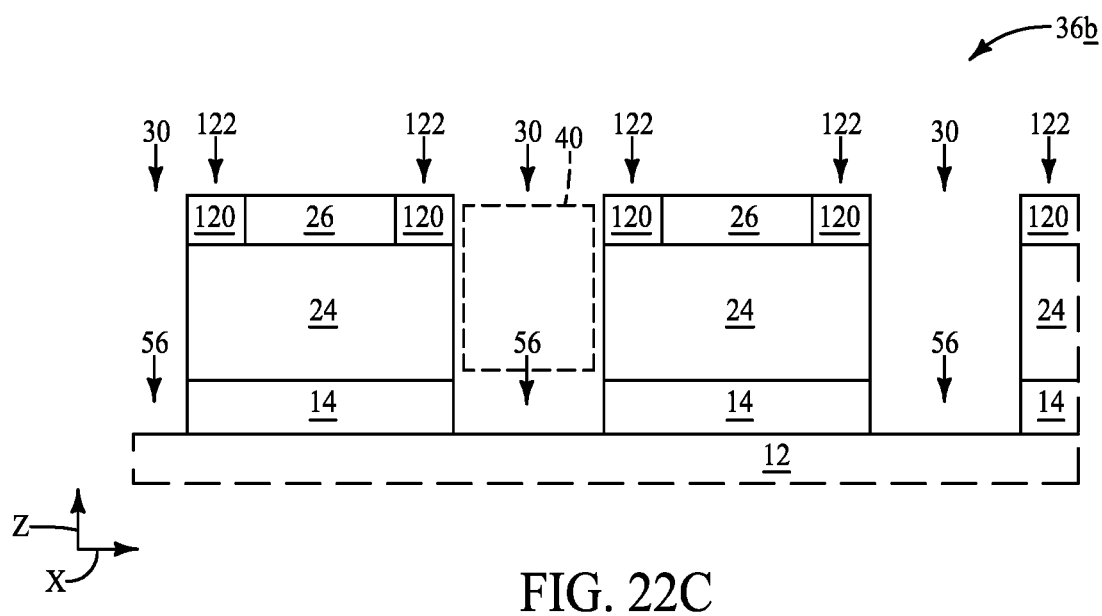
FIG. 22C is a diagrammatic cross-sectional side view along the line C-C of FIG. 22.
Figures 1, 22B:
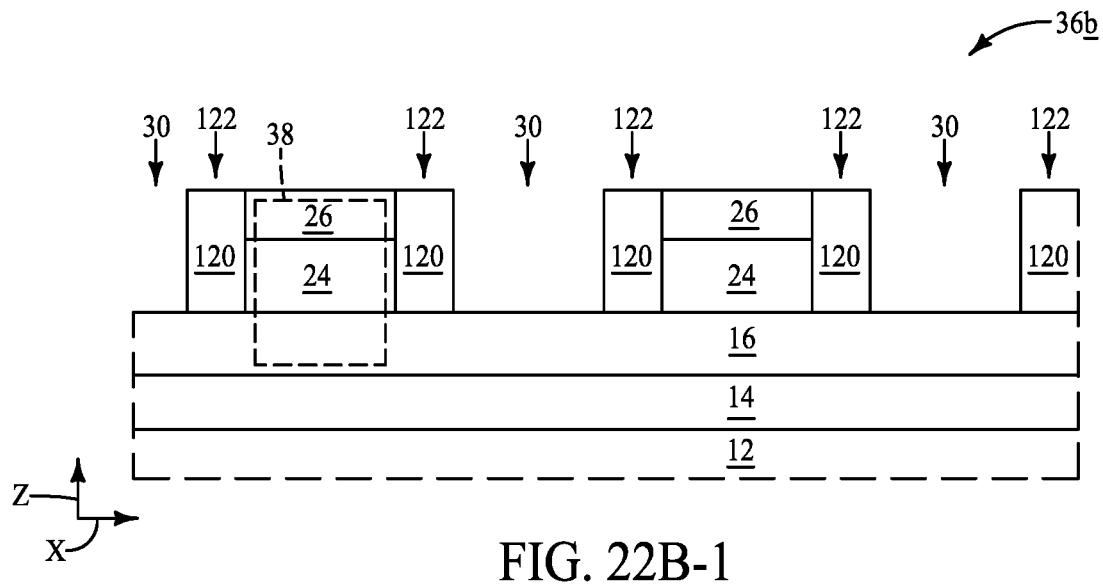
Figures 1, 22C:
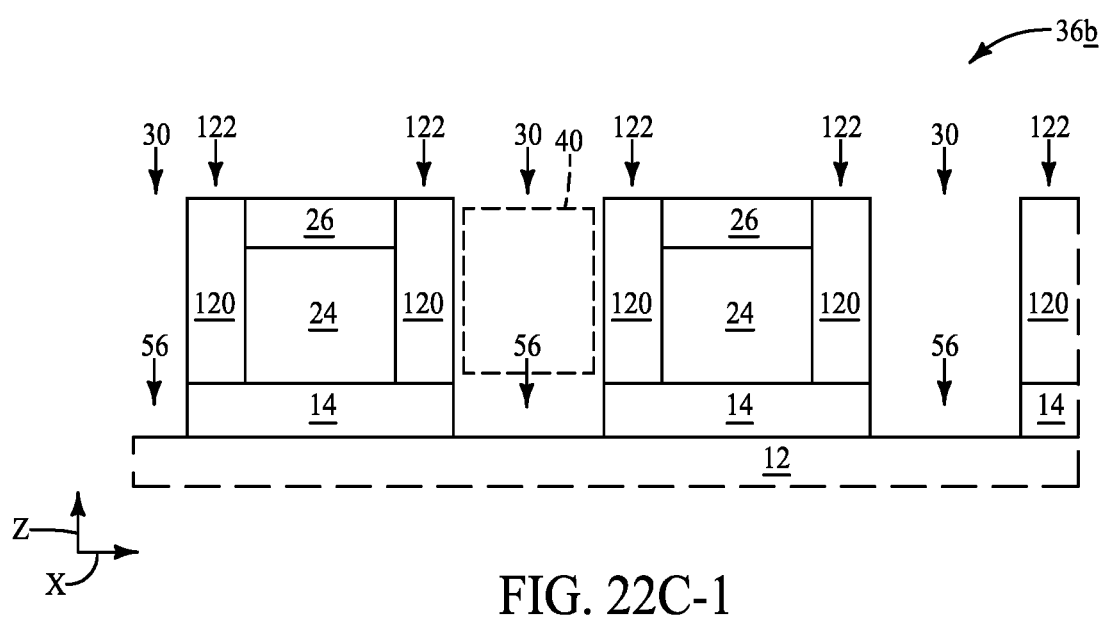

Referring to FIGS. 22-22C, the construction 36b is shown at a processing stage analogous to that described above with reference to FIGS. 3-3C. The materials 14 and 24 are patterned with the lines 26 and the flanking spacers 122, and such forms the first openings 56 within the masking material 14. In case of the construction 36B of FIGS. 21B-1 and 21C-1, only the material 24 is patterned to form the first openings 56 within the masking material 14; as shown in FIGS. 22B-1 and 22C-1.

Figure 23:
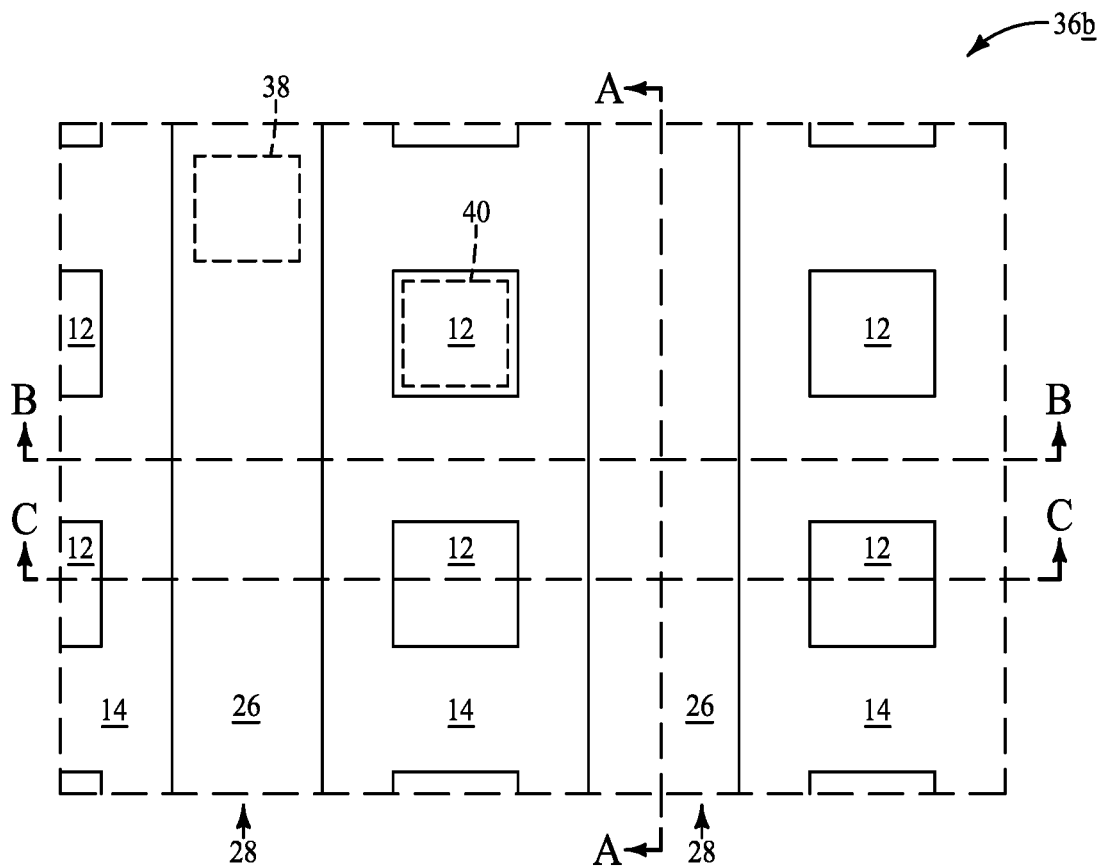
FIGS. 23-26 are diagrammatic top views of an example assembly at example process stages of an example method for forming an example repeating pattern; with the process stage of FIG. 23 following that of FIG. 22 in some example embodiments.
Figure 23A:
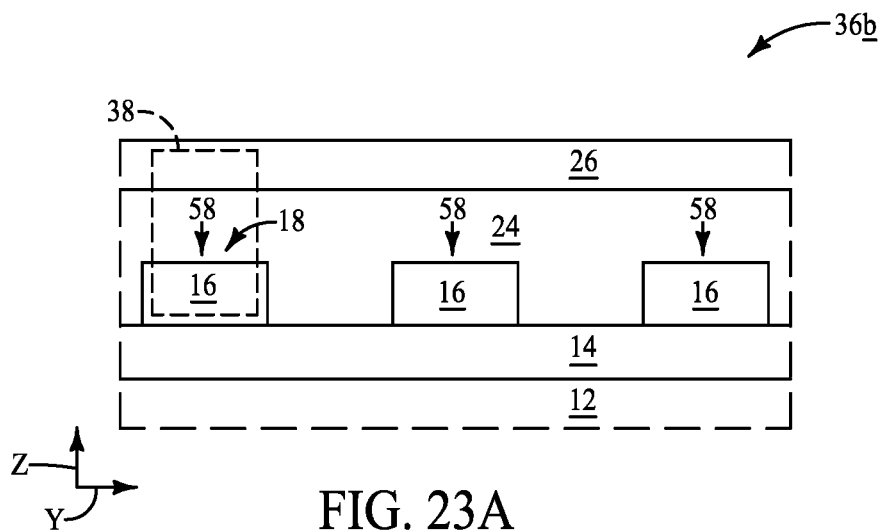
Figure 23B:
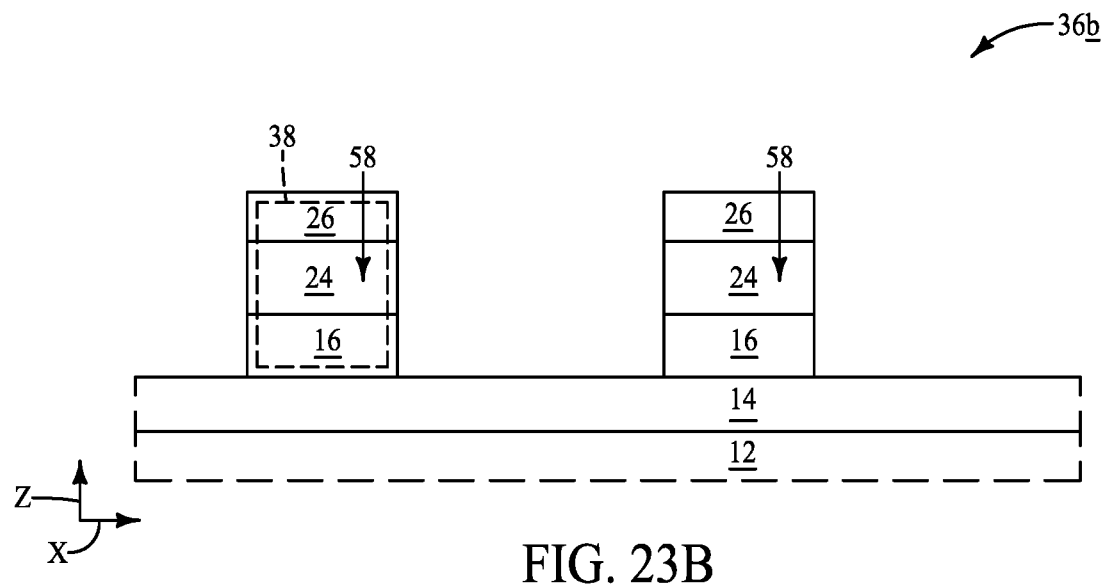
Figure 23C:
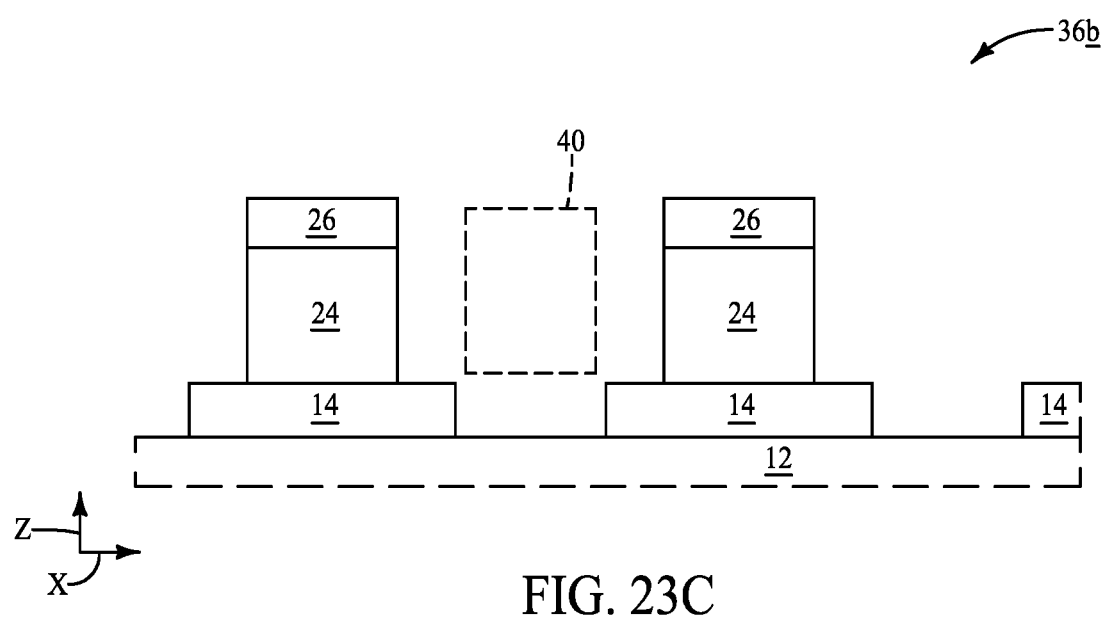

Referring to FIGS. 23-23C the construction 36b is shown at a processing stage analogous to that described above with reference to FIGS. 4-4C. The spacers 122 (FIGS. 22-22C) are removed, and the conductive lines 18 (FIGS. 21-21C) are sliced into the pedestals 58.

Figure 24:
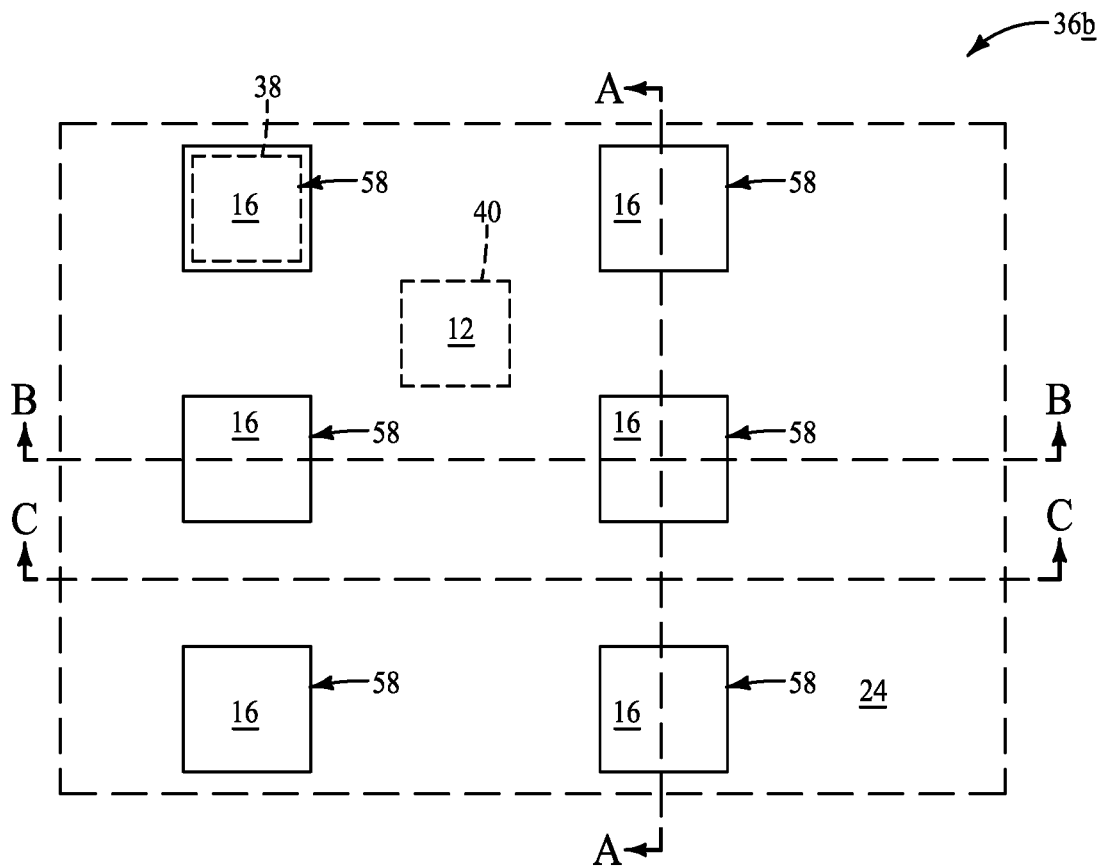
Figure 24A:
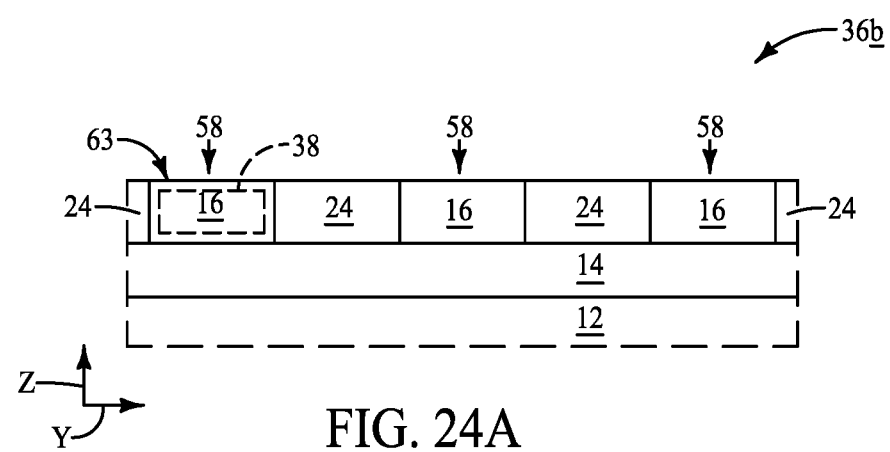
Figure 24B:
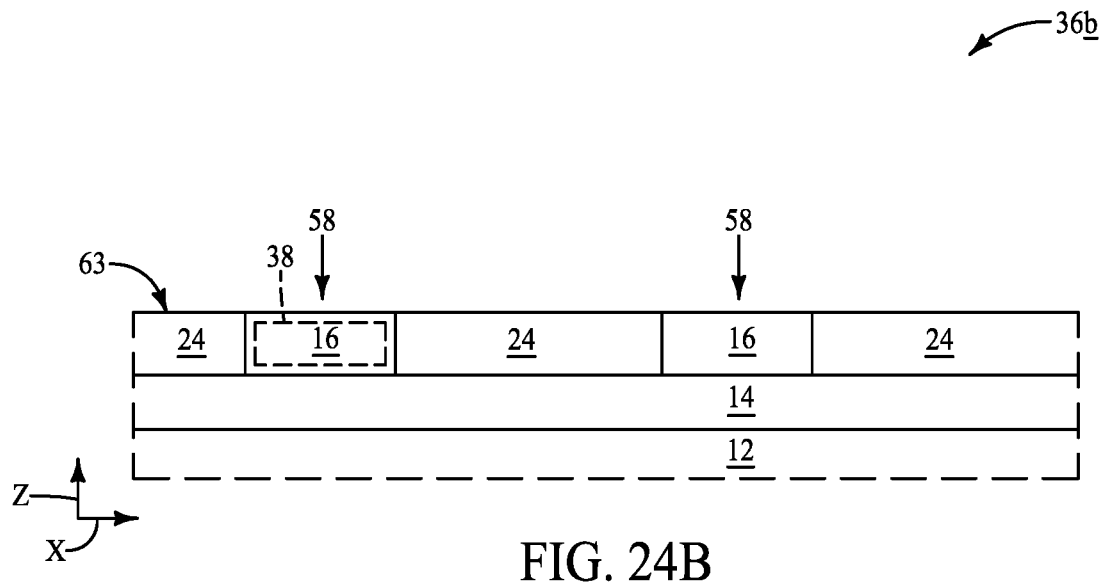
Figure 24C:
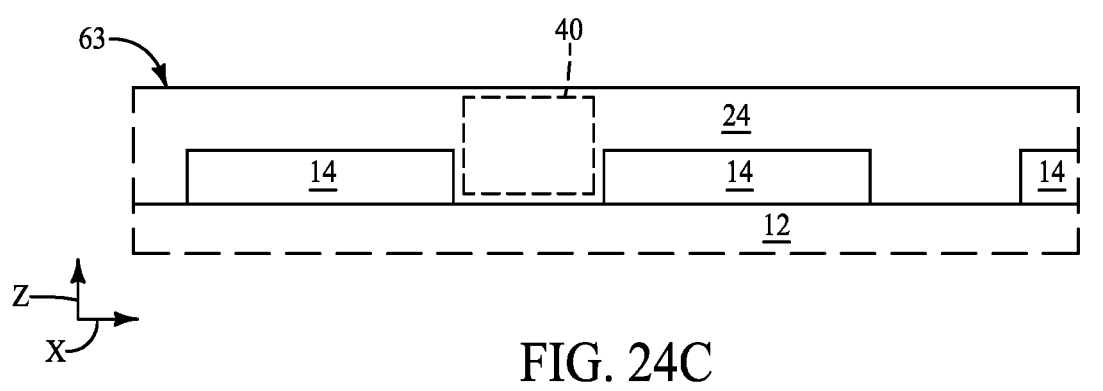

Referring to FIGS. 24-24C, the construction 36b is shown at a processing stage analogous to that described above with reference to FIGS. 6-6C. Material 26 (FIGS. 23-23C) is removed, additional mold material 24 is provided, and then a planarized surface 63 is formed to extend across the pillars 58 and the mold material 24.

Figure 25:
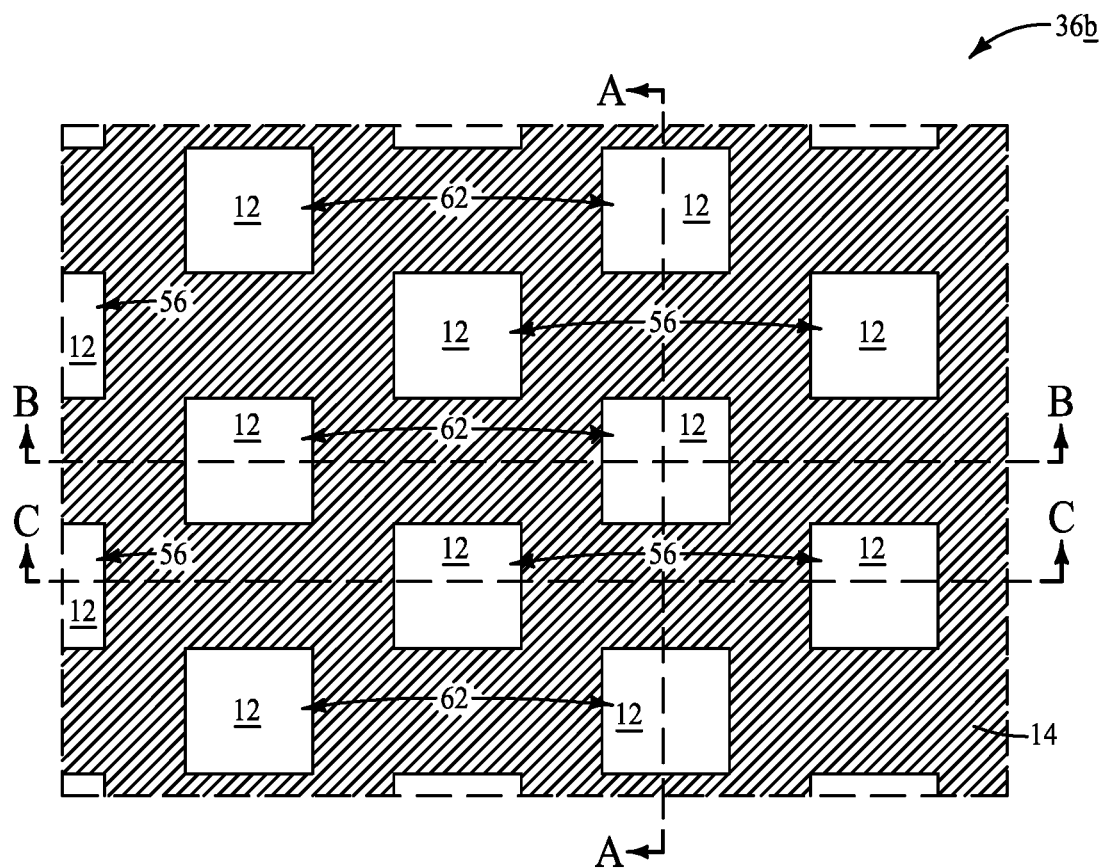
Figure 25A:
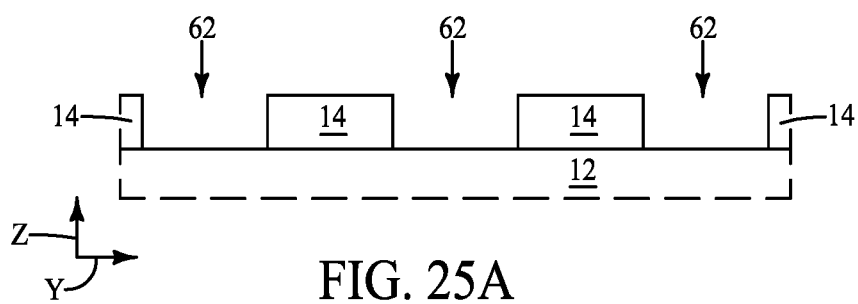
Figure 25B:
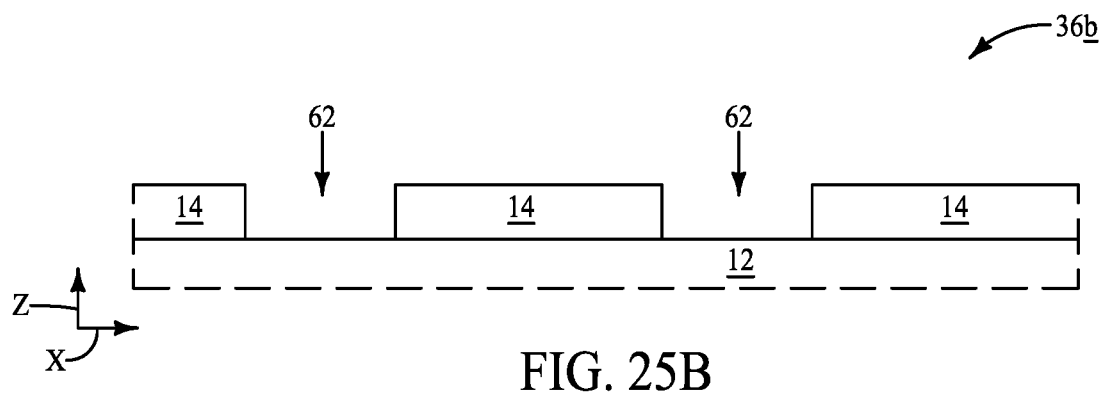
Figure 25C:
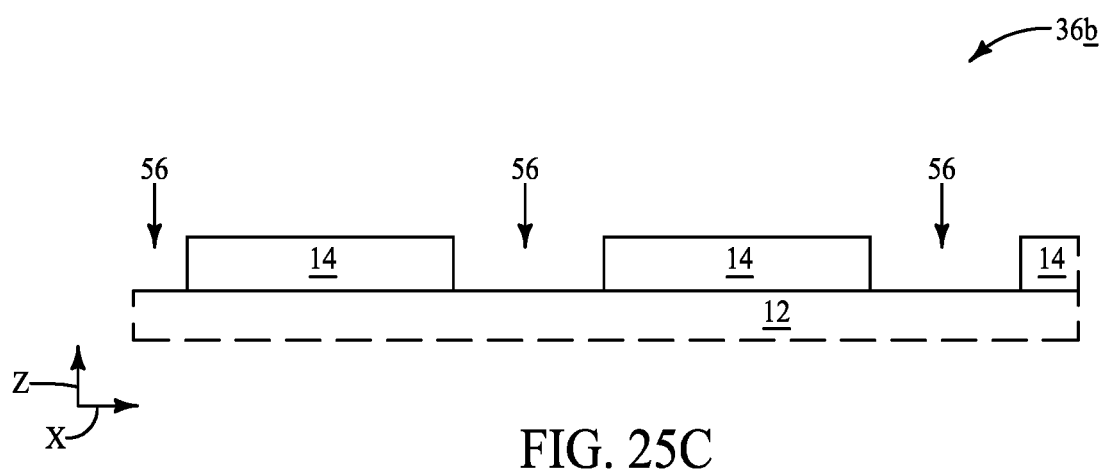

Referring to FIGS. 25-25C, the pillars 58 (FIGS. 24-24C) are removed to leave the second holes (openings) 62, such openings are extended into the masking material 14, and then the mold material 24 (FIGS. 24-24C) is removed. The masking material 14 is shown with crosshatching in the top view of FIG. 25 to assist the reader in identifying the holes 56 and 62.

Notably, the openings 56 and 62 are square-shaped in the embodiment of FIGS. 25-25C. The openings of FIGS. 25-25C may be useful for fabricating capacitors (e.g., cylinder capacitors or pillar capacitors).

Figure 26:
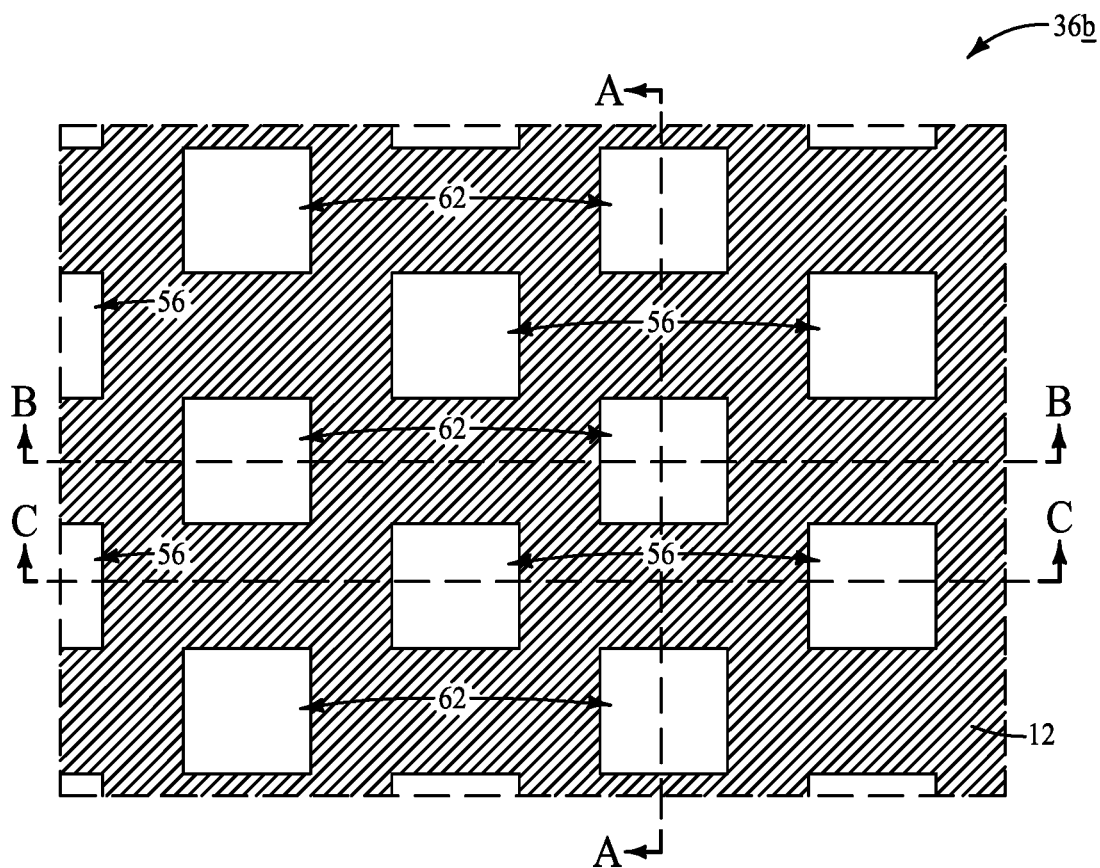
Figure 26A:
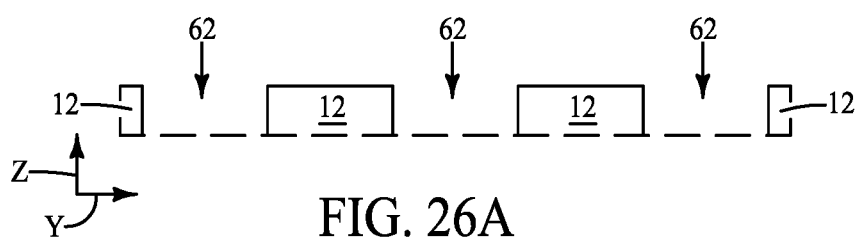
Figure 26B:
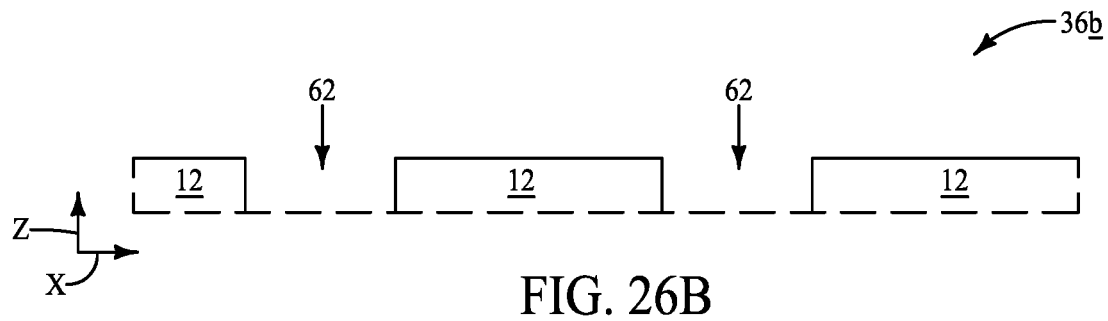
Figure 26C:
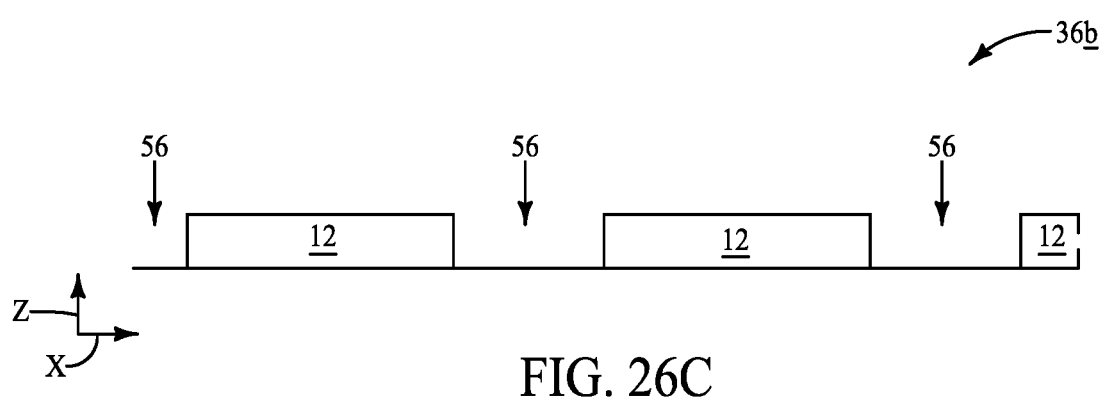

Referring to FIGS. 26-26C, the construction 36b is shown at a processing stage analogous to that described above with reference to FIGS. 9-9C. The openings 56 and 62 are extended into the target material 12, and the masking material 14 is removed. The target material 12 is shown with crosshatching in the top view of FIG. 26 to assist the reader in identifying the holes 56 and 62.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method in which a first line-and-space (L/S) pattern is formed over a first material, and a second L/S pattern is formed over the first L/S pattern. A first portion of the first material is removed, with the first portion being defined by a region where a space of the first L/S pattern crosses a space of the second L/S pattern. The removal of the first portion of the first material forms a first hole in the first material. A second portion of the first material is removed, with the second portion being defined by a region where a line of the first L/S pattern crosses a line of the second L/S pattern. The removal of the second portion of the first material forms a second hole in the first material.

Some embodiments include a method of patterning a target material. An assembly is formed to have a masking material over the target material. First lines are formed over the assembly. The first lines extend along a first direction and are laterally spaced from one another by first spaces. Second lines are formed over the first lines. The second lines extend along a second direction which crosses the first direction, and are laterally spaced from one another by second spaces. The second lines cross the first lines at first crossing regions. The second spaces cross the first spaces at second crossing regions. A pattern includes the first and second crossing regions. The pattern is transferred into the masking material to form holes in the masking material in locations directly under the first and second crossing regions. The holes are extended into the target material.

Some embodiments include a method of patterning a target material. An assembly is formed to have a masking material over the target material. The masking material has a first upper surface. First lines are formed over the assembly. The first lines extend along a first direction and are laterally spaced from one another by first spaces. A mold material is formed over the first lines and within the first spaces. The mold material has a second upper surface. Second lines are formed over the second upper surface. The second lines extend along a second direction which crosses the first direction, and are laterally spaced from one another by second spaces. The mold material is patterned with the second lines to form a first pattern within the mold material. The first pattern has third lines aligned with the second lines, and has third spaces aligned with the second spaces. The third pattern has first gap regions within the third spaces and directly over the first lines, and has second gap regions within the third spaces and directly over the first spaces. The second gap regions of the first pattern are transferred into the masking material with a first etch to form first openings extending into the masking material. The second lines are removed. The first gap regions of the first pattern are transferred into the first lines with a second etch to pattern the first lines into pillars. Additional mold material is formed within the first pattern, within the first openings, and between the pillars. The additional mold material fills the first pattern to form a mold material mass having a third upper surface. An upper region of the mold material mass is removed to form a fourth upper surface that extends along the pillars and along regions of the mold material mass between the pillars. The pillars are removed to leave second openings extending through the mold material mass. The second openings are extended into the masking material. The first and second openings within the masking material together form a second pattern. The second pattern is transferred from the masking material to the target material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of patterning a target material, comprising:
    forming an assembly comprising a masking material over the target material; the masking material having a first upper surface;
    forming first lines over the assembly; the first lines extending along a first direction and being laterally spaced from one another by first spaces;
    forming a mold material over the first lines and within the first spaces; the mold material having a second upper surface;
    forming second lines over the second upper surface; the second lines extending along a second direction which crosses the first direction, and being laterally spaced from one another by second spaces;
    patterning the mold material with the second lines to form a first pattern within the mold material; the first pattern having third lines aligned with the second lines and having third spaces aligned with the second spaces; the first pattern having first gap regions within the third spaces and directly over the first lines, and having second gap regions within the third spaces and directly over the first spaces;
    transferring the second gap regions of the first pattern into the masking material with a first etch to form first openings extending into the masking material;
    removing the second lines;
    transferring the first gap regions of the first pattern into the first lines with a second etch to pattern the first lines into pillars;
    forming additional mold material within the first pattern, within the first openings, and between the pillars; the additional mold material filling the first pattern to form a mold material mass having a third upper surface;
    removing an upper region of the mold material mass to form a fourth upper surface that extends along the pillars and along regions of the mold material mass between the pillars;
    removing the pillars to leave second openings extending through the mold material mass;
    extending the second openings into the masking material; the first and second openings within the masking material together forming a second pattern; and
    transferring the second pattern from the masking material to the target material.

2. The method of claim 1 wherein the removing of the second lines is conducted prior to the forming of the first openings in the masking material.

3. The method of claim 1 wherein the removing of the second lines is conducted after the forming of the first openings in the masking material.

4. The method of claim 1 wherein the mold material comprises carbon.

5. The method of claim 4 wherein the mold material is formed by a spin-on process.

6. The method of claim 1 further comprising forming spacers within the first and second openings of the second pattern prior to transferring the second pattern to the target material.

7. The method of claim 6 wherein the spacers are formed within the second openings after the spacers are formed within the first openings.

8. The method of claim 6 wherein the spacers are simultaneously formed within the first and second openings.

9. The method of claim 1 wherein the first lines have a first width along the second direction and the second lines have a second width along the first direction; and wherein the second width is about the same as the first width.

10. The method of claim 1 wherein the first lines have a first width along the second direction and the second lines have a second width along the first direction; and wherein the second width is different than the first width.

11. The method of claim 1 wherein the first spaces have a first width along the second direction and the second spaces have a second width along the first direction; and wherein the second width is about the same as the first width.

12. The method of claim 1 wherein the first spaces have a first width along the second direction and the second spaces have a second width along the first direction; and wherein the second width is different than the first width.

* * * * *